US008916467B2

(12) United States Patent
Botula et al.

(10) Patent No.: US 8,916,467 B2
(45) Date of Patent: Dec. 23, 2014

(54) SOI RADIO FREQUENCY SWITCH WITH ENHANCED SIGNAL FIDELITY AND ELECTRICAL ISOLATION

(75) Inventors: Alan B. Botula, Essex Junction, VT (US); Alvin J. Joseph, Williston, VT (US); Edward J. Nowak, Essex Junction, VT (US); Yun Shi, South Burlington, VT (US); James A. Slinkman, Montpelier, VT (US)

(73) Assignee: International Business Machines Corporation, Armonk, NY (US)

( * ) Notice: Subject to any disclaimer, the term of this patent is extended or adjusted under 35 U.S.C. 154(b) by 194 days.

(21) Appl. No.: 13/116,396

(22) Filed: May 26, 2011

(65) Prior Publication Data
US 2011/0221510 A1 Sep. 15, 2011

Related U.S. Application Data

(62) Division of application No. 12/342,527, filed on Dec. 23, 2008, now Pat. No. 7,999,320.

(51) Int. Cl.
*H03K 3/01* (2006.01)
*H01L 21/336* (2006.01)
*G06F 17/50* (2006.01)
*H01L 21/762* (2006.01)
*H01L 27/12* (2006.01)
*H01L 21/84* (2006.01)

(52) U.S. Cl.
CPC ...... *H01L 27/1203* (2013.01); *H01L 21/76224* (2013.01); *H01L 21/84* (2013.01); *H01L 21/76251* (2013.01)
USPC ........... 438/637; 438/164; 438/298; 438/311; 438/421

(58) Field of Classification Search
CPC .. H01I 21/76264; H01I 21/84; H01I 21/8221; H01I 21/743; H01I 21/7624; H01L 21/1203; H01L 21/743; H01L 21/76283; H01L 21/823481
USPC ........... 257/353, E21.561, E21.564; 438/155, 438/164, 404, 406, 412
See application file for complete search history.

(56) References Cited

U.S. PATENT DOCUMENTS 6,406,948 B1 * 6/2002 Jun et al. .................. 438/152
6,562,666 B1   5/2003 Park et al.
(Continued)

FOREIGN PATENT DOCUMENTS

JP    10-125925 A    5/1998
JP    2000-294786 A  10/2000
(Continued)

OTHER PUBLICATIONS
Letter from IBM Japan which indicates that the date of the issued Office Action is Oct. 1, 2013.

*Primary Examiner* — Tom Thomas
*Assistant Examiner* — John Bodnar
(74) *Attorney, Agent, or Firm* — Scully, Scott, Murphy & Presser, P.C.; Anthony J. Canale

(57) ABSTRACT

A doped contact region having an opposite conductivity type as a bottom semiconductor layer is provided underneath a buried insulator layer in a bottom semiconductor layer. At least one conductive via structure extends from an interconnect-level metal line through a middle-of-line (MOL) dielectric layer, a shallow trench isolation structure in a top semiconductor layer, and a buried insulator layer and to the doped contact region. The doped contact region is biased at a voltage that is at or close to a peak voltage in the RF switch that removes minority charge carriers within the induced charge layer. The minority charge carriers are drained through the doped contact region and the at least one conductive via structure. Rapid discharge of mobile electrical charges in the induce charge layer reduces harmonic generation and signal distortion in the RF switch. A design structure for the semiconductor structure is also provided.

13 Claims, 40 Drawing Sheets

(56) References Cited

U.S. PATENT DOCUMENTS

| | | |
|---|---|---|
| 7,123,898 B2 | 10/2006 | Burgener et al. |
| 7,205,190 B2 | 4/2007 | Okihara |
| 7,851,860 B2 * | 12/2010 | Yue et al. ............... 257/349 |
| 2004/0129977 A1 * | 7/2004 | Ohkubo et al. ............ 257/347 |
| 2005/0176184 A1 * | 8/2005 | Okihara ................... 438/151 |
| 2005/0212071 A1 * | 9/2005 | Yue et al. ............... 257/452 |
| 2006/0231891 A1 * | 10/2006 | Wang ....................... 257/347 |
| 2007/0018247 A1 | 1/2007 | Brindle et al. |
| 2008/0017906 A1 * | 1/2008 | Pelella et al. ............. 257/306 |
| 2008/0138941 A1 * | 6/2008 | Pelella ..................... 438/154 |
| 2008/0171419 A1 * | 7/2008 | Wen et al. ................ 438/412 |
| 2008/0303089 A1 | 12/2008 | Zhu et al. |
| 2009/0200610 A1 | 8/2009 | Nitta et al. |
| 2009/0261355 A1 | 10/2009 | Matsukizono et al. |
| 2010/0148260 A1 | 6/2010 | Kim et al. |

FOREIGN PATENT DOCUMENTS

| | | |
|---|---|---|
| JP | 2001-044441 A | 2/2001 |
| JP | 2004-207271 A | 7/2004 |
| JP | 2007-165568 A | 6/2007 |
| JP | 2008-258648 A | 10/2008 |

* cited by examiner

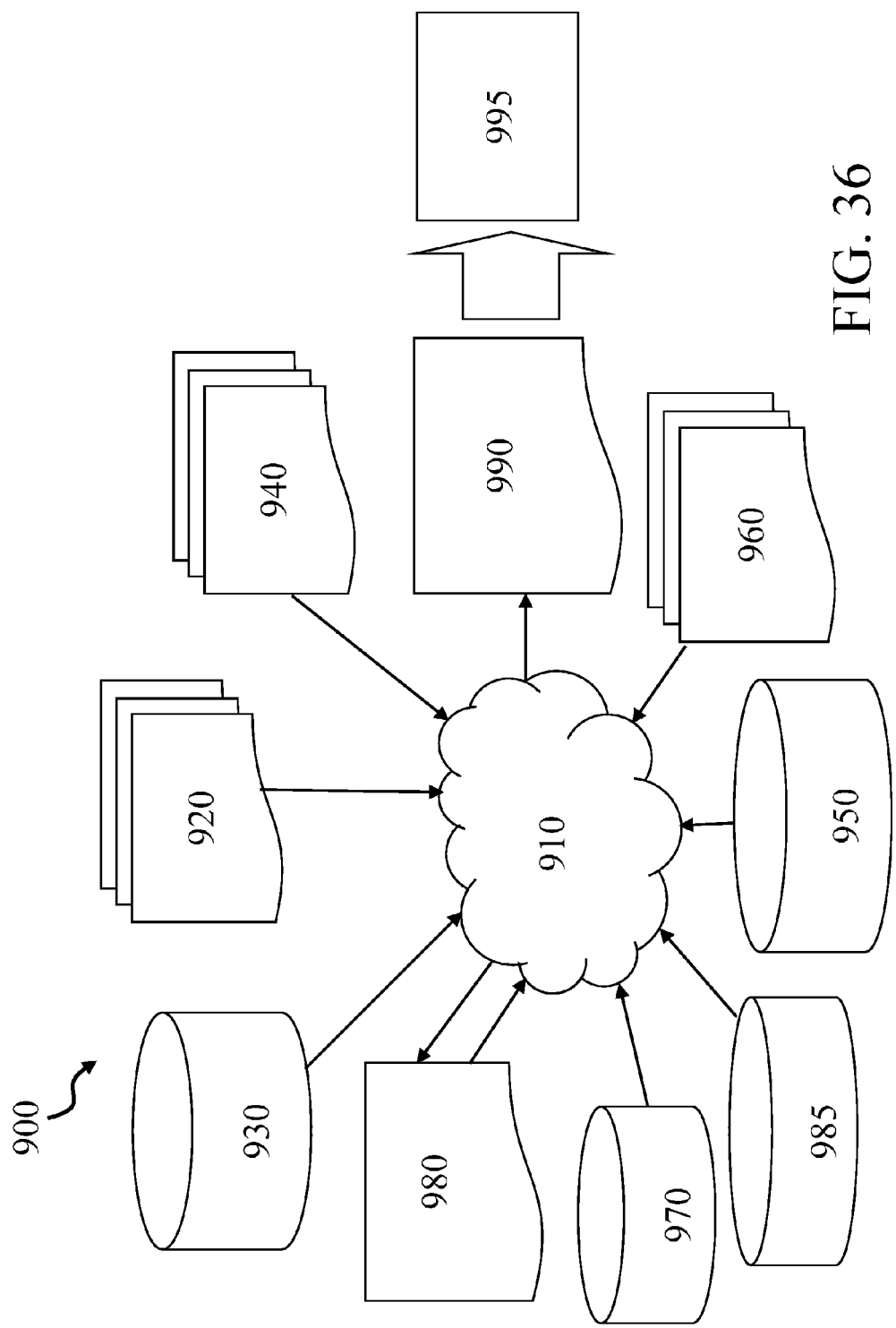

SOI RADIO FREQUENCY SWITCH WITH ENHANCED SIGNAL FIDELITY AND ELECTRICAL ISOLATION

CROSS REFERENCE TO RELATED APPLICATION

This application is a divisional of U.S. patent application Ser. No. 12/342,527, filed Dec. 23, 2008 the entire content and disclosure of which is incorporated herein by reference.

FIELD OF THE INVENTION

The present invention relates to semiconductor structures, and particularly to a semiconductor structure including a radio frequency switch on a semiconductor-on-insulator (SOI) substrate, methods of manufacturing the same, and methods of operating the same.

BACKGROUND

Semiconductor devices such as field effect transistors are employed as a switching device for radio frequency (RF) signals in analog and RF applications. Semiconductor-on-insulator (SOI) substrates are typically employed for such applications since parasitic coupling between devices through the substrate is reduced due to the low dielectric constant of a buried insulator layer. For example, the dielectric constant of silicon, which comprises the entirety of the substrate of a bulk silicon substrate, is about 11.7 in gigahertz ranges. In contrast, the dielectric constant of silicon oxide, which isolates a top semiconductor layer containing devices from a handle substrate, is about 3.9. By providing the buried insulator layer, which has a dielectric constant less than the dielectric constant of a semiconductor material in a bulk substrate, the SOI substrate reduces capacitive coupling between an individual semiconductor device and the substrate, and consequently, reduces secondary capacitive coupling between semiconductor devices through the substrate.

However, even with the use of an SOI substrate, the secondary capacitive coupling of electrical signals between semiconductor devices is significant due to the high frequency range employed in the radio frequency applications, which may be, for example, from about 900 MHz to about 1.8 GHz, and may include even higher frequency ranges. This is because the capacitive coupling between electrical components increases linearly with frequency.

For a radio frequency (RF) switch formed on an SOI substrate, the semiconductor devices comprising the RF switch and the signal processing units in a top semiconductor layer are capacitively coupled through a buried insulator layer to a bottom semiconductor layer. Even if the semiconductor devices in the top semiconductor layer employ a power supply voltage from about 3 V to about 9V, the transient signals and signal reflections in an antenna circuitry may increase the actual voltage in the top semiconductor layer up to about 30V. Such voltage conditions induce a significant capacitive coupling between the semiconductor devices subjected to such high voltage signals and an induced charge layer within an upper portion of the bottom semiconductor layer, which changes in thickness and charge polarity at the frequency of the RF signal in the semiconductor devices in the top semiconductor layer. The induced charge layer capacitively couples with other semiconductor devices in the top semiconductor layer including the semiconductor devices that an RF switch is supposed to isolate electrically. The spurious capacitive coupling between the induced charge layer in the bottom semiconductor layer and the other semiconductor devices provides a secondary capacitive coupling, which is a parasitic coupling that reduces the effectiveness of the RF switch. In this case, the RF signal is applied to the other semiconductor devices through the secondary capacitive coupling although the RF switch is turned off.

Referring to FIG. 1, a prior art radio frequency switch comprises a set of serially connected field effect transistors formed on a semiconductor-on-insulator (SOI) substrate 8. The SOI substrate 8 comprises a bottom semiconductor layer 10, a buried insulator layer 20, and a top semiconductor layer 30. The top semiconductor layer 30 includes top semiconductor portions 32 and shallow trench isolation structures 33 which provide electrical isolation between adjacent top semiconductor portions 32. Each field effect transistor comprises a gate electrode 42, a gate dielectric 40, a gate spacer 44, and source and drain regions (not shown) formed in a top semiconductor portion 32. The field effect transistors are serially connected via a set of contact vias 88 and metal lines 98. The contact vias 88 are embedded in a middle-of-line (MOL) dielectric layer 80, and the metal lines 98 are formed in an interconnect-level dielectric layer 90.

A high voltage signal, which may have a voltage swing up to about +/−30V induces an induced charge layer 11 in an upper portion of the bottom semiconductor layer 10 through a capacitive coupling, which is schematically indicated by a set of capacitors 22 between the semiconductor devices and the bottom semiconductor layer 10. The induced charge layer 11 contains positive charges while the voltage in the semiconductor devices in the top semiconductor layer 30 have a negative voltage, and negative charges while the voltage in the semiconductor devices in the top semiconductor layer 30 have a positive voltage. The high frequency of the RF signal in the semiconductor devices induces changes in the thickness of the induced charge layer 11 and the polarity of the charges in the induced charge layer at the same frequency as the frequency of the RF signal.

The time required to dissipate the charges in the induced charge layer 11 is characterized by an RC time constant, which is determined by the capacitance of the set of capacitors 22 and a substrate resistance. The substrate resistance is the resistance between the induced charge layer 11 and electrical ground, which is typically provided by an edge seal at the boundary of a semiconductor chip. The substrate resistance is symbolically represented by a resistor 12 between the induced charge layer 11 and electrical ground. Such substrate resistance may be extremely high because the bottom semiconductor layer 10 typically employs a high resistivity semiconductor material having a resistivity of about 5 Ohms-cm to minimize eddy current. Further, the lateral distance to an edge seam may be up to about half the lateral dimension of the semiconductor chip, e.g., on the order of about 1 cm.

Such large substrate resistance 12 increases the RC time constant for the dissipation of the charge in the induced charge layer 11 beyond the time scale of the period of the RF signal. Since dissipation of the charge in the induced charge layer 11 is effectively barred due to a long RC time constant, the capacitive coupling between the semiconductor devices in the top semiconductor layer 30 and the bottom semiconductor layer 10 results in loss of signal even during the off-state of the RF switch. Further, spurious RF signal is introduced into semiconductor devices that are disconnected by the RF switch from the RF signal through the secondary capacitive coupling of the semiconductor devices through the induced charge layer 11.

During one half of each frequency cycle of the RF signal, the top portion of the bottom semiconductor layer 10 directly underneath the buried insulator layer 20 is in an accumulation condition, in which charge carriers in the bottom semiconductor layer 10 accumulate near the bottom surface of the buried insulator layer 20. Specifically, when the conductivity type of the bottom semiconductor layer 10 is p-type and the voltage of the top semiconductor portions 32 is negative relative to the voltage at the bottom semiconductor layer 10, or when the conductivity type of the bottom semiconductor layer 10 is n-type and the voltage of the top semiconductor portions 32 is positive relative to the voltage at the bottom semiconductor layer 10, the majority charge carriers, i.e., holes if the bottom semiconductor layer 10 is p-type or electrons if the bottom semiconductor layer 10 is n-type, accumulate in the upper portion of the bottom semiconductor layer 10 to form the induced charge layer 11. The thickness of the induced charge layer 11 is then proportional to the square root of the voltage differential between the top semiconductor portions 32 and the bottom semiconductor layer 10. The change in the thickness of the induced charge layer 11 as well as the amount of charge in the induced charge layer generates additional harmonic signals of the RF frequency, which is coupled to semiconductor devices in a top semiconductor portion 32, thereby providing a spurious signal even when the RF switch is turned off.

Further, during the other half of each frequency cycle of the RF signal, the top portion of the bottom semiconductor layer 10 directly underneath the buried insulator layer 20 is in a depletion condition, in which charge carriers in the bottom semiconductor layer 10 are repelled from the bottom surface of the buried insulator layer 20. Specifically, when the conductivity type of the bottom semiconductor layer 10 is p-type and the voltage of the top semiconductor portions 32 is positive relative to the voltage at the bottom semiconductor layer 10, or when the conductivity type of the bottom semiconductor layer 10 is n-type and the voltage of the top semiconductor portions 32 is negative relative to the voltage at the bottom semiconductor layer 10, the majority charge carriers, i.e., holes if the bottom semiconductor layer 10 is p-type or electrons if the bottom semiconductor layer 10 is n-type, are repelled from the upper portion of the bottom semiconductor layer 10 to form the induced charge layer 11, which is depleted of the majority charges. Further, when magnitude of the voltage differential between the top semiconductor portions 32 and the bottom semiconductor layer 10 is sufficiently great, an inversion layer including minority charges, i.e., electrons if the bottom semiconductor layer 10 is p-type or holes if the bottom semiconductor layer 10 is n-type, is formed within the induced charge layer 11. The thicknesses of the depletion zone and the inversion layer in the induced charge layer 11 depend on the magnitude of the voltage differential between the top semiconductor portions 32 and the bottom semiconductor layer 10. The change in the thickness of the induced charge layer 11 as well as the amount of charge in the induced charge layer generates additional harmonic signals of the RF frequency in this phase of the frequency cycle of the RF signal, which is coupled to semiconductor devices in a top semiconductor portion 32, thereby providing a spurious signal even when the RF switch is turned off.

In view of the above, there exists a need for a semiconductor structure providing enhanced signal isolation for semiconductor devices from a bottom semiconductor layer in a semiconductor-on-insulator (SOI) substrate, methods of manufacturing the same, and methods of operating the same.

Particularly, there exists a need for a semiconductor structure in which generation of harmonic components of the RF signal through reducing the effect of the charges in an induced charge layer, methods of manufacturing the same, and methods of operating the same.

SUMMARY

The present invention provides a semiconductor structure including a biased electrical contact to an upper portion of a bottom semiconductor layer, wherein minority charge carriers in an induced charge layer is removed through the biased electrical contact, and a design structure for the same.

In the present invention, a doped contact region having an opposite conductivity type as a bottom semiconductor layer is formed underneath a buried insulator layer in a bottom semiconductor layer of a semiconductor-on-insulator (SOI) substrate. At least one conductive via structure is formed, which extends from an interconnect-level metal line through a middle-of-line (MOL) dielectric layer, a shallow trench isolation structure in a top semiconductor layer, and a buried insulator layer and to the doped contact region. During operation, the doped contact region is biased at a voltage that is at, or close to, a peak voltage in the RF switch to prevent formation of an inversion layer within the induced charge layer. The charges in the inversion layer are drained through the doped contact region and the at least one conductive via structure. Rapid discharge of the minority charge carriers reduces harmonic generation and signal distortion in the RF switch.

According to an aspect of the present invention, a method of operating a semiconductor device is provided, which comprises:

providing a semiconductor device including:
a semiconductor-on-insulator (SOI) substrate including a top semiconductor layer, a buried insulator layer, and a bottom semiconductor layer having a doping of a first conductivity type;
at least one field effect transistor located on the top semiconductor layer;
a shallow trench isolation structure laterally abutting the at least one field effect transistor;
a first doped semiconductor region embedded in the bottom semiconductor layer and abutting the buried insulator layer and having a doping of a second conductivity type, wherein the second conductivity type is the opposite of the first conductivity type;
a second doped semiconductor region embedded in the bottom semiconductor layer and abutting the buried insulator layer and having a doping of the first conductivity type and not abutting the first doped semiconductor region;
at least one first conductive via extending from a top surface of a middle-of-line (MOL) dielectric layer through the MOL dielectric layer, the shallow trench isolation structure, the buried insulator layer, and to a top surface of the first doped semiconductor region; and
at least one second conductive via extending from the top surface of a middle-of-line (MOL) dielectric layer through the MOL dielectric layer, the shallow trench isolation structure, the buried insulator layer, and to a top surface of the second doped semiconductor region;

applying a radio frequency (RF) signal to the at least one field effect transistor, wherein an induced charge layer is formed directly underneath the buried insulator layer; and electrically biasing the first doped semiconductor region and the first at least one conductive via to repel majority charge carriers of the bottom semiconductor layer;

electrically biasing the second doped semiconductor region and the second at least one conductive via to attract majority charge carriers of the bottom semiconductor layer, wherein the first doped semiconductor region abuts a depletion region within the induced charge layer and drains minority charge carriers of the bottom semiconductor layer through an entirety of a cycle of the RF signal.

According to another aspect of the present invention, a design structure embodied in a machine readable medium for designing, manufacturing, or testing a design for a semiconductor structure is provided. The design structure comprises: a first data representing a semiconductor-on-insulator (SOI) substrate including a top semiconductor layer, a buried insulator layer, and a bottom semiconductor layer having a doping of a first conductivity type; a second data representing at least one field effect transistor located on the top semiconductor layer; a third data representing a shallow trench isolation structure laterally abutting the at least one field effect transistor; a fourth data representing a doped semiconductor region embedded in the bottom semiconductor layer and abutting the buried insulator layer and having a doping of a second conductivity type, wherein the second conductivity type is the opposite of the first conductivity type; and a fifth data representing at least one conductive via extending from a top surface of a middle-of-line (MOL) dielectric layer through the MOL dielectric layer, the shallow trench isolation structure, a buried insulator layer, and to a top surface of the doped semiconductor region.

According to yet another of the present invention, another design structure is provided, which comprises: a first data representing a semiconductor-on-insulator (SOI) substrate including a top semiconductor layer, a buried insulator layer, and a bottom semiconductor layer having a doping of a first conductivity type; a second data representing at least one field effect transistor located on the top semiconductor layer; a third data representing a shallow trench isolation structure laterally abutting the at least one field effect transistor; a fourth data representing a first doped semiconductor region embedded in the bottom semiconductor layer and abutting the buried insulator layer and having a doping of the first conductivity type; a fifth data representing a second doped semiconductor region embedded in the bottom semiconductor layer and abutting the buried insulator layer and having a doping of a second conductivity type and not abutting the first doped semiconductor region, wherein the second conductivity type is the opposite of the first conductivity type; a sixth data representing at least one first conductive via extending from a top surface of a middle-of-line (MOL) dielectric layer through the MOL dielectric layer, the shallow trench isolation structure, the buried insulator layer, and to a top surface of the first doped semiconductor region; and a seventh data representing at least one second conductive via extending from the top surface of a middle-of-line (MOL) dielectric layer through the MOL dielectric layer, the shallow trench isolation structure, the buried insulator layer, and to a top surface of the second doped semiconductor region.

BRIEF DESCRIPTION OF THE DRAWINGS

FIGS. 2-5, 9-12, and 16 are sequential vertical cross-sectional views.

FIG. 6 is a top-down view of the first exemplary semiconductor structure in FIG. 5. The plane Z-Z' in FIG. 6 corresponds to the plane of the vertical cross-sectional view in FIG. 5. FIG. 7 is a top-down view of a first variation of the first exemplary semiconductor structure at a step corresponding to FIG. 5. FIG. 8 is a top-down view of a second variation of the first exemplary semiconductor structure at a step corresponding to FIG. 5.

FIG. 13 is a modified top-down view of the first exemplary semiconductor structure of FIG. 12 in which a middle-of-line (MOL) dielectric layer 80 is omitted for clarity. The plane Z-Z' in FIG. 13 corresponds to the plane of the vertical cross-sectional view in FIG. 12. FIG. 14 is a modified top-down view of the first variation of the first exemplary semiconductor structure in which the middle-of-line (MOL) dielectric layer 80 is omitted for clarity. FIG. 15 is a modified top-down view of the second variation of the first exemplary semiconductor structure in which the middle-of-line (MOL) dielectric layer 80 is omitted for clarity.

FIG. 2 corresponds to a step after formation of a shallow trench isolation structure 33 in a semiconductor-on-insulator (SOI) substrate 8.

FIG. 3 corresponds to a step after formation of at least one first lower via cavity 17 and at least one first doped semiconductor region 18.

FIG. 4 corresponds to a step after formation of at least one second lower via cavity 27 and at least one second doped semiconductor region 28.

FIGS. 5-8 correspond to a step after removal of a second second photoresist 35.

FIG. 9 corresponds to a step after formation of at least one first lower conductive via 47 and at least one second lower conductive via 37.

FIG. 10 corresponds to a step after formation of at least one field effect transistor and a middle-of-line (MOL) dielectric layer 80.

FIG. 11 corresponds to a step after formation of at least one first upper via cavity 54, at least one second upper via cavity 57, and third upper via cavities 58.

FIGS. 12-15 correspond to a step after formation of at least one first upper conductive via 77, at least one second upper conductive via 87, and third upper conductive vias 88.

FIGS. 16 and 17 correspond to a step after formation of an interconnect-level dielectric layer 90, interconnect-level metal lines 98, and an interconnect-level metal line 99. An induced charge layer 11 including a depletion region is formed within the bottom semiconductor layer 10 during the operation of the semiconductor device.

FIGS. 18, 21, 24, and 25 are sequential vertical cross-sectional views.

FIG. 19A is a top-down view of a first configuration of the third exemplary semiconductor structure in FIG. 18. FIG. 19B is a horizontal cross-sectional view of the first configuration of the third exemplary semiconductor structure at the plane X-X' in FIG. 18. FIG. 20A is a top-down view of a second configuration of the third exemplary semiconductor structure in FIG. 18. FIG. 20B is a horizontal cross-sectional view of the second configuration of the third exemplary semiconductor structure at the plane X-X' in FIG. 18. The plane Z-Z' in FIGS. 19A, 19B, 20A, and 20B corresponds to the plane of the vertical cross-sectional view in FIG. 17.

FIG. 22 is a modified top-down view of a third configuration of the third exemplary semiconductor structure of FIG. 21 in which a middle-of-line (MOL) dielectric layer 80 is omitted for clarity. FIG. 23 is a modified top-down view of a fourth configuration of the third exemplary semiconductor structure of FIG. 21 in which the middle-of-line (MOL) dielectric layer 80 is omitted for clarity. The plane Z-Z' in FIGS. 22 and 23 corresponds to the plane of the vertical cross-sectional view in FIG. 21.

FIGS. 18, 19A, 19B, 20A, and 20B correspond to a step after formation of at least one first lower conductive via 47.

FIGS. 21-23 correspond to a step after formation of at least one first upper conductive via 77 and third upper conductive vias 88.

FIG. 24 correspond to a phase of a radio frequency signal applied to the at least one field effect transistor during which an induce charge layer 11 including a depletion region is formed.

FIG. 25 corresponds to a phase of the radio frequency signal applied to the at least one field effect transistor during which an induce charge layer 11' including an accumulation region 14 is formed.

FIGS. 26-29, 32, and 35 are sequential vertical cross-sectional views.

FIG. 30A is a top-down view of a first configuration of the third exemplary semiconductor structure in FIG. 29. FIG. 30B is a horizontal cross-sectional view of the first configuration of the third exemplary semiconductor structure at the X-X' in FIG. 29. FIG. 31A is a top-down view of a second configuration of the third exemplary semiconductor structure in FIG. 29. FIG. 31B is a horizontal cross-sectional view of the second configuration of the third exemplary semiconductor structure at the X-X' in FIG. 29. The plane Z-Z' in FIGS. 30A, 30B, 31A, and 31B corresponds to the plane of the vertical cross-sectional view in FIG. 29.

FIG. 33 is a modified top-down view of the first configuration of the third exemplary semiconductor structure of FIG. 32 in which a middle-of-line (MOL) dielectric layer 80 is omitted for clarity. FIG. 34 is a modified top-down view of the second configuration of the third exemplary semiconductor structure of FIG. 32 in which the middle-of-line (MOL) dielectric layer 80 is omitted for clarity. The plane Z-Z' in FIGS. 33 and 34 corresponds to the plane of the vertical cross-sectional view in FIG. 32.

FIG. 26 corresponds to a step after formation of at least one field effect transistor and a middle-of-line (MOL) dielectric layer 80. FIG. 27 corresponds to a step after formation of at least one via cavity 59. FIG. 28 corresponds to a step after formation of at least one first doped semiconductor region 18. FIGS. 29, 30A, 30B, 31A, and 31B correspond to a step after formation of at least one first conductive via 79. FIGS. 32, 33, and 34 correspond to a step after formation of third upper conductive vias 88. FIG. 35 corresponds to a step after formation of an interconnect-level dielectric layer 90, interconnect-level metal lines 98, and an interconnect-level metal line 99 abutting the at least one first conductive via 79.

FIG. 36 is a flow diagram of a design process used in semiconductor design and manufacture of the semiconductor structures according to the present invention.

DETAILED DESCRIPTION

Figure 1:
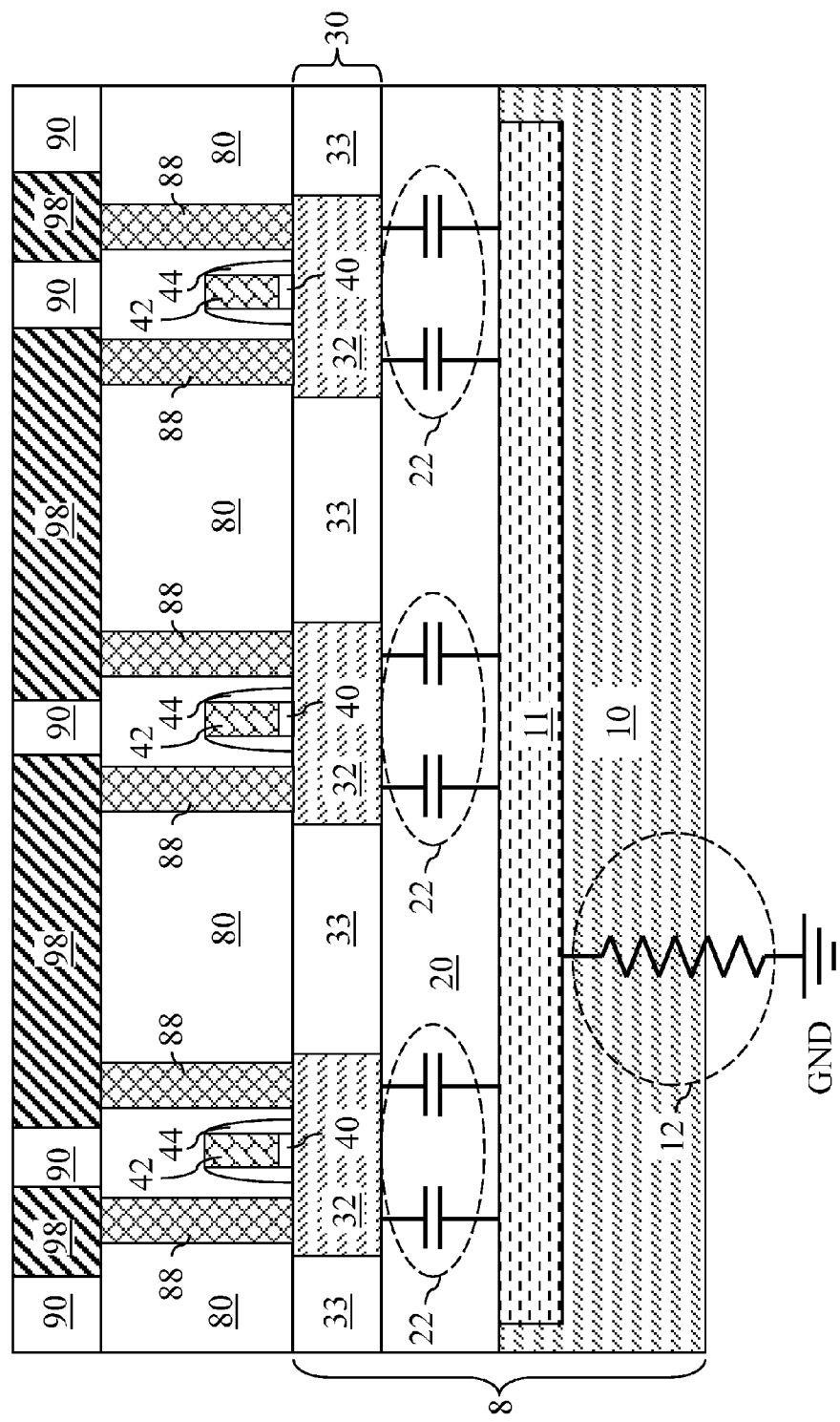
FIG. 1 is a vertical cross-sectional view of a prior art radio frequency switch structure.

As stated above, the present invention relates to a semiconductor structure including to a semiconductor structure including a radio frequency switch on a semiconductor-on-insulator (SOI) substrate, methods of manufacturing the same, and methods of operating the same, which are described herein with accompanying figures. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

As used herein, radio frequency (RF) denotes a frequency of electromagnetic wave within the range of 3 Hz to 300 GHz. Radio frequency corresponds to the frequency of electromagnetic wave that is used to produce and detect radio waves. Radio frequency includes very high frequency (VHF), ultra high frequency (UHF), super high frequency (SHF), and extremely high frequency (EHF).

As used herein, very high frequency (VHF) refers to a frequency in the range from 30 MHz to 300 MHz. VHF is used, among others, for frequency modulation (FM) broadcasting. Ultra high frequency (UHF) refers to a frequency in the range from 300 MHz to 3 GHz. UHF is used, among others, for mobile telephones, wireless networks, and microwave ovens. Super high frequency (SHF) refers to a frequency in the range from 3 GHz to 30 GHz. SHF is used, among others, for wireless networking, radar, and satellite links. Extremely high frequency (EHF) refers to a frequency in the range from 30 GHz to 300 GHz. EHF produces millimeter waves having a wavelength from 1 mm to 10 mm, and is used, among others, for data links and remote sensing.

The term "accumulation region" refers to a doped semiconductor region in which the majority charge carriers accumulate due to external voltage bias. A p-doped semiconductor region is in accumulation mode if excess holes, which are the majority charge carriers in the p-doped semiconductor region, accumulate in the p-doped semiconductor region by an external negative voltage so that the p-doped semiconductor region has a net positive charge. An n-doped semiconductor region is in accumulation mode if excess electrons, which are the majority charge carriers in the n-doped semiconductor region, accumulate in the n-doped semiconductor region by an external positive voltage so that the n-doped semiconductor region has a net negative charge.

The term "depletion region" refers to a doped semiconductor region from which the majority charge carriers are repelled due to external voltage bias while minority charge carriers do not accumulate so that majority charge carriers and minority charge carriers are depleted from the doped semiconductor region. A p-doped semiconductor region is in depletion mode if holes, which are the majority charge carriers in the p-doped semiconductor region, are depleted in the p-doped semiconductor region by a weak external positive voltage so that the p-doped semiconductor region has a net negative charge. An n-doped semiconductor region is in depletion mode if electrons, which are the majority charge carriers in the n-doped semiconductor region, are depleted in the n-doped semiconductor region by a weak external negative voltage so that the n-doped semiconductor region has a net positive charge.

The term "inversion region" refers to a doped semiconductor region in which minority charge carriers accumulate. Typically, an inversion region forms at a semiconductor surface in close proximity to a strong external voltage. A p-doped semiconductor region is in inversion mode if electrons, which are the minority charge carriers in the p-doped semiconductor region, accumulate in the p-doped semiconductor region by a strong external positive voltage so that the p-doped semiconductor region has a net negative charge. An n-doped semiconductor region is in inversion mode if holes, which are the minority charge carriers in the n-doped semiconductor region, accumulate in the n-doped semiconductor region by a strong external negative voltage so that the n-doped semiconductor region has a net positive charge.

Figure 2:
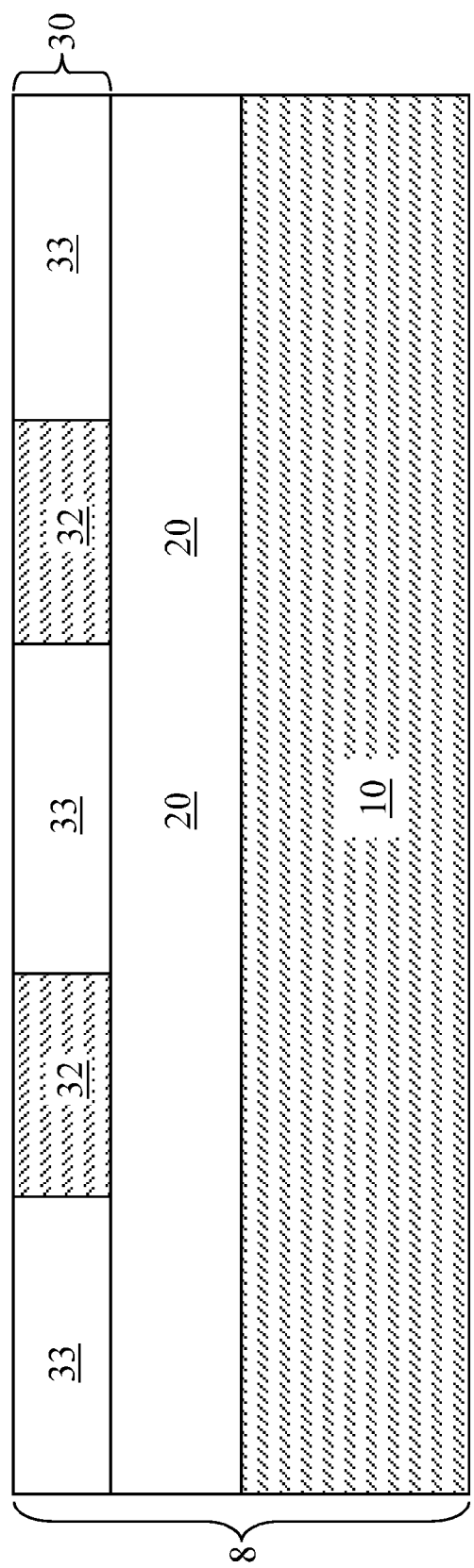
FIGS. 2-17 are various views of a first exemplary semiconductor structure according to a first embodiment of the present invention.

Referring to FIG. 2, a first exemplary semiconductor structure according to a first embodiment of the present invention comprises a semiconductor substrate 8. The semiconductor substrate 8 is a semiconductor-on-insulator (SOI) substrate that includes a bottom semiconductor layer 10, a buried insulator layer 20, and a top semiconductor layer 30. The top semiconductor layer 30 includes at least one top semiconductor portion 32 and a shallow trench isolation structure 33. At least one pad dielectric layer (not shown) comprising at least one dielectric material, such as silicon nitride and/or silicon nitride, may be provided on a top surface of the top semiconductor layer 30 to facilitate formation of lower conductive vias by planarization in subsequent processing steps.

Each of the bottom semiconductor layer 10 and the at least one top semiconductor portion 32 comprises a semiconductor material such as silicon, a silicon germanium alloy region, silicon, germanium, a silicon-germanium alloy region, a silicon carbon alloy region, a silicon-germanium-carbon alloy region, gallium arsenide, indium arsenide, indium gallium arsenide, indium phosphide, lead sulfide, other III-V compound semiconductor materials, and II-VI compound semiconductor materials. The semiconductor material of the bottom semiconductor layer 10 and the at least one top semiconductor portion 32 may be the same, or different. Typically, each of the bottom semiconductor layer 10 and the at least one top semiconductor portion 32 comprises a single crystalline semiconductor material. For example, the single crystalline semiconductor material may be silicon.

The bottom semiconductor layer 10 has a resistivity greater than 5 Ohms-cm, which includes, for example, p-doped single crystalline silicon having p-type dopants at an atomic concentration less than about $2.0 \times 10^{15}/cm^3$ or n-doped single crystalline silicon having n-type dopants at an atomic concentration less than about $1.0 \times 10^{15}/cm^3$. Preferably, the bottom semiconductor layer 10 has a resistivity greater than 50 Ohms-cm, which includes, for example, p-doped single crystalline silicon having p-type dopants at an atomic concentration less than about $2.0 \times 10^{14}/cm^3$ or n-doped single crystalline silicon having n-type dopants at an atomic concentration less than about $1.0 \times 10^{14}/cm^3$. More preferably, the bottom semiconductor layer 10 has a resistivity greater than 1 kOhms-cm, which includes, for example, p-doped single crystalline silicon having p-type dopants at an atomic concentration less than about $1.0 \times 10^{13}/cm^3$ or n-doped single crystalline silicon having n-type dopants at an atomic concentration less than about $5.0 \times 10^{12}/cm^3$. The conductivity type of the bottom semiconductor layer 10 is herein referred to as a first conductivity type, which may be p-type or n-type.

The high resistivity of the bottom semiconductor layer 10 reduces eddy current, thereby reducing parasitic coupling of radio frequency signal generated or propagated in the top semiconductor layer 30 with the bottom semiconductor layer 10. While silicon is used herein to illustrate the required dopant level for each threshold resistivity value for the bottom semiconductor layer 10, target dopant concentrations for other semiconductor materials may be readily obtained since each type of semiconductor material has a well established relationship between the dopant concentration and the resistivity of the semiconductor material.

The thickness of the bottom semiconductor layer 10 is typically from about 400 microns to about 1,000 microns, and typically from about 500 microns to about 900 microns at this step. If the bottom semiconductor layer 10 is subsequently thinned, the thickness of the bottom semiconductor layer 10 may be from about 50 microns to about 800 microns.

The buried insulator layer 20 comprises a dielectric material such as silicon oxide, silicon nitride, silicon oxynitride, or a combination thereof. The thickness of the buried insulator layer 20 may be from about 50 nm to about 500 nm, and typically from about 100 nm to about 300 nm, although lesser and greater thicknesses are also contemplated herein.

The shallow trench isolation structure 33 comprises a dielectric material such as silicon oxide, silicon nitride, silicon oxynitride, or a combination thereof. The shallow trench isolation structure 33 may be formed by forming at least one trench that extends to a top surface of the buried insulator layer 20 within the top semiconductor layer 30, filling the at least one trench with a dielectric material such as silicon oxide, silicon nitride, and/or silicon oxynitride, and removing the portion of the dielectric material from above the top surface of the top semiconductor layer 30 by planarization employing, for example, chemical mechanical planarization (CMP) and/or recess etch. In case the at least one trench is contiguous, the shallow trench isolation structure 33 may be of unitary construction, i.e., in one piece. The shallow trench isolation structure 33 may laterally abut and surround each of the at least one top semiconductor portion 32.

The thickness of the top semiconductor layer 30 may be from about 20 nm to about 200 nm, and typically from about 40 nm to about 100 nm, although lesser and greater thicknesses are also contemplated herein. The at least one top semiconductor portion 32 may be implanted with dopants of p-type or n-type. Typically, the dopant concentration of the at least one top semiconductor portion 32 is from about $1.0 \times 10^{15}/cm^3$ to about $1.0 \times 10^{18}/cm^3$, which corresponds to a dopant concentration for a body region of a field effect transistor, although lesser and greater concentrations are also contemplated herein.

Figure 3:
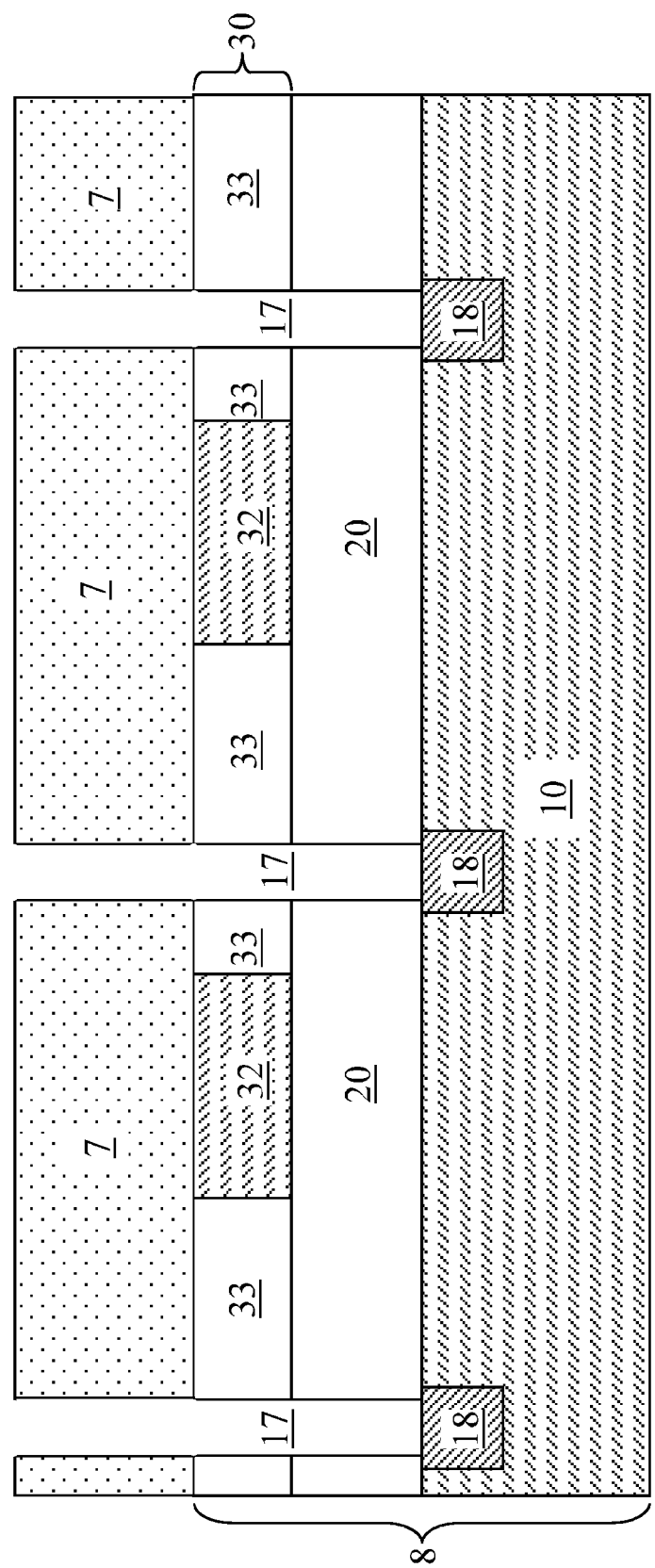

Referring to FIG. 3, a first photoresist 7 is applied to a top surface of the top layer 30 and lithographically patterned to form openings. The openings in the first photoresist 7 overlie the shallow trench isolation structure 33. Each of the openings is located outside the area of the at least one top semiconductor portion 32 and inside the area of the shallow trench isolation structure 33 in a top-down view.

At least one first lower via cavity 17 formed by transferring the pattern in the first photoresist 7 into the semiconductor substrate 8. The pattern of the openings in the first photoresist 7 is transferred into the shallow trench isolation structure 33 and the buried insulator layer 20 by an anisotropic etch, which may be a reactive ion etch. The first photoresist 7 is employed as an etch mask for the anisotropic etch. The at least one first lower via cavity 17 is formed underneath the openings in the first photoresist 7.

Preferably, the anisotropic etch is selective to the semiconductor material of the semiconductor material of the bottom semiconductor layer 10. For example, if the bottom semiconductor layer 10 comprises silicon, an anisotropic etch that removes dielectric material, such as silicon oxide, selective to silicon may be employed to provide an anisotropic etch that stops on the top surfaces of the top surface of the bottom semiconductor layer 10.

A top surface of the bottom semiconductor layer 10 is exposed at the bottom of each of each of the at least one first lower via cavity 17. Each of the at least one first lower via cavity 17 is formed within the shallow trench isolation structure 33 and the buried insulator layer 20. Each of the at least one first lower via cavity 17 extends from a top surface of the shallow trench isolation structure 33, through the shallow trench isolation structure 33 and the buried insulator layer 20, and to the top surface of the bottom semiconductor layer 10. Variations in which the at least one first lower via cavity 17 extends further into the bottom semiconductor layer are explicitly contemplated herein.

The sidewalls of each of the at least one first lower via cavity 17 may be substantially vertically coincident from the top surface of the shallow trench isolation structure 33 to the top surface of the bottom semiconductor layer 10. In other words, the portions of the sidewalls of each of the at least one first lower via cavity 17 in the shallow trench isolation structure 33 and the buried insulator layer 20 may overlap each other in a top-down view. In case a taper is present in the sidewalls of the at least one first lower via cavity 17, the angle of taper may be from about 0 degree to about 5 degrees, and typically from 0 degree to about 2 degrees, although greater taper angles are also contemplated herein. The depth of each of the at least one first lower via cavity 17 beneath the top surface of the top semiconductor layer 30 may be equal to the sum of the thickness of the buried insulator layer 20 and the thickness of the top semiconductor layer 30.

In a first configuration of the first exemplary semiconductor structure, the at least one first lower via cavity 17 is an array of lower via cavities. Each lower via cavity in the array of lower via cavities is a discrete via cavity that does not abut another via cavity.

In a second configuration of the first exemplary semiconductor structure, the at least one first lower via cavity 17 is a single via cavity having a plurality of lower via cavity portions that are interconnected among one another. In other words, the at least one first lower via cavity 17 includes a plurality of lower via cavity portions that are laterally connected between the top surface of the shallow trench isolation structure 33 and a top surface of the bottom semiconductor layer 10.

At least one first doped semiconductor region 18 is formed by implanting dopants of a second conductivity type into exposed portion of the bottom semiconductor layer 10. The second conductivity type is the opposite of the first conductivity type. For example, if the first conductivity type is p-type, the second conductivity type is n-type, and vice versa. Thus, the remaining portion of the bottom semiconductor layer 10 and the at least one doped semiconductor region 18 have opposite types of doping. Due to lateral straggle of the implanted dopants, the at least one doped semiconductor region extends laterally outside the area of the at least one first lower via cavity 17 and vertically abuts a bottom surface of the buried insulator layer 20. In case the second conductivity type is p-type, the implanted dopants may comprise B, Ga, In, or a combination thereof. In case the second conductivity type is n-type, the implanted dopants may comprise P, As, Sb, or a combination thereof. The first photoresist 7 functions as a self-aligning mask for the ion implantation so the at least one first doped semiconductor region 18 is formed beneath the at least one first lower via cavity 17. Each of the at least one first doped semiconductor region 18 vertically abuts a bottom surface of the at least one first lower via cavity 17 and the bottom surface buried insulator layer 20. In case the bottom semiconductor layer 10 comprises a single crystalline semiconductor material, the at least one first doped semiconductor region 18 is also single crystalline.

The thickness of the at least one first doped semiconductor region 18 may be from about 10 nm to about 600 nm, and typically from about 50 nm to about 300 nm, although lesser and greater thicknesses are also contemplated herein. The at least one first doped semiconductor region 18 is typically heavily doped to reduce the resistivity. The at least one first doped semiconductor region 18 may have a dopant concentration from about $1.0 \times 10^{19}/cm^3$ to abut $1.0 \times 10^{21}/cm^3$, although lesser and greater dopants concentrations are also contemplated herein. The first photoresist 7 is subsequently removed selective to the top semiconductor layer 30, the exposed sidewalls of the buried insulator layer 20, and the at least one first doped semiconductor region 18.

Figure 4:
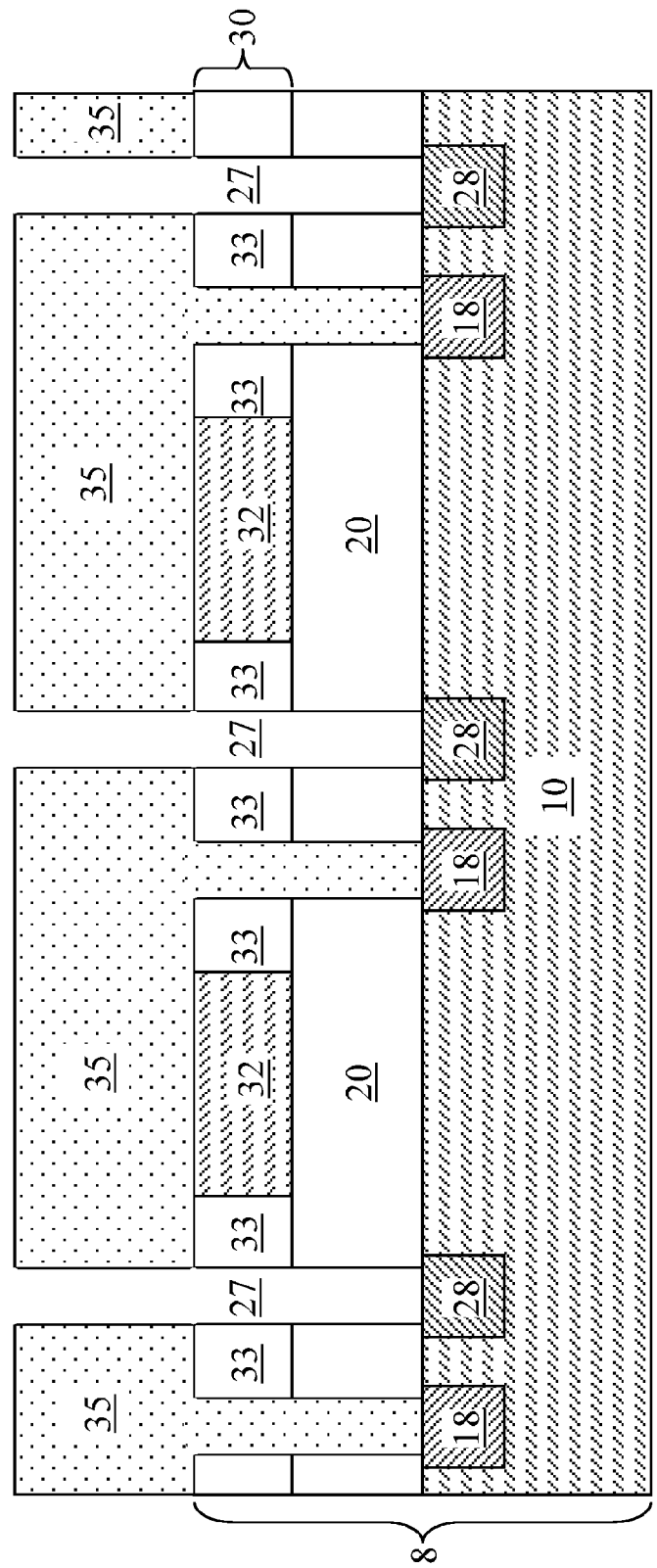

Referring to FIG. 4, a second photoresist 35 is applied to the top surface of the top layer 30 and lithographically patterned to form openings. The openings in the second photoresist 35 overlie portions of the shallow trench isolation structure 33 outside the area of the at least one first lower via cavity 17 (See FIG. 3) which may be filled with the second photoresist 35. Each of the openings is located outside the area of the at least one top semiconductor portion 32 and the area of the at least one first lower via cavity 17 and inside the rest of the area of the shallow trench isolation structure 33 in a top-down view.

At least one second lower via cavity 27 is formed by transferring the pattern in the second photoresist 35 into the semiconductor substrate 8. The pattern of the openings in the second photoresist 35 is transferred into the shallow trench isolation structure 33 and the buried insulator layer 20 by an anisotropic etch, which may be a reactive ion etch. The second photoresist 35 is employed as an etch mask for the anisotropic etch. The at least one second lower via cavity 27 is formed underneath the openings in the second photoresist 35.

Preferably, the anisotropic etch is selective to the semiconductor material of the semiconductor material of the bottom semiconductor layer 10. For example, if the bottom semiconductor layer 10 comprises silicon, an anisotropic etch that removes dielectric material, such as silicon oxide, selective to silicon may be employed to provide an anisotropic etch that stops on the top surface of the bottom semiconductor layer 10.

A top surface of the bottom semiconductor layer 10 is exposed at the bottom of each of the at least one second lower via cavity 27. Each of the at least one second lower via cavity 27 is formed within the shallow trench isolation structure 33 and the buried insulator layer 20. Each of the at least one second lower via cavity 27 extends from a top surface of the shallow trench isolation structure 33, through the shallow trench isolation structure 33 and the buried insulator layer 20, and to the top surface of the bottom semiconductor layer 10. Variations in which the at least one second lower via cavity 27 extends further into the bottom semiconductor layer are explicitly contemplated herein.

The sidewalls of each of the at least one second lower via cavity 27 may be substantially vertically coincident from the top surface of the shallow trench isolation structure 33 or may have a taper as the sidewalls of the at least one first lower via cavity 17 as described above.

In a third configuration of the first exemplary semiconductor structure, the at least one second lower via cavity 27 is an array of lower via cavities. Each lower via cavity in the array of lower via cavities is a discrete via cavity that does not abut another via cavity.

In a fourth configuration of the first exemplary semiconductor structure, the at least one second lower via cavity 27 is a single via cavity having a plurality of lower via cavity portions that are interconnected among one another. In other words, the at least one second lower via cavity 27 includes a plurality of lower via cavity portions that are laterally connected between the top surface of the shallow trench isolation structure 33 and a top surface of the bottom semiconductor layer 10.

Each of the third configuration and the fourth configuration of the first exemplary semiconductor structure may be combined with either the first configuration or the second configuration of the first exemplary semiconductor structure.

At least one second doped semiconductor region 28 is formed by implanting dopants of the first conductivity type into exposed portion of the bottom semiconductor layer 10. Due to lateral straggle of the implanted dopants, the at least one doped semiconductor region extends laterally outside the area of the at least one second lower via cavity 27 and vertically abuts a bottom surface of the buried insulator layer 20. In case the first conductivity type is p-type, the implanted dopants may comprise B, Ga, In, or a combination thereof. In case the first conductivity type is n-type, the implanted dopants may comprise P, As, Sb, or a combination thereof. The second photoresist 35 functions as a self-aligning mask for the ion implantation so the at least one second doped semiconductor region 28 is formed beneath the at least one second lower via cavity 27. Each of the at least one doped semiconductor region vertically abuts a bottom surface of the at least one lower via cavity and the bottom surface buried insulator layer 20. In case the bottom semiconductor layer 10 comprises a single crystalline semiconductor material, the at least one second doped semiconductor region 28 is also single crystalline.

The thickness of the at least one second doped semiconductor region 28 may be from about 10 nm to about 600 nm, and typically from about 50 nm to about 300 nm, although lesser and greater thicknesses are also contemplated herein. The at least one second doped semiconductor region 28 is typically heavily doped to reduce the resistivity. The at least one second doped semiconductor region 28 may have a dopant concentration from about $1.0 \times 10^{19}/cm^3$ to abut $1.0 \times 10^{21}/cm^3$, although lesser and greater dopants concentrations are also contemplated herein.

Figure 5:
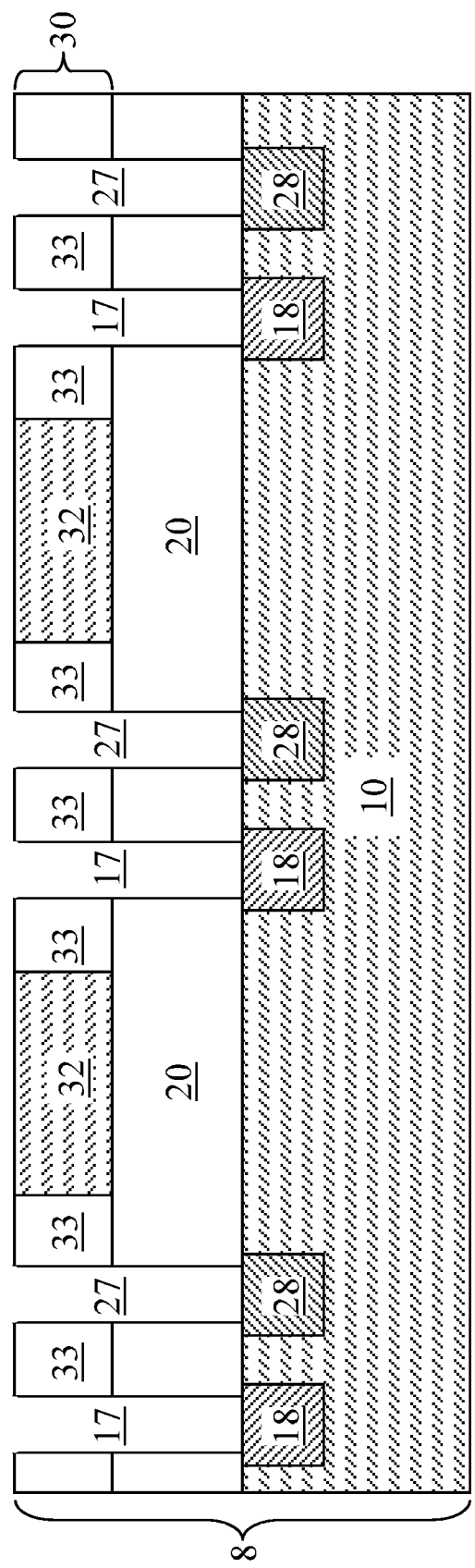
Figure 6:
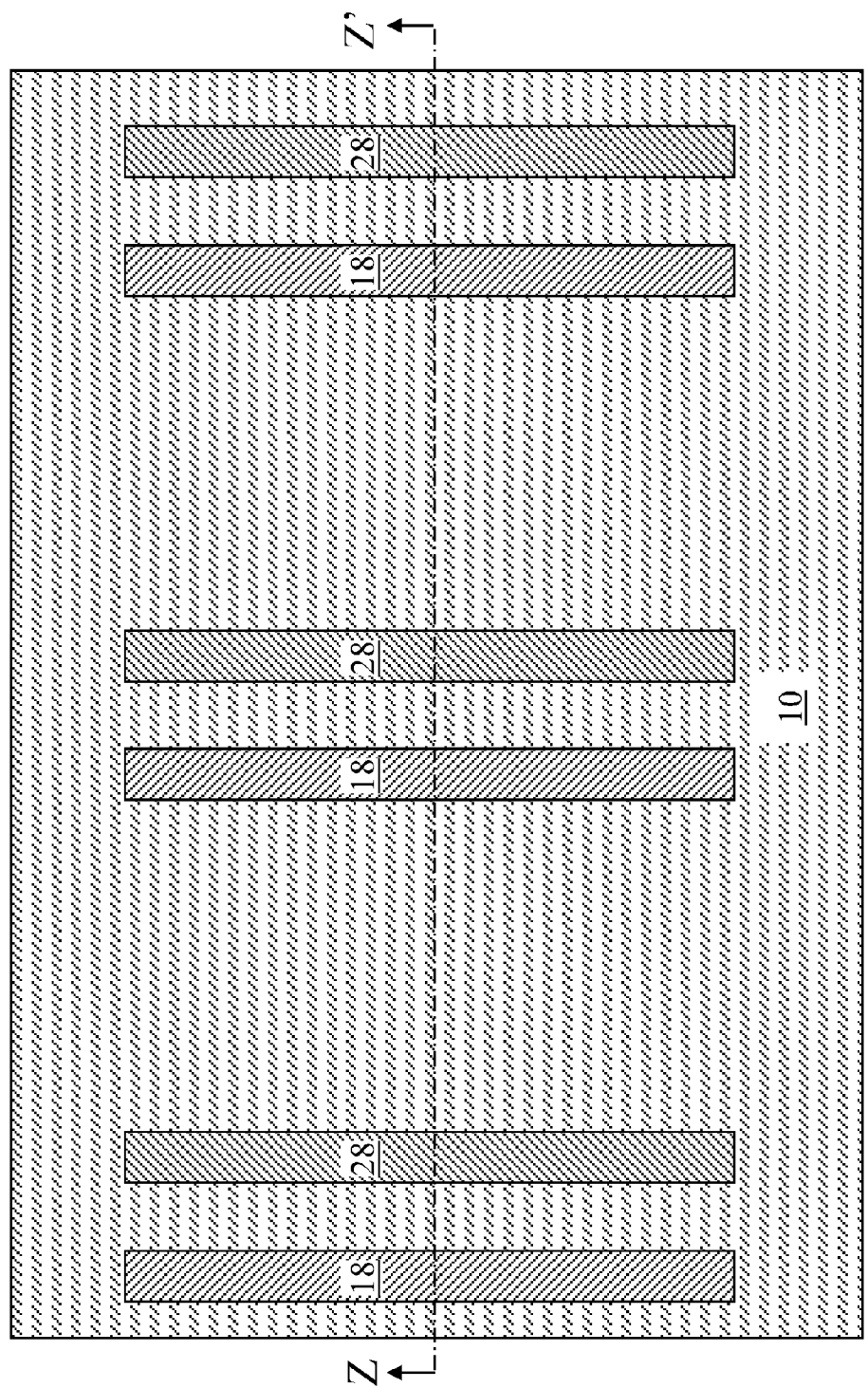

Referring to FIGS. 5 and 6, the second photoresist 35 is subsequently removed selective to the top semiconductor layer 30, the exposed sidewalls of the buried insulator layer 20, and the at least one second doped semiconductor region 28. FIG. 5 is a vertical cross-sectional view of the combination of the first configuration and the third configuration of the first embodiment of the present invention. FIG. 6 is a corresponding top-down view. The at least one first lower via cavity 17 is an array of first lower via cavities and the at least one second lower via cavity 27 is an array of second lower via cavities in this combination.

Figure 7:
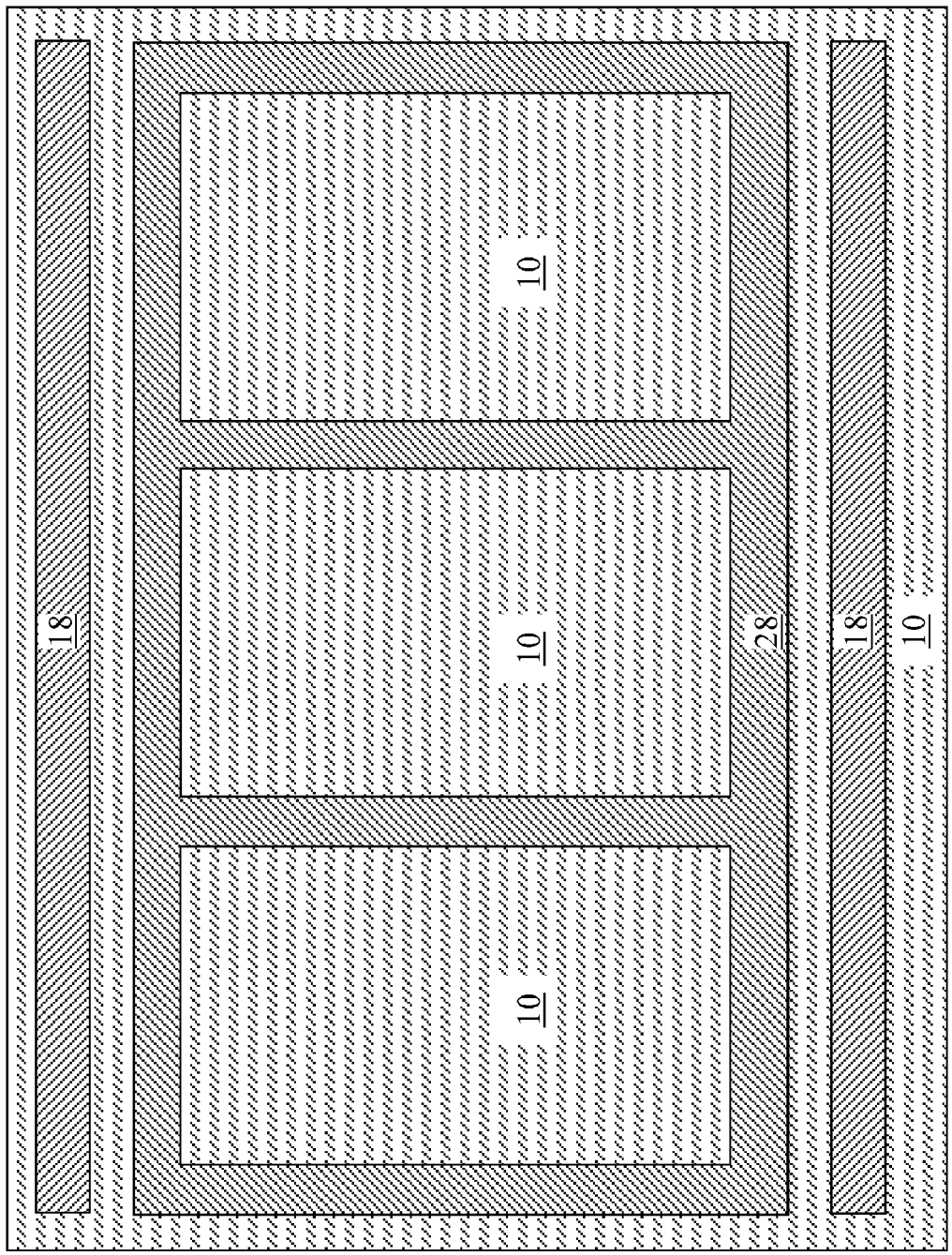

FIG. 7 is a top-down view of the combination of the first configuration and the fourth configuration of the first exemplary semiconductor structure. In this combination, the at least one first lower via cavity 17 is an array of discrete first lower via cavities that do not abut one another, and the at least one second lower via cavity 27 is a single second lower via cavity of integral construction that laterally surrounds the at least one top semiconductor portion (See FIG. 5) in this combination.

Figure 8:
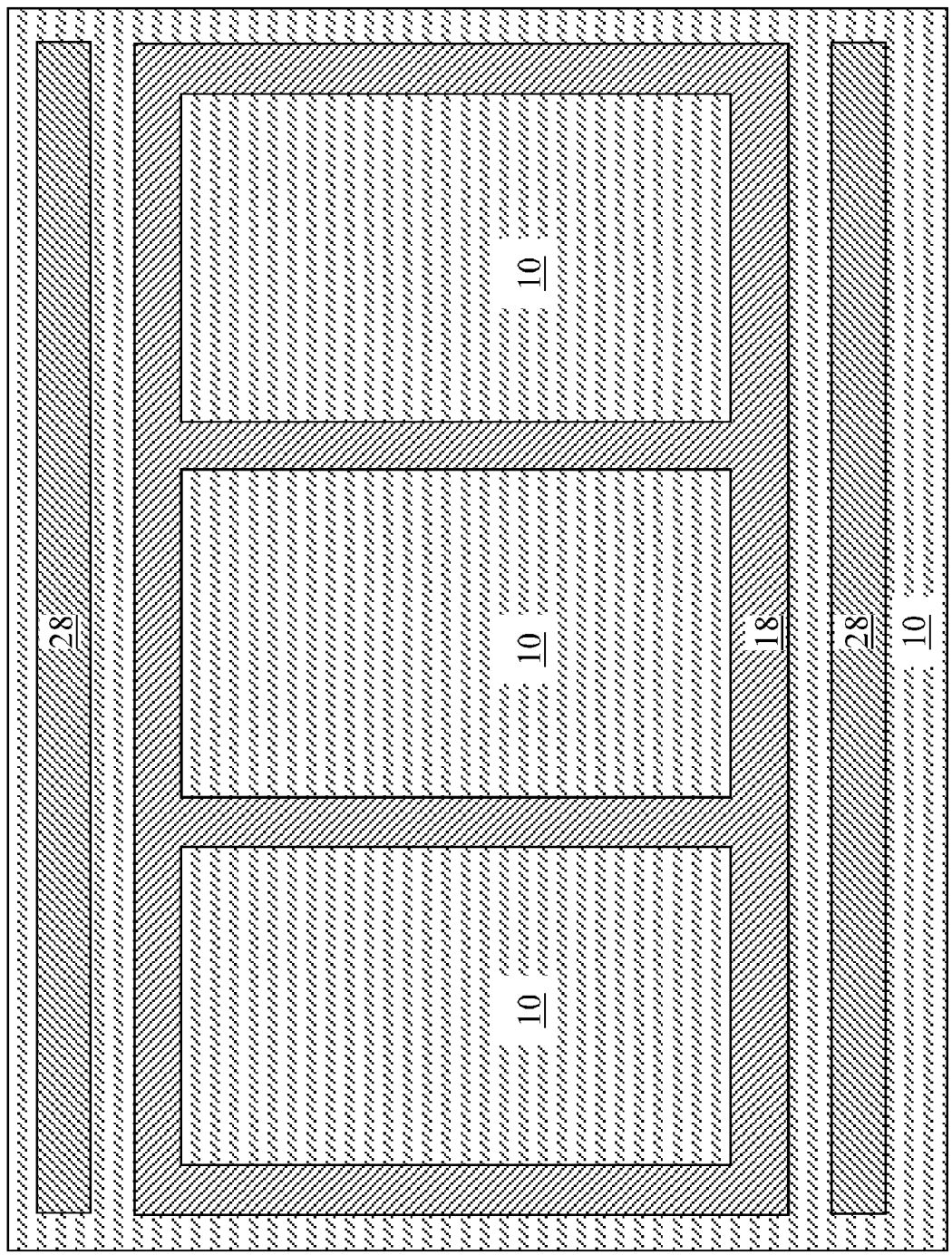

FIG. 8 is a top-down view of the combination of the second configuration and the third configuration of the first exemplary semiconductor structure. In this combination, the at least one first lower via cavity 17 is a single first lower via cavity of integral construction that laterally surrounds the at least one top semiconductor portion (See FIG. 5), and the at least one second lower via cavity 27 is an array of second lower via cavities that do not abut one another in this combination.

Figure 9:
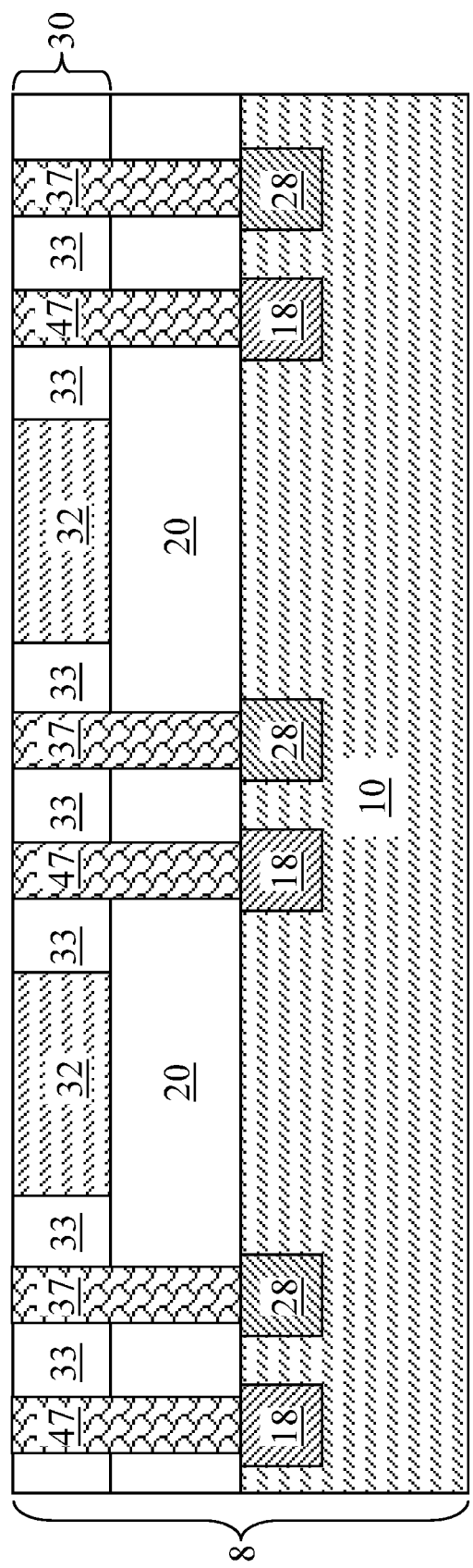

Referring to FIG. 9, at least one first lower conductive via 47 and at least one second lower conductive via 37 are formed. The at least one first lower conductive via 47 is formed within each of the at least one first lower via cavity 17 in the shallow trench isolation structure 33 and the buried insulator layer 20. Likewise, the at least one second lower conductive via 37 is formed within each of the at least one second lower via cavity 27 in the shallow trench isolation structure 33 and the buried insulator layer 20.

Specifically, a conductive material is deposited into the at least one first lower via cavity 17 and the at least one second lower via cavity 27. The conductive material may be a doped semiconductor material or a metallic material. For example, the conductive material may be doped polysilicon, a doped silicon-containing semiconductor material, a doped compound semiconductor material, an elemental metal, an alloy of at least two elemental metals, a conductive metal nitride, etc. The excess conductive material above the top surface of the top semiconductor layer 30 is removed, for example, by chemical mechanical planarization (CMP), recess etch, or a combination thereof. The remaining portions of the conductive material in the at least one first lower via cavity 17 and the at least one second lower via cavity 27 constitute the at least one first lower conductive via 47 and the at least one second lower conductive via 37, respectively. In case at least one pad dielectric layer (not shown) is provided over the top semiconductor layer, the at least one dielectric layer may be advantageously employed for planarization of the conductive material to facilitate the formation of the at least one first lower conductive via 47 and the at least one second lower conductive via 37. The at least one pad dielectric layer, if provided, is subsequently removed to expose the top surface of the top semiconductor layer 30.

Each of the at least one first lower conductive via 47 extends from a top surface of the shallow trench isolation structure 33 to the top surface of the at least one first doped semiconductor region 18. Each of the at least one second lower conductive via 37 extends from a top surface of the shallow trench isolation structure 33 to the top surface of the at least one second doped semiconductor region 28. Each of the at least one first lower conductive via 47 vertically abut the top surface of the at least one first doped semiconductor region 18. Each of the at least one second lower conductive via 37 vertically abut the top surface of the at least one first doped semiconductor region 28.

Figure 10:
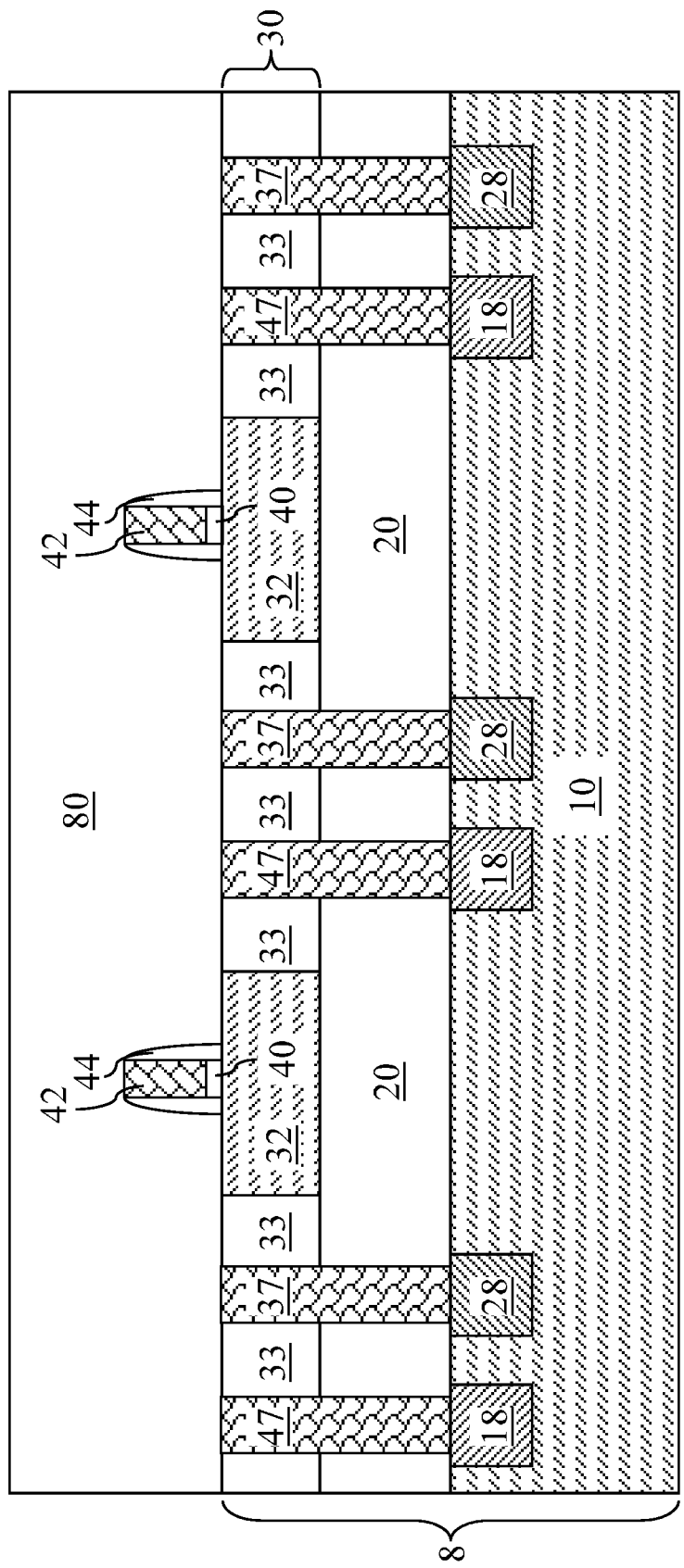

Referring to FIG. 10, at least one field effect transistor is formed directly on the at least one top semiconductor portion 32 by methods known in the art. Specifically, a gate dielectric 40, a gate electrode 42, and a gate spacer 44 are formed for each field effect transistor. A source region (not shown) and a drain region (not shown) are also formed in the at least one top semiconductor portion 32 for each field effect transistor by implanting dopants employing the gate electrode 42 and the gate spacer 44 of the field effect transistor as a self-aligning implantation mask.

A middle-of-line (MOL) dielectric layer 80 is formed on the at least one field effect transistor, the at least one top semiconductor portion 32, the shallow trench isolation structure 33, the top surfaces of the at least one first lower conductive via 47, and at least one second lower conductive via 37. The MOL dielectric layer 80 may comprise silicon oxide, silicon nitride, silicon oxynitride, an organosilicate glass (OSG), low-k chemical vapor deposition (CVD) oxide, a self-planarizing material such as a spin-on glass (SOG), and/or a spin-on low-k dielectric material such as SiLK™. Exemplary silicon oxides include undoped silicate glass (USG), borosilicate glass (BSG), phosphosilicate glass (PSG), fluorosilicate glass (FSG), borophosphosilicate glass (BPSG), or a combination thereof. The total thickness of the MOL dielectric layer 80, as measured from a top surface of the shallow trench isolation structure 33, may be from about 100 nm to about 10,000 nm, and typically from about 200 nm to about 5,000 nm. The top surface of the MOL dielectric layer 80 may be planarized, for example, by chemical mechanical planarization.

Figure 11:
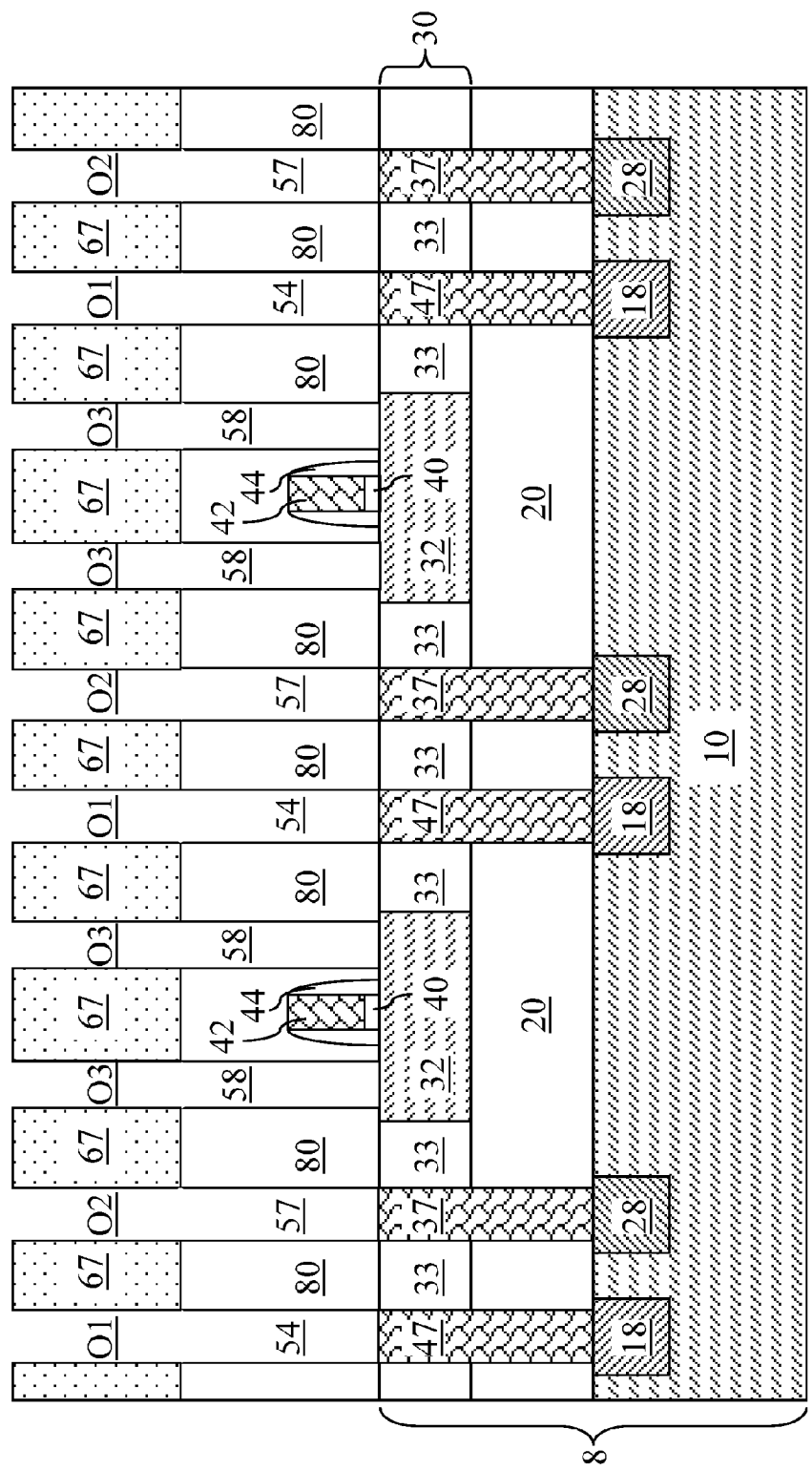

Referring to FIG. 11, a photoresist 67 is applied to a top surface of the MOL dielectric layer 80 and lithographically patterned to form openings. The openings include at least one first opening O1 that overlies the at least one first lower conductive via 47, at least one second opening O2 that overlies the at least one second lower conductive via 37, and third openings O3 that overlie semiconductor devices including the at least one field effect transistor located on the at least one top semiconductor portion 32.

The pattern of the at least one first opening O1, the at least one second opening O2, and the third openings O3 in the photoresist 67 is transferred into the MOL dielectric layer 80 by an anisotropic etch, which may be a reactive ion etch. The photoresist 67 is employed as an etch mask for the anisotropic etch. At least one first upper via cavity 54 is formed over the at least one first conductive via 47 and underneath the at least one first opening O1 in the photoresist 67. At least one second upper via cavity 57 is formed overt the at least one second conductive via 37 and underneath the at least one second opening O2 in the photoresist 67. Third upper via cavities 58 are formed underneath the third openings O3 in the photoresist 67.

Preferably, the anisotropic etch is selective to the semiconductor material of the at least one top semiconductor portions 32. The anisotropic etch proceeds until a top surface of the at least one top semiconductor portion 32 is exposed at a bottom of the third upper via cavities 58. At this point, the top surfaces of the at least one first lower conductive via 47 and the at least one second lower conductive via 37 are exposed at the bottom of the at least one first upper via cavity 54 and at the bottom of the at least one second upper via cavity 57, respectively. The anisotropic etch may be selective to the at least one first lower conductive via 47 and the at least one second lower conductive via 37. In this case, the depth of some of the third upper via cavities 58, the depth of the at least one first upper via cavity 54, and the depth of the at least one second upper via cavity 57 may be substantially the same as the thickness of the MOL dielectric layer 80.

A top surface of the at least one top semiconductor portion 32 is exposed at the bottom of some of the third upper via cavities 58. A top surface of one of the at least one first lower conductive via 47 is exposed at the bottom of each of at least one first upper via cavity 54. A top surface of one of the at least one second lower conductive via 37 is exposed at the bottom of each of at least one second upper via cavity 57. At least some of the third upper via cavities 58, the at least one first upper via cavity 54, and the at least one second upper via cavity 57 are formed within the MOL dielectric layer 80, and extend from the top surface of the MOL dielectric layer 80 to a top surface of the top semiconductor layer 30, which coincides with the bottom surface of the MOL dielectric layer 80. At least one of the third upper via cavities 58 may extend from the top surface of the MOL dielectric layer 80 to a top surface of the gate electrodes 42. The third upper via cavities 58 does not extend to a bottom surface of the top semiconductor layer 30. The photoresist 67 is subsequently removed.

Figure 12:
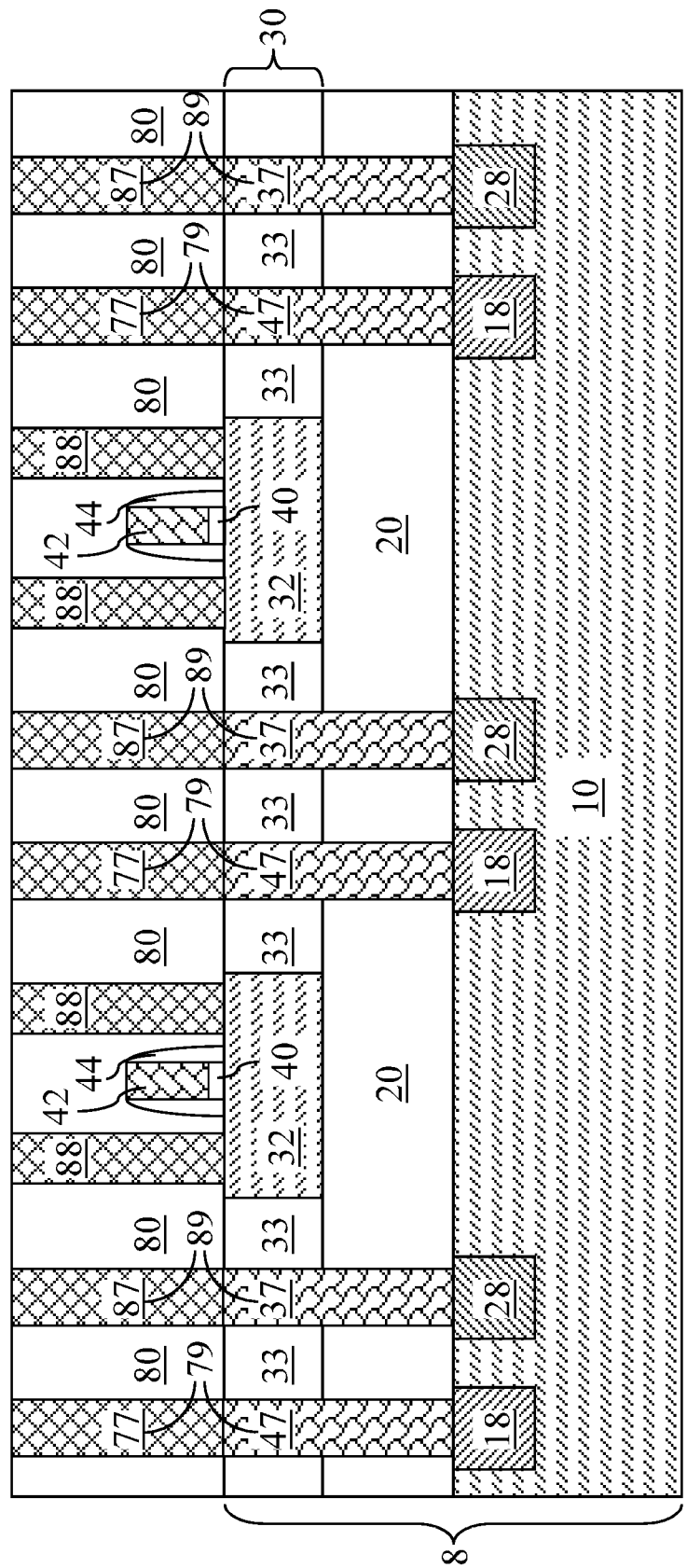
Figure 13:
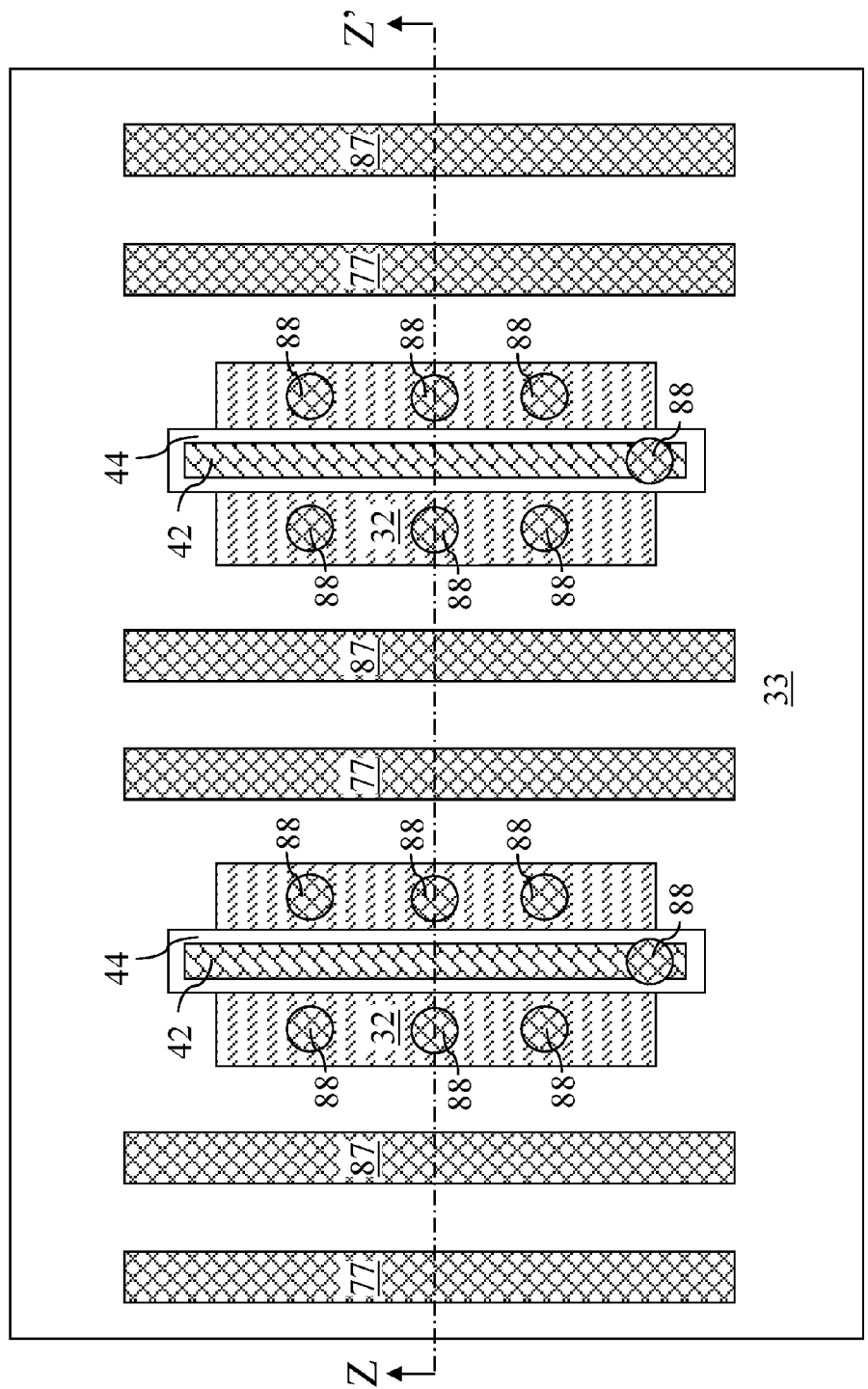

Referring to FIGS. 12 and 13, at least one first upper conductive via 77, at least one second upper conductive via 87, and third upper conductive vias 88 are formed in the MOL dielectric layer 80. FIG. 12 is a vertical cross-sectional view, and FIG. 13 is a modified top-down view of the first exemplary semiconductor structure in which the MOL dielectric layer 80 is omitted for clarity. The plane Z-Z' in FIG. 13 corresponds to the plane of the vertical cross-section of the first exemplary semiconductor structure in FIG. 12.

Specifically, a conductive material is deposited into the at least one first upper via cavity 54, the at least one second upper via cavity 57, and the third upper via cavities 58. The conductive material may be a doped semiconductor material or a metallic material. For example, the conductive material may be doped polysilicon, a doped silicon-containing semiconductor material, a doped compound semiconductor material, an elemental metal, an alloy of at least two elemental metals, a conductive metal nitride, etc. The excess conductive material above the top surface of the MOL dielectric layer 80 is removed, for example, by chemical mechanical planarization (CMP), recess etch, or a combination thereof. The remaining portion(s) of the conductive material in the at least one first upper via cavity 54 constitute(s) at least one first upper conductive via 77. The remaining portion(s) of the conductive material in the at least one second upper via cavity 57 constitute(s) at least one first upper conductive via 87. The remaining portions of the conductive material in the third upper via cavities 58 constitute third upper conductive vias 88. The third upper conductive vias 88 may be formed directly on the source regions (not shown separately), the drain regions (not shown separately) and the gate electrodes 42 of the at least one field effect transistor. The source regions and the drain regions are located in the at least one top semiconductor portion 32.

Figure 14:
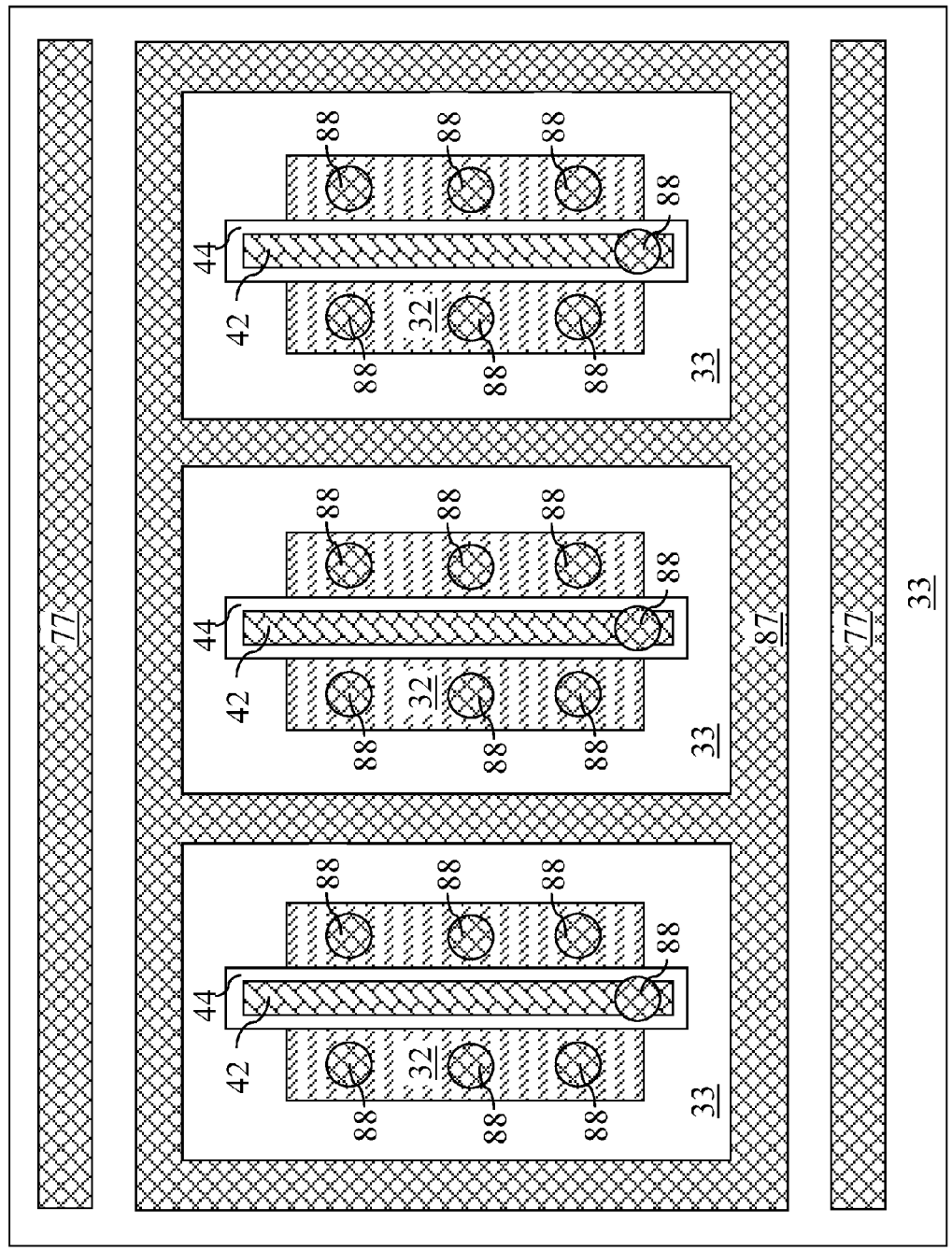

Referring to FIG. 14, a top-down view of a first alternate configuration is shown for the at least one first upper conductive via 77, at least one second upper conductive via 87, and third upper conductive vias 88. In the first alternate configuration of the first exemplary semiconductor structure, the at least one first upper conductive via 77 is an array of conductive vias that do not abut one another, and the at least one second upper conductive via 87 is a single conductive via having a plurality of conducive via portions that are interconnected among one another.

Figure 15:
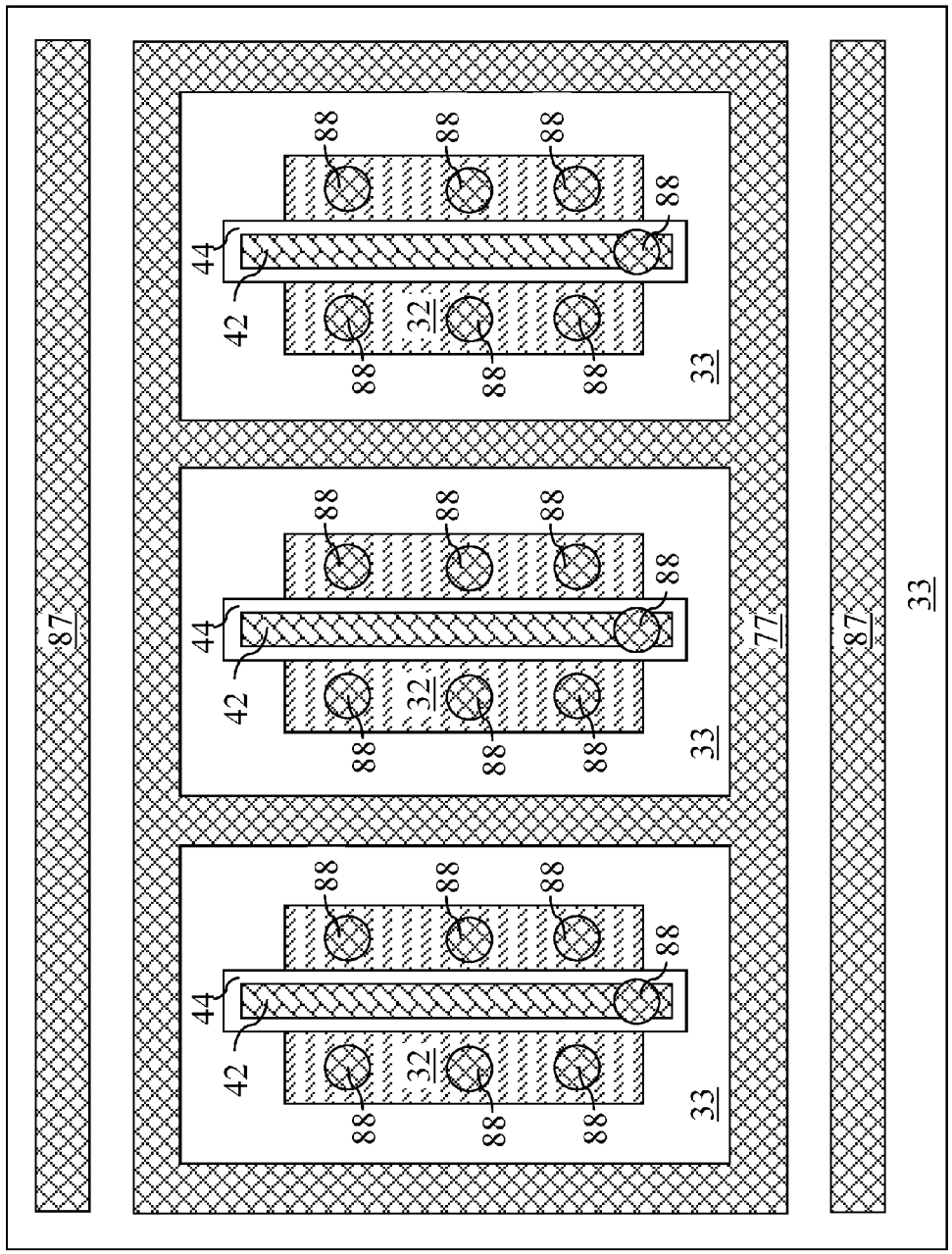

Referring to FIG. 15, a top-down view of a second alternate configuration is shown for the at least one first upper conductive via 77, at least one second upper conductive via 87, and third upper conductive vias 88. In the second alternate configuration of the first exemplary semiconductor structure, the at least one first upper conductive via 87 is a single conductive via having a plurality of conducive via portions that are interconnected among one another, and the at least one first upper conductive via 77 is an array of conductive vias that do not abut one another.

Figure 16:
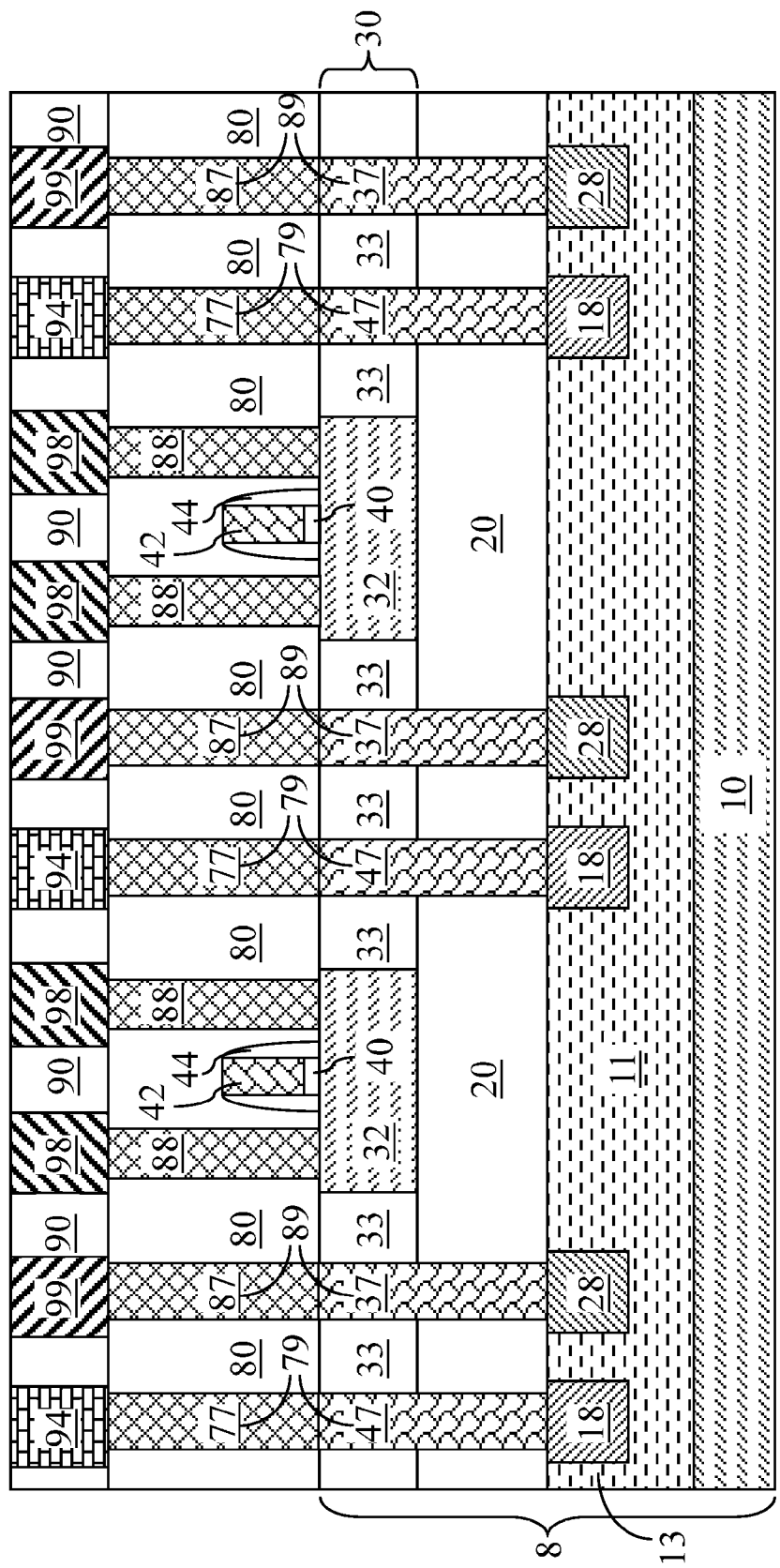
Figure 17:
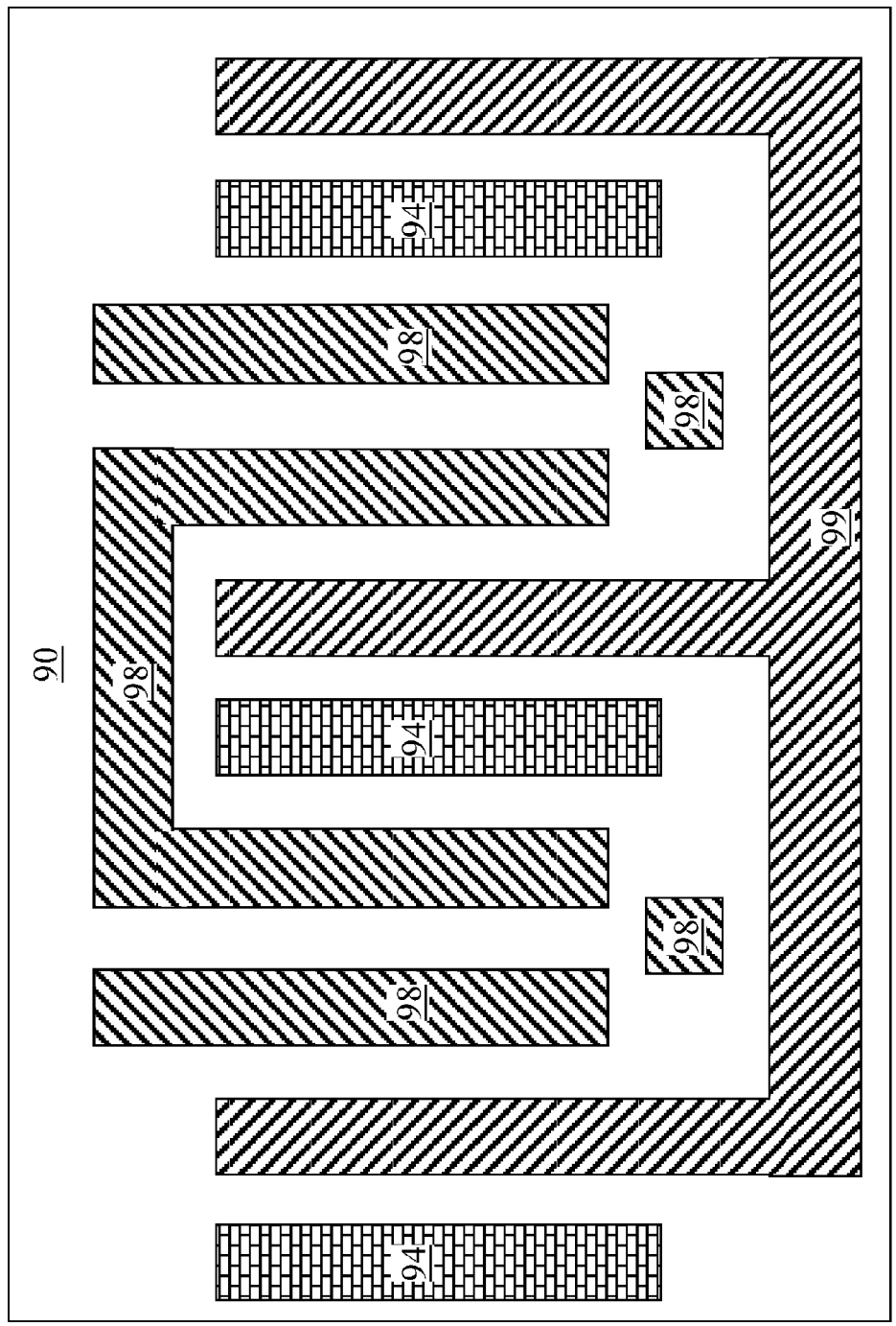

Referring to FIGS. 16 and 17, an interconnect-level dielectric layer 90, at least one first interconnect-level metal line 94, at least one second interconnect-level metal line 99, and third interconnect-level metal line 98 are formed directly on the top surface of the MOL dielectric layer 80. FIG. 16 is a vertical cross-sectional view of the first exemplary semiconductor structure of the present invention. FIG. 17 is a top-down view of the first embodiment of the present invention.

The dielectric material for the interconnect-level dielectric layer 90 may comprise any of the dielectric material that may be employed for the MOL dielectric layer 80 as described above. The thickness of the interconnect-level dielectric layer 90 may be from about 75 nm to about 1,000 nm, and typically from about 150 nm to about 500 nm, although lesser and greater thicknesses are also contemplated herein.

The at least one first interconnect-level metal line 94, the at least one second interconnect-level metal line 99, and the third interconnect-level metal line 98 are embedded in the interconnect-level dielectric layer 90, and may be formed by deposition of a metallic material and a subsequent planarization. The metallic material of the at least one first interconnect-level metal line 94, the at least one second interconnect-level metal line 99, and the third interconnect-level metal line 98 may be deposited by physical vapor deposition (PVD), electroplating, electroless plating, chemical vapor deposition, or a combination thereof. The at least one first interconnect-level metal line 94, the at least one second interconnect-level metal line 99, and the third interconnect-level metal line 98 may comprise, for example, Cu, Al, W, Ta, Ti, WN, TaN, TiN, or a combination thereof. The at least one first interconnect-level metal line 94, the at least one second interconnect-level metal line 99, and the third interconnect-level metal line 98 may comprise the same metallic material.

Each of the at least one first upper conductive via 77 vertically abuts the at least one first interconnect-level metal line 94. Each of the at least one second upper conductive via 87 vertically abuts the at least one second interconnect-level metal line 94. Each of the third upper conductive vias 88 vertically abuts one of the third interconnect-level metal lines 98.

The at least one first lower conductive via 47 and the at least one first upper conductive via 77 collectively constitute at least one first conductive via 79, which extends from the top surface of the MOL dielectric layer 80 to the top surface of the at least one first doped semiconductor region 18. Thus, at least one first conductive via 79 comprises a vertically abutting stack of the at least one first lower conductive via 47 and the at least one first upper conductive via 77. The bottom surface of each of the at least one first upper conductive via 77 vertically abut a top surface of one of the at least one first lower conductive via 47 at a level that is substantially coplanar with the top surface of the top semiconductor layer 30. A physically manifested interface is present at each bottom surface of the at least one first lower conductive via 47 that vertically abut one of the at least one first upper conductive via 77. The at least one first lower conductive via 47 and the at least one first upper conductive via 77 may comprise the same conductive material or different conductive materials. The at least one first conductive via 79 directly contacts the at least one first doped semiconductor region 18.

The at least one second lower conductive via 37 and the at least one second upper conductive via 87 collectively constitute at least one second conductive via 89, which extends from the top surface of the MOL dielectric layer 80 to the top surface of the at least one second doped semiconductor region 28. Thus, at least one second conductive via 89 comprises a vertically abutting stack of the at least one second lower conductive via 37 and the at least one second upper conductive via 87. The bottom surface of each of the at least one second upper conductive via 87 vertically abut a top surface of one of the at least one second lower conductive via 37 at a level that is substantially coplanar with the top surface of the top semiconductor layer 30. A physically manifested interface is present at each bottom surface of the at least one second lower conductive via 37 that vertically abut one of the at least one second upper conductive via 87. The at least one second lower conductive via 37 and the at least one second upper conductive via 87 may comprise the same conductive material or different conductive materials. The at least one second conductive via 89 directly contacts the at least one second doped semiconductor region 28.

The first exemplary semiconductor structure includes the at least one field effect transistor, which may constitute a radio frequency switch for a signal having a frequency from about 3 Hz to about 300 GHz. Particularly, the at least one field effect transistor may constitute a radio frequency switch that is capable of operating at VHF, UHF, SHF, and EHF.

At such high frequencies, capacitive coupling between the at least one field effect transistor and the bottom semiconductor layer 10 may become significant since the capacitive coupling increases linearly with frequency. The radio frequency signal in the at least one field effect transistor causes formation of an induced charge layer 11 in an upper portion of the bottom semiconductor layer 10. In the absence of electrical bias applied to the bottom semiconductor layer 10, the induced charge layer 11 is formed directly underneath the buried insulator layer 11, and includes positive charges or negative charges.

Specifically, the electrical charges in the induced charge layer 11 changes polarity at the signal frequency of the radio signal in the at least one field effect transistor in the absence of an electrical bias to the bottom semiconductor layer 10. When the voltage in the at least one field effect transistor is positive relative to the bottom semiconductor layer 10, electrons accumulate in the induced charge layer 11. When the voltage in the at least one field effect transistor is negative relative to the bottom semiconductor layer 10, holes accumulate in the induced charge layer 11. In the prior art, depending on the type of majority charge carriers in the bottom semiconductor layer 10, which is determined by the conductivity of the bottom semiconductor layer 10, the induced charge layer 11 may be in depletion mode having a net charge that is the opposite type of the conductivity of the bottom semiconductor layer 10, or may be in an inversion mode having a net charge that is the same type as the conductivity type of the bottom semiconductor layer 10.

Further, the thickness of the induced charge layer 11 changes in time at the signal frequency in the at least one field effect transistor. In other words, the frequency of the thickness change in the induced charge layer 11 is the radio frequency of the signal in the at least one field effect transistor.

According to the present invention, electrical bias is applied to the at least one second doped semiconductor region 28 to stabilize the property of the induced charge layer 11 during the operation of the at least one field effect transistor, which may function as an RF switch. The at least one second conductive via 89 provides a low resistance electrical path for applying the electrical bias to the at least one second doped semiconductor region 28 to stabilize the induced charge layer 11. The magnitude and polarity of the voltage bias applied to the at least one second doped semiconductor region 28 are selected to maintain the induced charge layer 11 in depletion mode, while preventing formation of any region in accumulation mode in the bottom semiconductor layer 10. In other words, the induced charge layer 11 is not in accumulation mode through the entirety of the cycle of the RF signal.

In case the bottom semiconductor layer 10 and the at least one second doped semiconductor region 28 have a p-type doping, the bias voltage applied to the at least one second doped semiconductor region 28 and the at least one first conductive via 89 is a constant negative voltage. Preferably, the magnitude of the constant negative voltage is about the same as, or greater than, the magnitude of maximum negative swing of the RF signal. In other words, the constant negative voltage is more negative than the RF signal at any phase. In this case, the entirety of the induced charge layer 11 is charged with negative charges. The induced charge layer 11 constitutes a depletion region, from which holes are depleted.

In case the bottom semiconductor layer 10 and the at least one second doped semiconductor region 28 have an n-type doping, the bias voltage applied to the at least one second doped semiconductor region 28 and the at least one first conductive via 89 is a constant positive voltage. Preferably, the magnitude of the constant positive voltage is about the same as, or greater than, the magnitude of maximum positive swing of the RF signal. In other words, the constant positive voltage is more positive than the RF signal at any phase. In this case, the entirety of the induced charge layer 11 is charged with positive charges. The induced charge layer 11 constitutes a depletion region, from which electrons are depleted.

The thickness of the induced charge layer 11 varies in time at the signal frequency of the RF signal in the at least one field effect transistor. However, the induced charge layer 11 is not in accumulation mode through the entirety of the cycle of the RF signal. Instead, the entirety of the induced charge layer 11 remains in depletion mode. The unchanging nature of the induced charge layer 11 due to the electrical bias reduces generation of harmonics by eliminating changes in polarity of electrical charges in the induced charge layer 11, which would be present without the at least one second doped semiconductor region 28 and the at least one conductive via 89 or the electrical bias applied thereto. Further, the electrical bias increases average thickness of the depletion region in the induced charge layer 11. Since no mobile charge is present in the depletion region, generation of eddy current is reduced in the bottom semiconductor layer 10 and the induced charge layer 11 generated by the RF signal and embedded within the bottom semiconductor layer 10.

While the electrical charges in the depletion region is not mobile and does not contribute to eddy current, signal loss, and generation of harmonics during the operation of the at least one field effect transistor at the radio frequency, the minority charge carriers in an inversion region, if formed as in the prior art, are mobile, thereby causing eddy current, signal loss, and generation of harmonics. According to the present invention, electrical bias is applied to the at least one first doped semiconductor region 18 to drain the minority charge carriers as soon as they are thermally generated to prevent formation of an inversion region. The at least one first conductive via 79 provides a low resistance electrical path for applying the electrical bias to the at least one first doped semiconductor region 18. In case the bottom semiconductor layer 10 is p-doped, the minority charge carriers are electrons. In case the bottom semiconductor layer 10 is n-doped, the minority charge carriers are holes. The magnitude and polarity of the voltage bias applied to the at least one first doped semiconductor region 18 are selected to effectively drain the minority charge carriers immediately after thermal generation so that formation of an inversion region is prevented at all phase of the radio frequency signal in the at least one field effect transistor. Thus, the structure of the present invention eliminates any inversion region so that eddy current and harmonic generation due to mobile charges is minimized.

If the bottom semiconductor layer 10 has a p-type doping, the at least one first doped semiconductor region 18 has an n-type doping and the at least one second doped semiconductor region 28 has a p-type doping. A first bias voltage which is applied to the at least one first doped semiconductor region 18 and the at least one first conductive via 79 is a constant positive voltage, and a second bias voltage which is applied to the at least one second doped semiconductor region 28 and the at least one second conductive via 87 is a constant negative voltage. In one case, the magnitude of the constant positive voltage may be about the same as, or greater than, a magnitude of maximum positive swing of the RF signal. The magnitude of the constant negative voltage may be about the same as, or greater than the magnitude of maximum negative swing of the RF signal.

If the bottom semiconductor layer 10 has an n-type doping, the at least one first doped semiconductor region 18 has a p-type doping and the at least one second doped semiconductor region 28 has an n-type doping. A first bias voltage which applied to the at least one first doped semiconductor region 18 and the at least one first conductive via 79 is a constant negative voltage, and a second bias voltage applied to the at least one second doped semiconductor region 28 and the at least one second conductive via 87 is a constant positive voltage. In one case, the magnitude of the constant positive voltage may be about the same as, or greater than, a magnitude of maximum positive swing of the RF signal. The magnitude of the constant negative voltage may be about the same as, or greater than the magnitude of maximum negative swing of the RF signal.

Referring to FIGS. 18, 19A, 19B, 20A, and 20B, a second exemplary semiconductor structure according to a second embodiment of the present invention is derived by employing the methods of the first embodiment, but omitting the processing steps employed for formation of at least one second lower via cavity 27 and at least one second lower conductive via 37. Thus, the processing step corresponding to FIG. 3 is omitted in the second embodiment. The second exemplary semiconductor structure of FIG. 18 corresponds to the same processing step as the first exemplary semiconductor structure of FIG. 9 in the first embodiment. The composition, doping, and thickness of the bottom semiconductor layer 10, the at least one first doped semiconductor region 18, and the at least one top semiconductor portion 32 may be the same as in the first embodiment. The composition and thickness of the buried insulator layer 20 and the shallow trench isolation structure 33 may also be the same as in the first embodiment. The composition and dimensions of the at least one first lower conductive via 47 may be the same as in the first embodiment.

Figure 18:
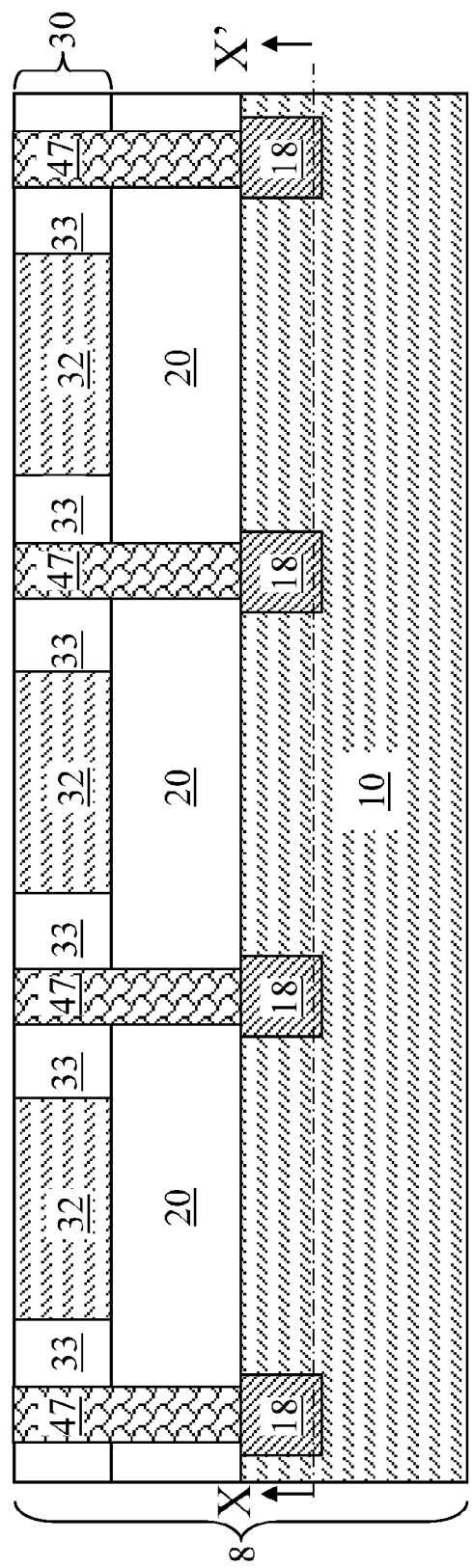
FIGS. 18, 19A, 19B, 20A, 20B, and 21-25 are various views of a third exemplary semiconductor structure according to a second embodiment of the present invention.
Figure 19A:
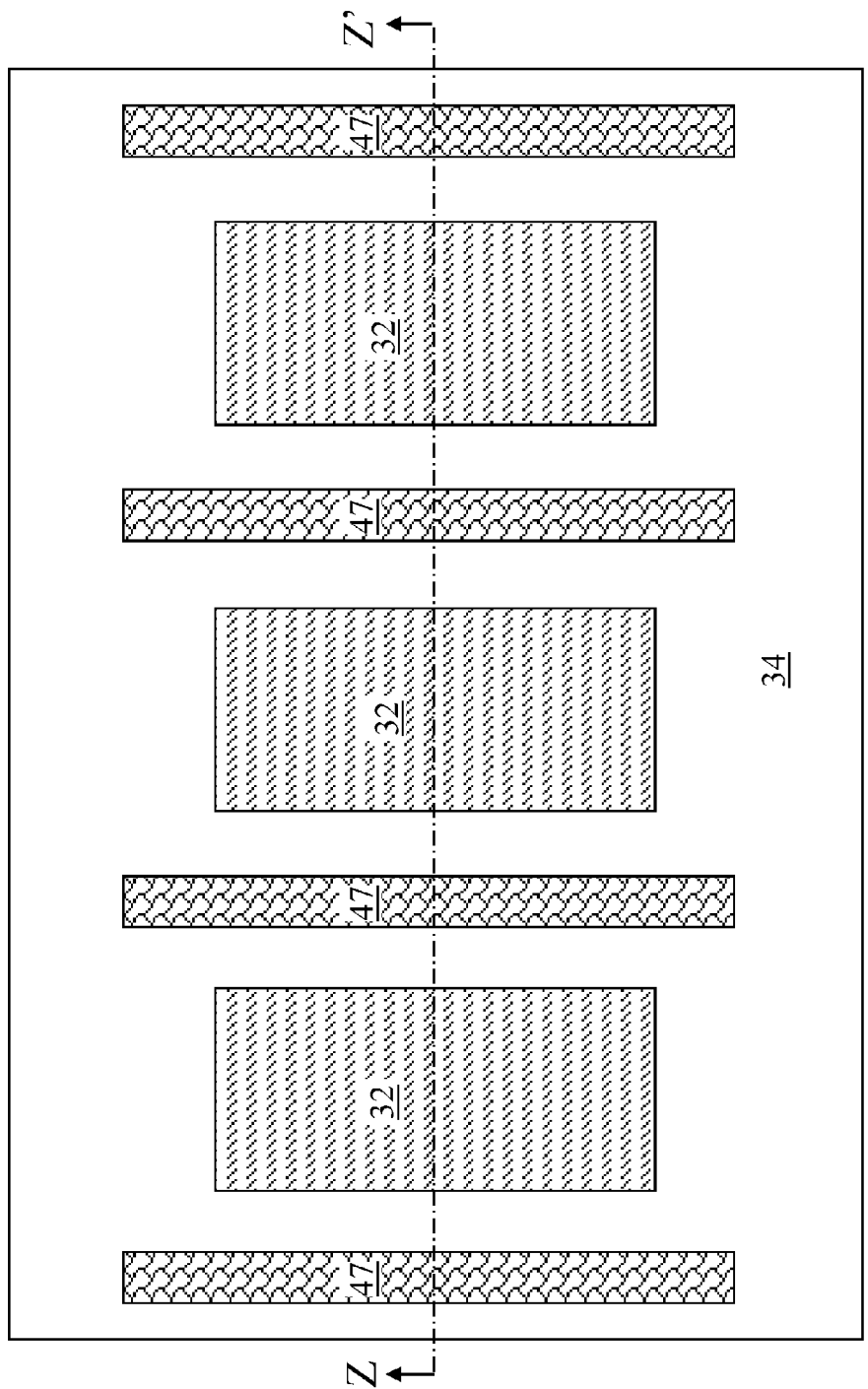
Figure 19B:
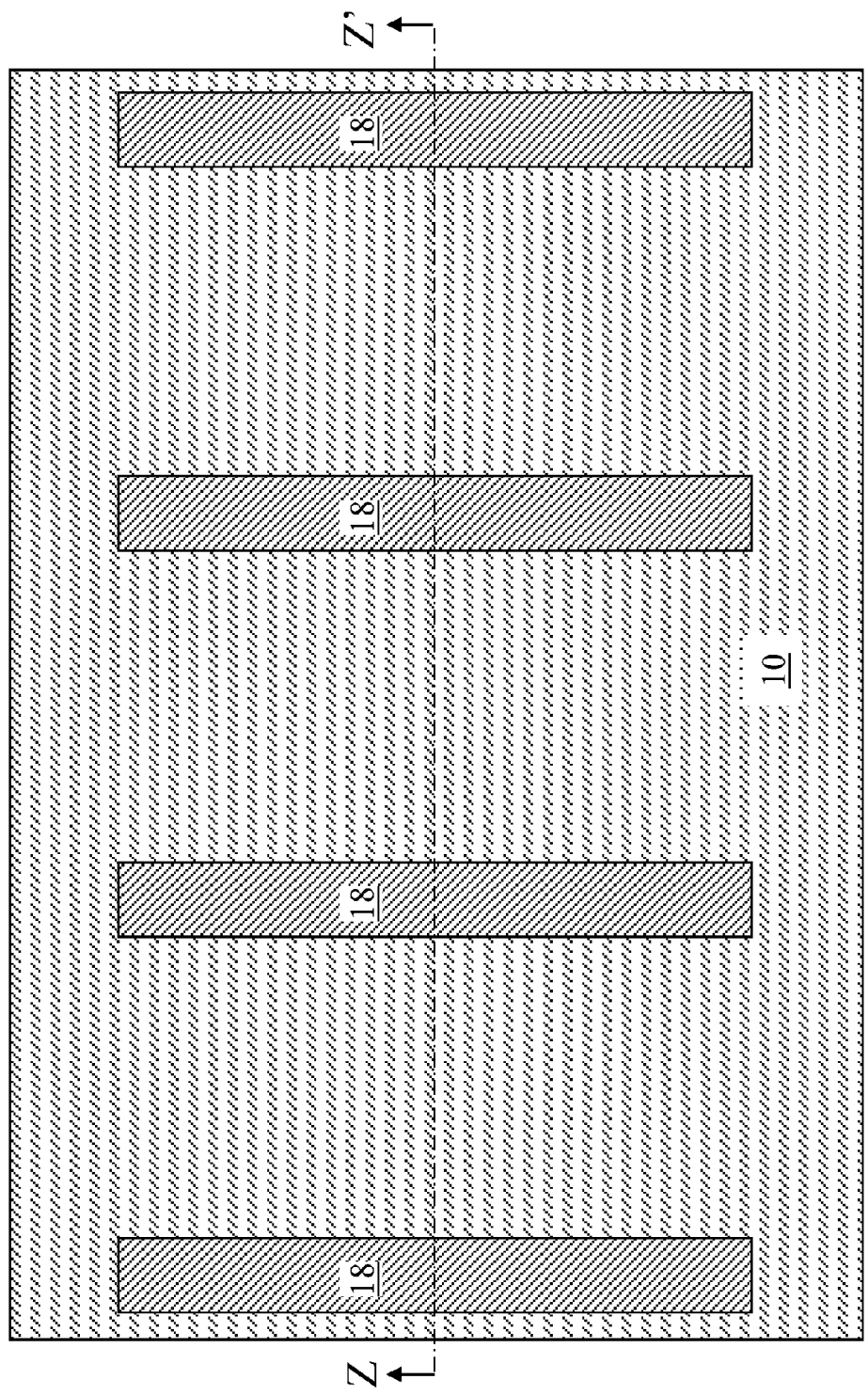
Figure 20A:
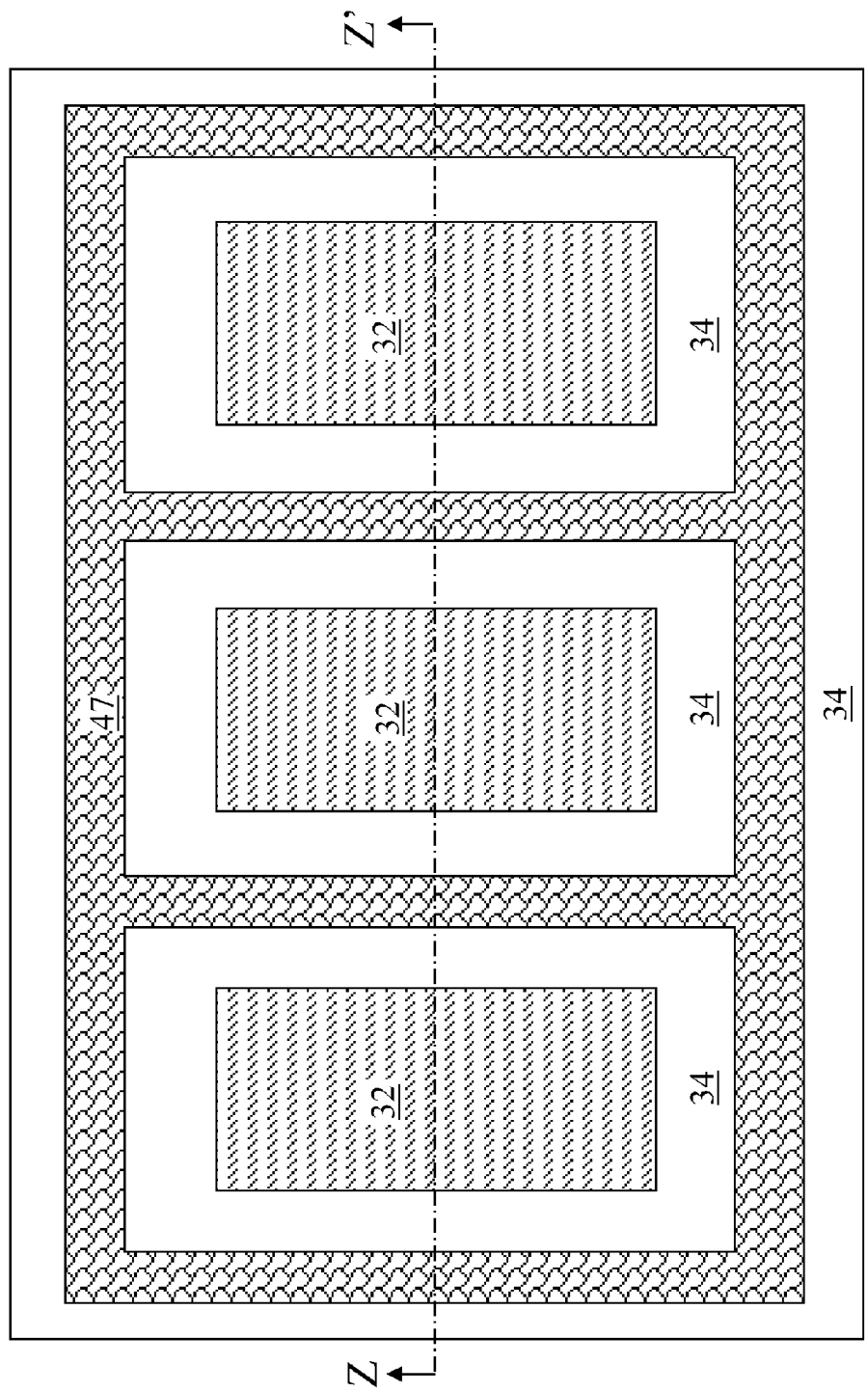
Figure 20B:
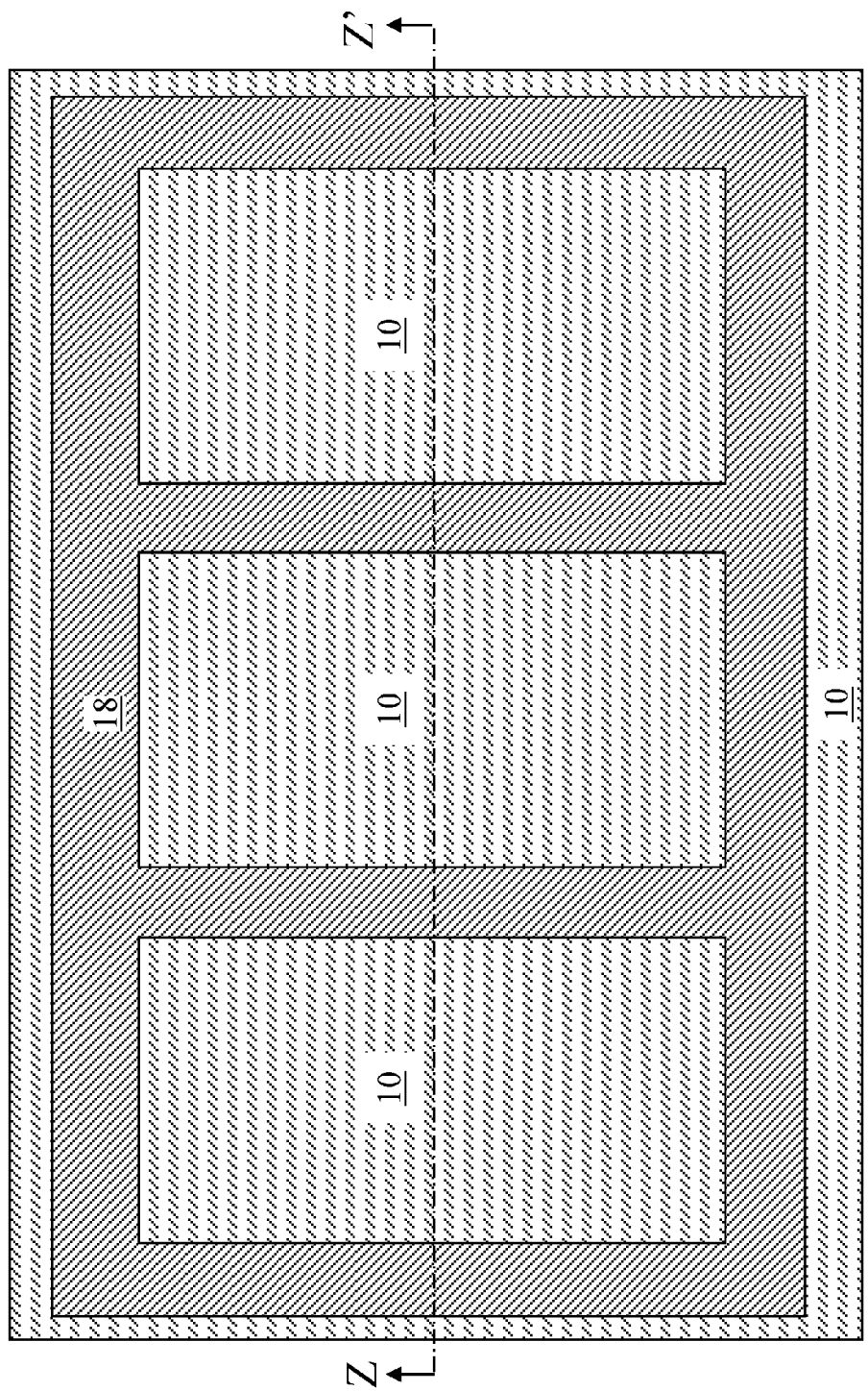

FIG. 18 is a common vertical cross-sectional view of a first configuration of the second exemplary semiconductor structure shown in FIGS. 19A and 19B and a second configuration of the second exemplary semiconductor structure shown in FIGS. 20A and 20B. FIG. 19A is a top-down view of the first configuration of the second exemplary semiconductor structure. FIG. 19B is a horizontal cross-sectional view of the first configuration of the second exemplary semiconductor structure along the plane X-X' in FIG. 18. FIG. 20A is a top-down view of the second configuration of the second exemplary semiconductor structure. FIG. 20B is a horizontal cross-sectional view of the second configuration of the second exemplary semiconductor structure along the plane X-X' in FIG. 18. The plane Z-Z' in FIGS. 19A, 19B, 20A, and 20B corresponds to the plane of the vertical cross-section for the common vertical cross-sectional view of the second exemplary semiconductor structure shown in FIG. 18.

In the first configuration of the second exemplary semiconductor structure shown in FIGS. 18, 19A and 19B, the at least one first lower conductive via 47 is an array of conductive vias. Each conductive via in the array of the conductive vias is disjoined from other conductive vias, i.e., does not abut another conductive via.

In a second configuration of the second exemplary semiconductor structure shown in FIGS. 18, 20A, and 20B, the at least one first lower conductive via 47 is a single conductive via having a plurality of conducive via portions that are interconnected among one another. In other words, the at least one first lower conductive via 47 includes a plurality of conductive via portions that are laterally connected between the top surface of the shallow trench isolation structure 33 and the top surface of the at least one first doped semiconductor region 18. In the second configuration, the at least one first lower conductive via 47 is a single contact via of unitary construction, i.e., in one contiguous piece, and laterally surrounds the entirety of the at least one top semiconductor portion 32 in which at least one field effect transistor is subsequently formed.

Figure 21:
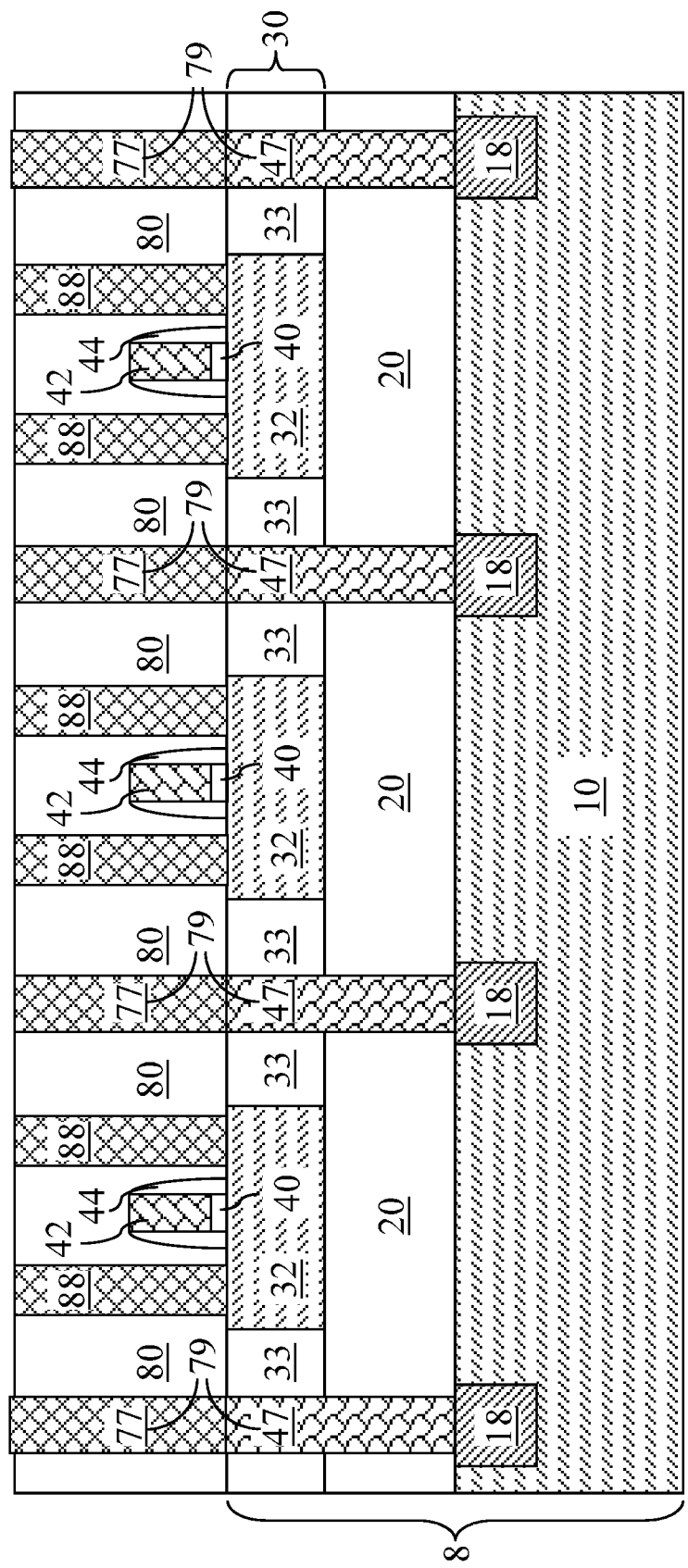
Figure 22:
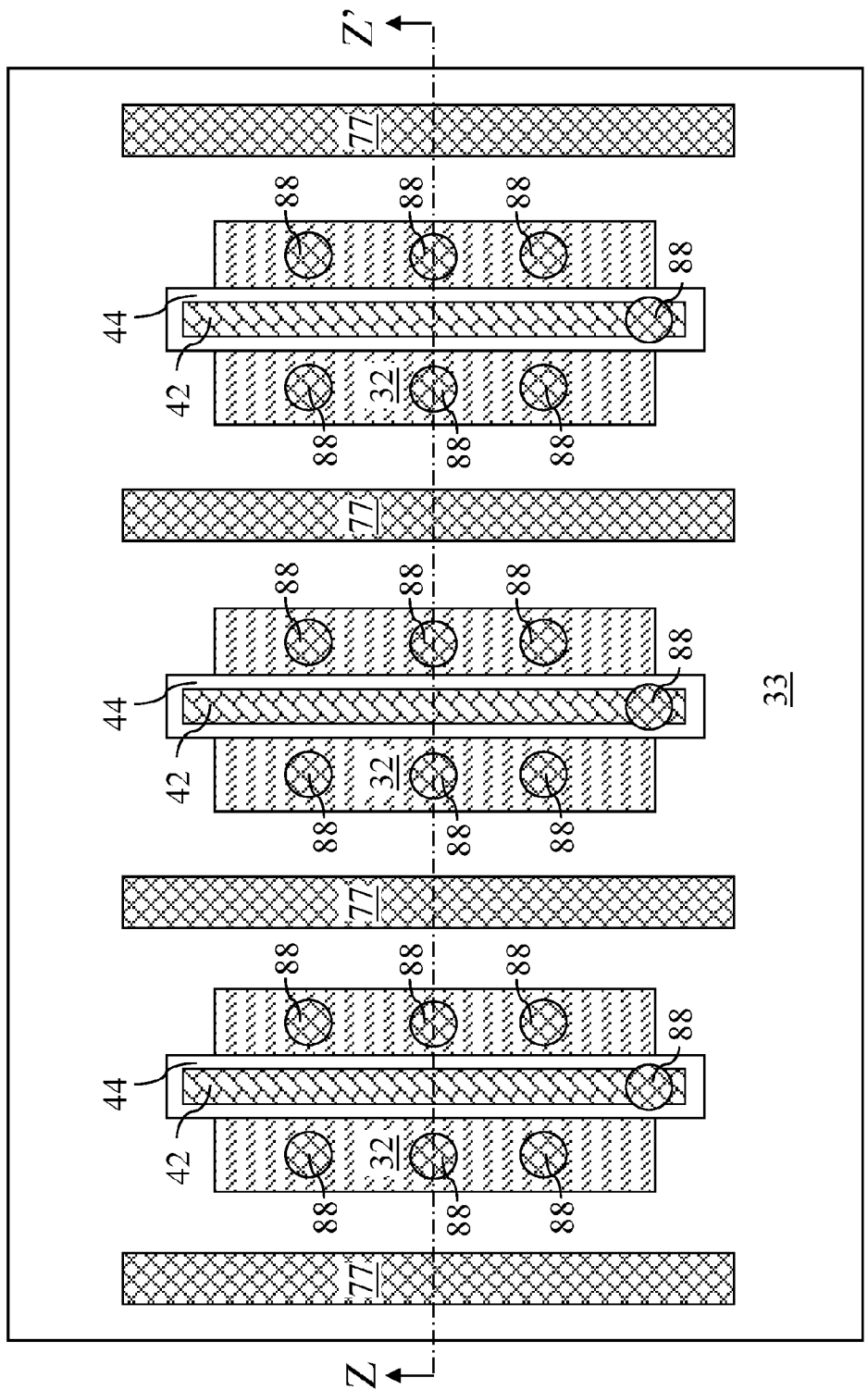
Figure 23:
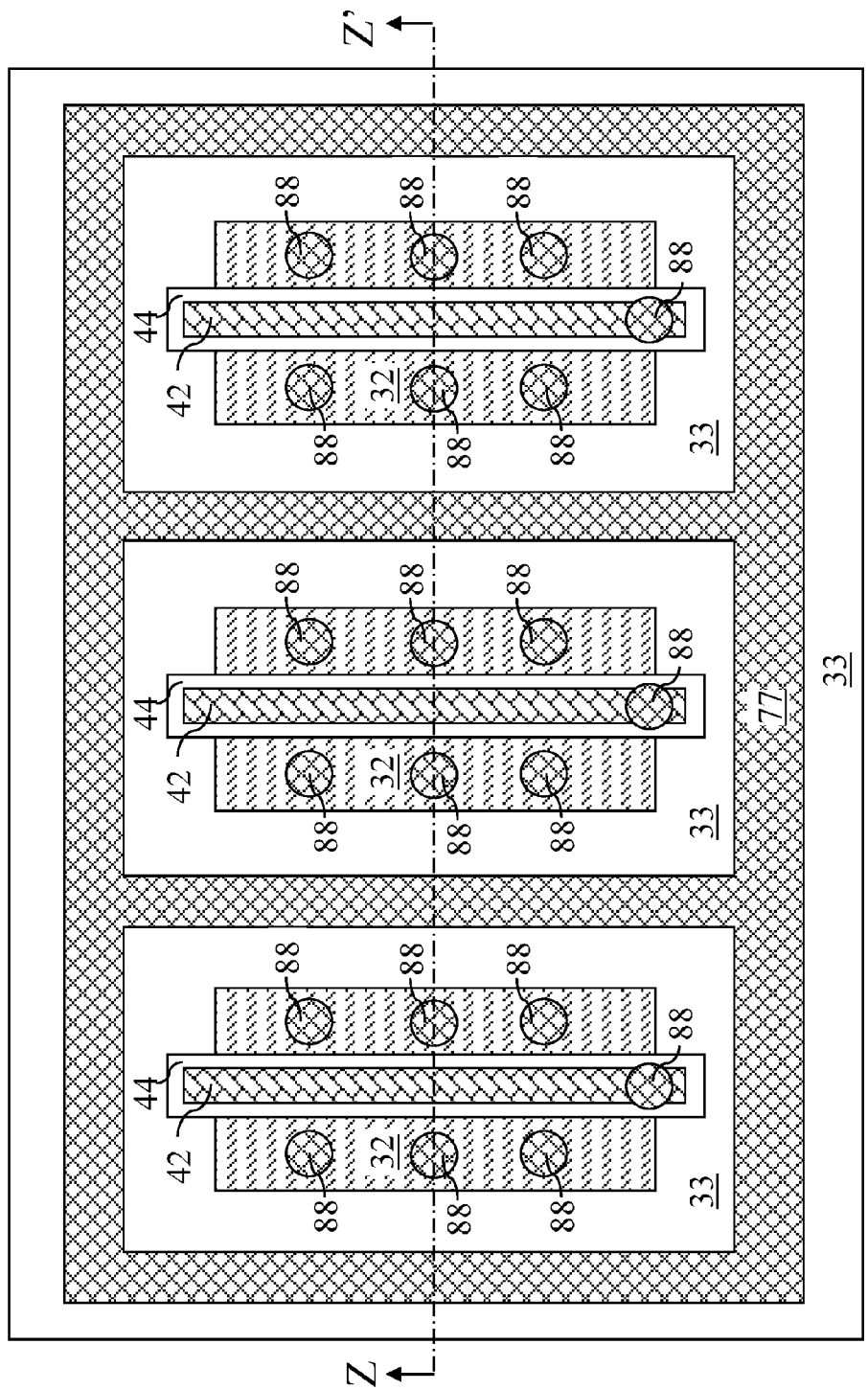

Referring to FIGS. 21, 22, and 23, at least one field effect transistor is formed directly on the at least one top semiconductor portion 32 by methods known in the art. Specifically, a gate dielectric 40, a gate electrode 42, and a gate spacer 44 are formed for each field effect transistor. A source region (not shown) and a drain region (not shown) are also formed in the at least one top semiconductor portion 32 for each field effect transistor by implanting dopants employing the gate electrode 42 and the gate spacer 44 of the field effect transistor as a self-aligning implantation mask.

A middle-of-line (MOL) dielectric layer 80 is formed on the at least one field effect transistor, the at least one top semiconductor portion 32, the shallow trench isolation structure 33, and the top surface(s) of the at least one first lower conductive via 47 in the same manner as in the first embodiment. At least one first upper conductive via 77 and third upper conductive vias 88 and are formed in the MOL dielectric layer 80 in the same manner as in the first embodiment.

FIG. 21 is a common vertical cross-sectional view of the first configuration of the second exemplary semiconductor structure shown in FIG. 22 and the second configuration of the second exemplary semiconductor structure shown in FIG. 23. FIG. 22 is a modified top-down view of the first configuration of the second exemplary semiconductor structure in which the MOL dielectric layer 80 is omitted for clarity. FIG. 23 is a modified top-down view of the second configuration of the second exemplary semiconductor structure in which the MOL dielectric layer 80 is omitted for clarity. The plane Z-Z' in FIGS. 22 and 23 corresponds to the plane of the vertical cross-section for the common vertical cross-sectional view of the second exemplary semiconductor structure shown in FIG. 21.

In the first configuration of the second exemplary semiconductor structure shown in FIGS. 21 and 22, the at least one first upper conductive via 77 is an array of conductive vias. Each conductive via in the array of the conductive vias is disjoined from other conductive vias, i.e., does not abut another conductive via.

In the second configuration of the second exemplary semiconductor structure shown in FIGS. 21 and 23, the at least one first upper conductive via 77 is a single conductive via having a plurality of conducive via portions that are interconnected among one another. In other words, the at least one first upper conductive via 77 includes a plurality of conductive via portions that are laterally connected between the top surface of the MOL dielectric layer 80 and the top surface of the shallow trench isolation structure 33. In the second configuration, the at least one first upper conductive via 77 is a single contact via of unitary construction, and laterally surrounds the entirety of the at least one field effect transistor. In case the at least one field effect transistor is a plurality of field effect transistors, all of the plurality of field effect transistors may be laterally enclosed by the single contact via.

Figure 24:
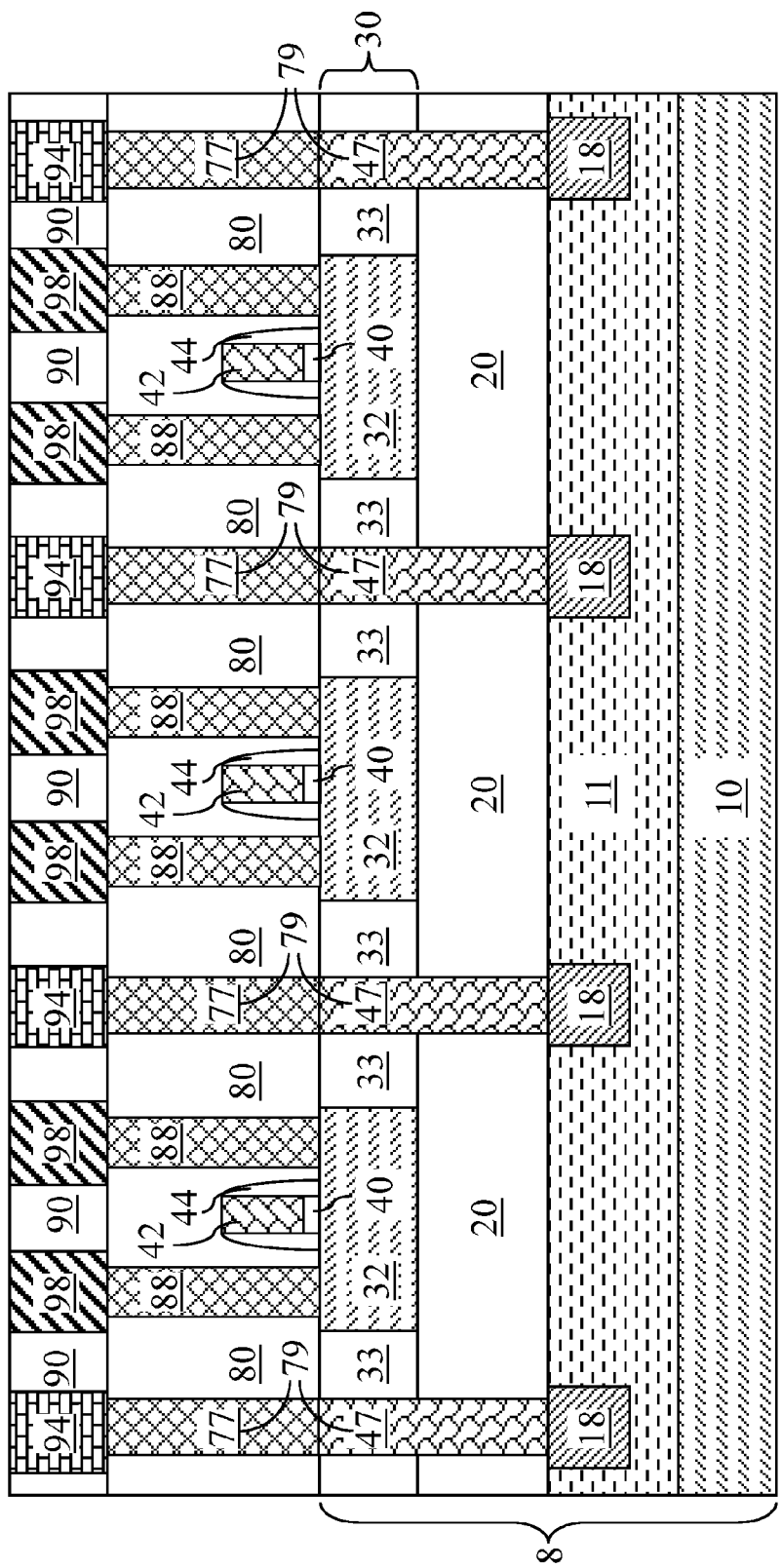
Figure 25:
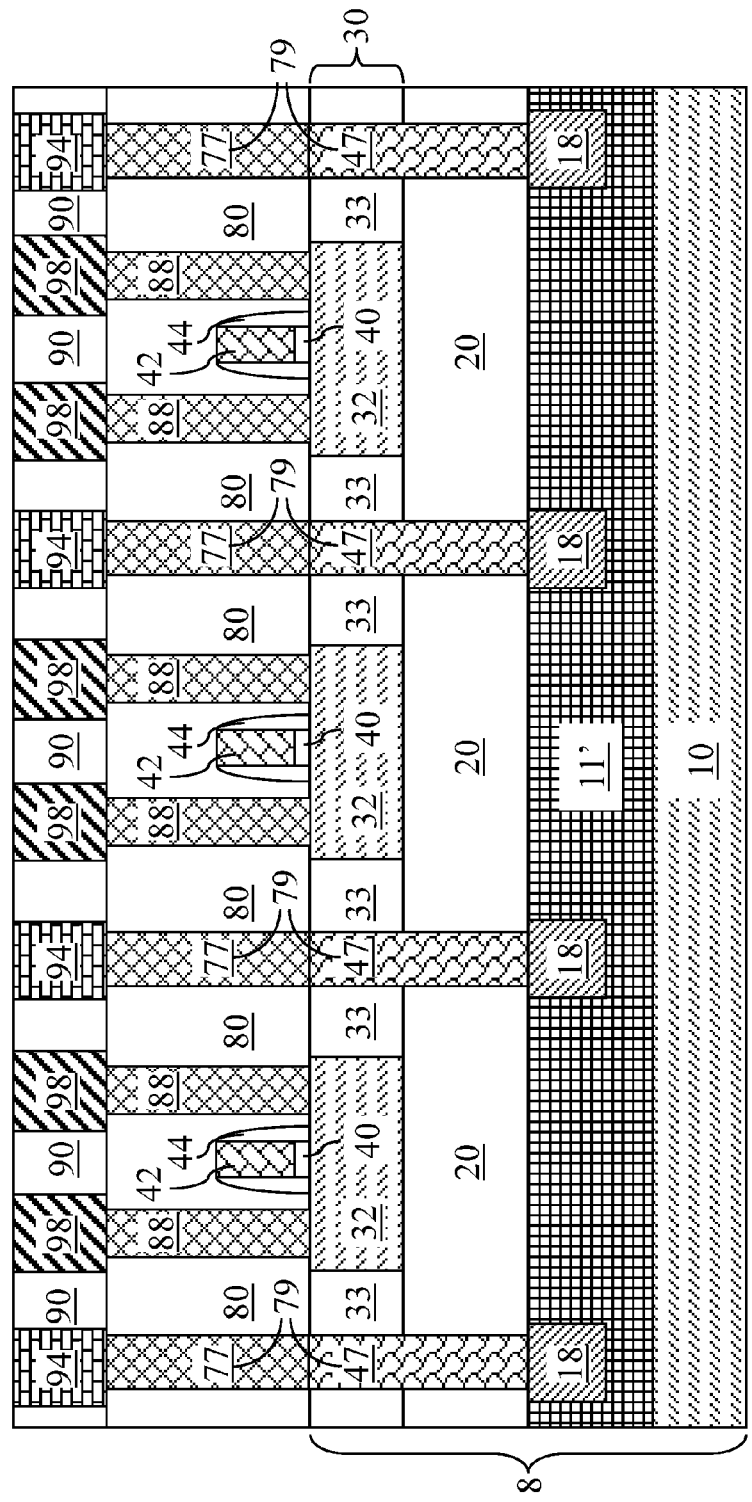

Referring to FIGS. 24 and 25, the second exemplary semiconductor structure is shown during operation with a radio frequency signal in the at least one field effect transistor, which may comprise a radio frequency (RF) switch. Prior to operation, an interconnect-level dielectric layer 90, at least one first interconnect-level metal line 94, and third interconnect-level metal line 98 are formed directly on the top surface of the MOL dielectric layer 80. The composition and thickness of the interconnect-level dielectric layer 90 may be the same as in the first embodiment. Also, the composition and thickness of the interconnect-level dielectric layer 90 and the at least one first interconnect-level metal line 94 may be the same as in the first embodiment. Each of the third upper conductive vias 88 vertically abuts one of the third interconnect-level metal line 98. Each of the at least one first upper conductive via 77 vertically abuts the at least one first interconnect-level metal line 94.

The at least one first lower conductive via 47 and the at least one first upper conductive via 77 collectively constitute at least one first conductive via 79, which extends from the top surface of the MOL dielectric layer 80 to the bottom surface of the buried insulator layer 20. Thus, the at least one first conductive via 79 comprises a vertically abutting stack of the at least one first lower conductive via 47 and the at least one first upper conductive via 77. The bottom surface of each of the at least one first upper conductive via 77 vertically abut a top surface of one of the at least one first lower conductive via 47 at a level that is substantially coplanar with the top surface of the top semiconductor layer 30. A physically manifested interface is present at each bottom surface of the at least one first lower conductive via 47 that vertically abut one of the at least one first lower conductive via 47. The at least one first lower conductive via 47 and the at least one first upper conductive via 77 may comprise the same conductive material or different conductive materials. The at least one first conductive via 79 directly contacts the at least one first doped semiconductor region 18.

The second exemplary semiconductor structure includes the at least one field effect transistor, which may constitute a radio frequency switch for a signal having a frequency from about 3 Hz to about 300 GHz as in the first embodiment. Particularly, the at least one field effect transistor may constitute a radio frequency switch that is capable of operating at VHF, UHF, SHF, and EHF.

At such high frequencies, capacitive coupling between the at least one field effect transistor and the bottom semiconductor layer 10 may become significant since the capacitive coupling increases linearly with frequency. The radio frequency signal in the at least one field effect transistor causes formation of an induced charge layer 11 in an upper portion of the bottom semiconductor layer 10. In the second embodiment, the induced charge layer 11 is formed directly underneath the buried insulator layer 11, and includes positive charges or negative charges depending on the phase of the radio frequency signal in the at least one field effect transistor.

Referring to FIG. 24, when the phase of the radio frequency signal is such that majority charge carriers are repelled from an upper portion of the bottom semiconductor layer 10, the induced charge layer 11 comprises a depletion region. Further, a strong RF signal attracts minority charge carriers directly underneath the bottom surface of the buried insulator layer 20. This occurs when the at least one top semiconductor portion 32 is at a positive voltage relative to the bottom semiconductor layer 10 having a p-type doping, or when at least one top semiconductor portion 32 is at a negative voltage relative to the bottom semiconductor layer 10 having an n-type doping. While the depletion region includes electrical charges, the electrical charges in the depletion region are not mobile, and do not contribute to eddy current or generation of harmonics of the RF signal. In the prior art, accumulation of minority charge carriers, if not deterred, provides an inversion region, however, which responds to the electromagnetic field of the RF signal and generates eddy current and harmonics of the RF signal. According to the present invention, the minority charge carriers are drained through the at least one first conductive via 79 and the a least one doped semiconductor region 18 as soon as they are thermally generated so that accumulation of minority charge carriers and formation of an inversion region are prevented, thereby reducing eddy current, signal loss, and generation of harmonics of the RF signal.

In general, the thickness of the induced charge layer 11 changes in time at the signal frequency in the at least one field effect transistor. In other words, the frequency of the thickness change in the induced charge layer 11 is the radio frequency of the signal in the at least one field effect transistor.

If the bottom semiconductor layer 10 has a p-type doping, the bias voltage applied to the at least one first doped semiconductor region 18 and the at least one first conductive via 79 is a constant positive voltage. In one case, the magnitude of the constant positive voltage is about the same as, or greater than, the magnitude of maximum positive swing of the RF signal to insure fast draining of the minority charge carriers and to prevent formation of an inversion region.

If the bottom semiconductor layer 10 has an n-type doping, the bias voltage applied to the at least one first doped semiconductor region 18 and the at least one first conductive via 79 is a constant negative voltage. In one case, the magnitude of the constant negative voltage is about the same as, or greater than, the magnitude of maximum negative swing of the RF signal to insure fast draining of the minority charge carriers and to prevent formation of an inversion region.

Referring to FIG. 25, when the phase of the radio frequency signal is such that majority charge carriers are attracted toward the upper portion of the bottom semiconductor layer 10, the induced charge layer 11' comprises an accumulation region 14. This occurs when the at least one top semiconductor portion 32 is at a negative voltage relative to the bottom semiconductor layer 10 having a p-type doping, or when at least one top semiconductor portion 32 is at a positive voltage relative to the bottom semiconductor layer 10 having an n-type doping.

Optionally, the bottom semiconductor layer 10 may be electrically biased through the body of the bottom semiconductor layer 10 to a constant voltage to minimize the thickness of the accumulation region 14 or to prevent generation of the accumulation region, thereby maintaining the induced charge layer 11 as a depletion region at all times (See FIG. 24). Such variations are explicitly contemplated herein.

Figure 26:
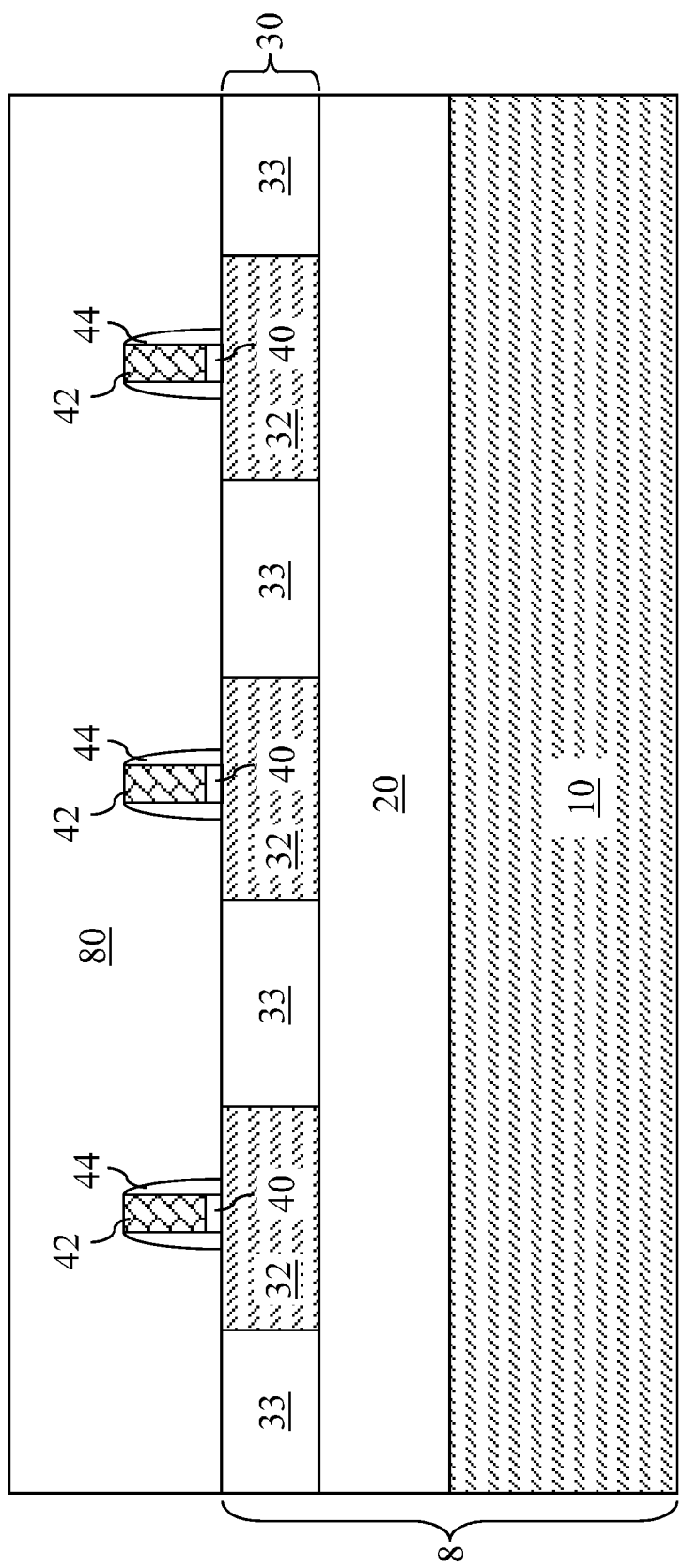
FIGS. 26-29, 30A, 30B, 31A, 31B, and 32-35 are various views of a third exemplary semiconductor structure according to a third embodiment of the present invention.

Referring to FIG. 26, a third exemplary semiconductor structure according to a third embodiment of the present invention comprises a semiconductor substrate 8, at least one field effect transistor formed thereupon, and a middle-of-line (MOL) dielectric layer 80. The semiconductor substrate 8 includes a bottom semiconductor layer 10, a buried insulator layer 20, and a top semiconductor layer 30 as in the first embodiment. The top semiconductor layer 30 includes at least one top semiconductor portion 32 and a shallow trench isolation structure 33.

The composition and the thickness of the bottom semiconductor layer 10, the buried insulator layer 20, and the top semiconductor layer 30 may be the same as in the first embodiment. The resistivity of the bottom semiconductor layer 10 may also be the same as in the first embodiment. The shallow trench isolation region 33 may have the same composition as, and may be formed by the same methods as, in the first embodiment.

At least one field effect transistor is formed on the at least one top semiconductor portion 32 by methods known in the art. Specifically, a gate dielectric 40, a gate electrode 42, and a gate spacer 44 are formed for each field effect transistor. A source region (not shown) and a drain region (not shown) are also formed in the at least one top semiconductor portion 32 for each field effect transistor by implanting dopants employing the gate electrode 42 and the gate spacer 44 of the field effect transistor as a self-aligning implantation mask. A middle-of-line (MOL) dielectric layer 80 is formed on the at least one field effect transistor, the at least one top semiconductor portion 32, and the shallow trench isolation structure 33. The MOL dielectric layer 80 may comprise the same material and have the same thickness as in the first embodiment.

Figure 27:
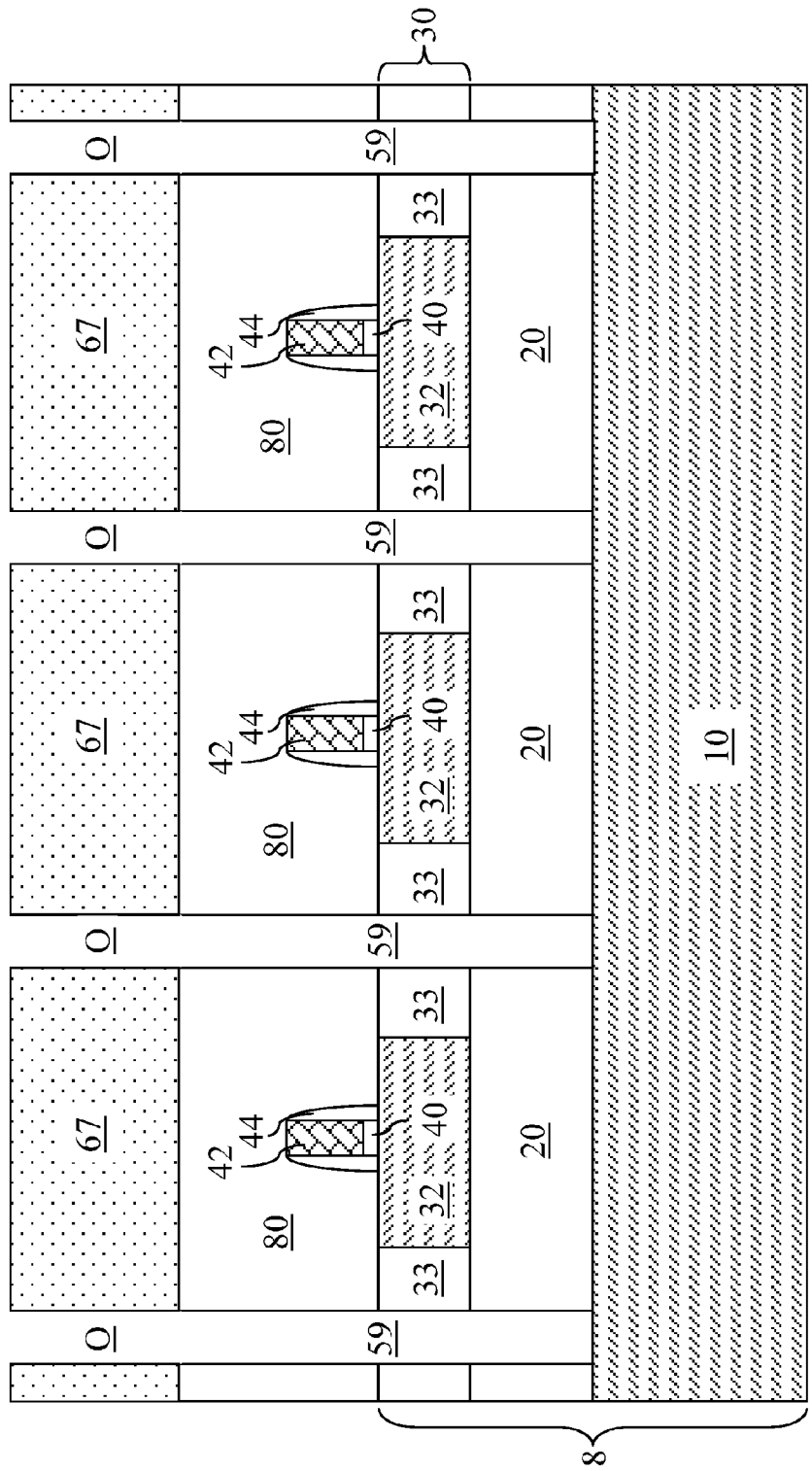

Referring to FIG. 27, a photoresist 67 is applied to a top surface of the MOL dielectric layer 80 and lithographically patterned to form at least one opening O. Each of the at least one opening O is located outside the area of the at least one top semiconductor portion 32 and inside the area of the shallow trench isolation structure 33 in a see-through top-down view. The pattern of the at least one opening O in the photoresist 67 is transferred into the MOL dielectric layer 80 by an anisotropic etch, which may be a reactive ion etch. The photoresist 67 is employed as an etch mask for the anisotropic etch. At least one via cavity 59 is formed underneath the at least one opening O in the photoresist 67.

The anisotropic etch proceeds through a top surface of the shallow trench isolation structure 33, through a top surface of the buried insulator layer 20, and at least to a top surface of a bottom semiconductor layer 10. Preferably, the anisotropic etch is selective to the semiconductor material of the bottom semiconductor layer 10. For example, if the bottom semiconductor layer 10 comprises silicon, an anisotropic etch that removes dielectric material, such as silicon oxide, selective to silicon may be employed to provide a selective etch that stops on the top surface of the bottom semiconductor layer 10.

A top surface of the bottom semiconductor layer 10 is exposed at the bottom of each of the at least one via cavity 59. Each of the at least one via cavity 59 is formed through the MOL dielectric layer 80, the shallow trench isolation structure 33, and the buried insulator layer 20. In other words, each of the at least one second via cavity 57 extends from a top surface of the MOL dielectric layer 80, through the MOL dielectric layer 80, the shallow trench isolation structure 33, and the buried insulator layer 20, and to a top surface of the bottom semiconductor layer 10. The photoresist 67 is subsequently removed.

In a first configuration of the third exemplary semiconductor structure, the at least one via cavity 59 is an array of via cavities. Each via cavity in the array of via cavities is a discrete via cavity that does not abut another via cavity.

In a second configuration of the third exemplary semiconductor structure, the at least one via cavity 59 is a single via cavity having a plurality of via cavity portions that are interconnected among one another. In other words, the at least one via cavity 59 includes a plurality of via cavity portions that are laterally connected between the top surface of the MOL dielectric layer 80 and a top surface of the bottom semiconductor layer 10.

Figure 28:
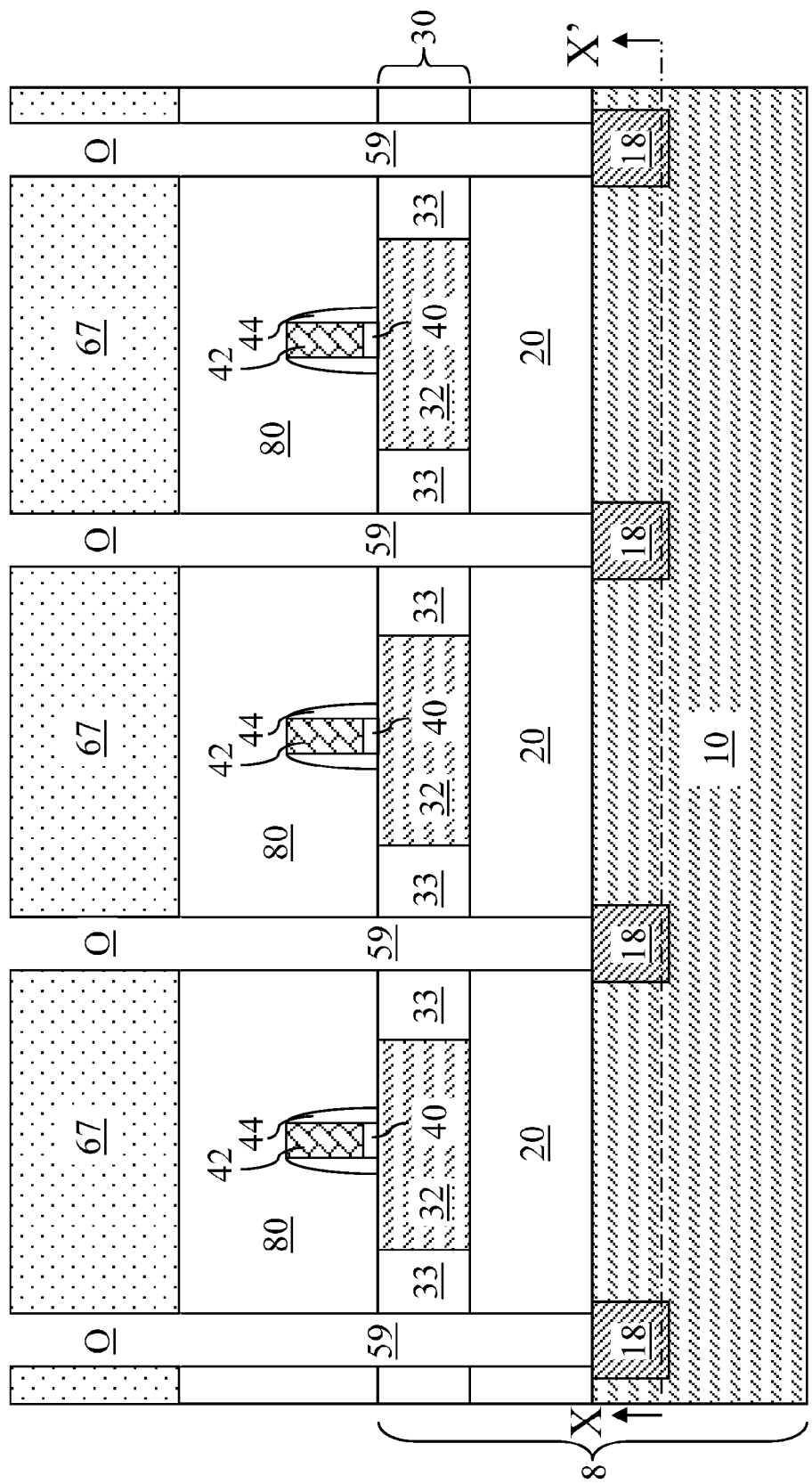

Referring to FIG. 28, at least one first doped semiconductor region 18 is formed by implanting dopants of the first conductivity type into exposed portion of the bottom semiconductor layer 10. Due to lateral straggle of the implanted dopants, the at least one doped semiconductor region extends laterally outside the area of the at least one via cavity 59 and vertically abuts a bottom surface of the buried insulator layer 20. The same methods may be employed for ion implantation as in the first embodiment. Each of the at least one doped semiconductor region vertically abuts a bottom surface of the at least one via cavity 59 and the bottom surface buried insulator layer 20. In case the bottom semiconductor layer 10 comprises a single crystalline semiconductor material, the at least one first doped semiconductor region 18 is also single crystalline.

The thickness of the at least one first doped semiconductor region 18 may be from about 10 nm to about 600 nm, and typically from about 50 nm to about 300 nm, although lesser and greater thicknesses are also contemplated herein. The at least one first doped semiconductor region 18 is typically heavily doped to reduce the resistivity. The at least one first doped semiconductor region 18 may have a dopant concentration from about $1.0 \times 10^{19}/cm^3$ to abut $1.0 \times 10^{21}/cm^3$, although lesser and greater dopants concentrations are also contemplated herein. The photoresist 67 is subsequently removed selective to the MOL dielectric layer 80, the exposed sidewalls of the shallow trench isolation region 33, the exposed sidewalls of the buried insulator layer 20, and the at least one first doped semiconductor region 18.

Figure 29:
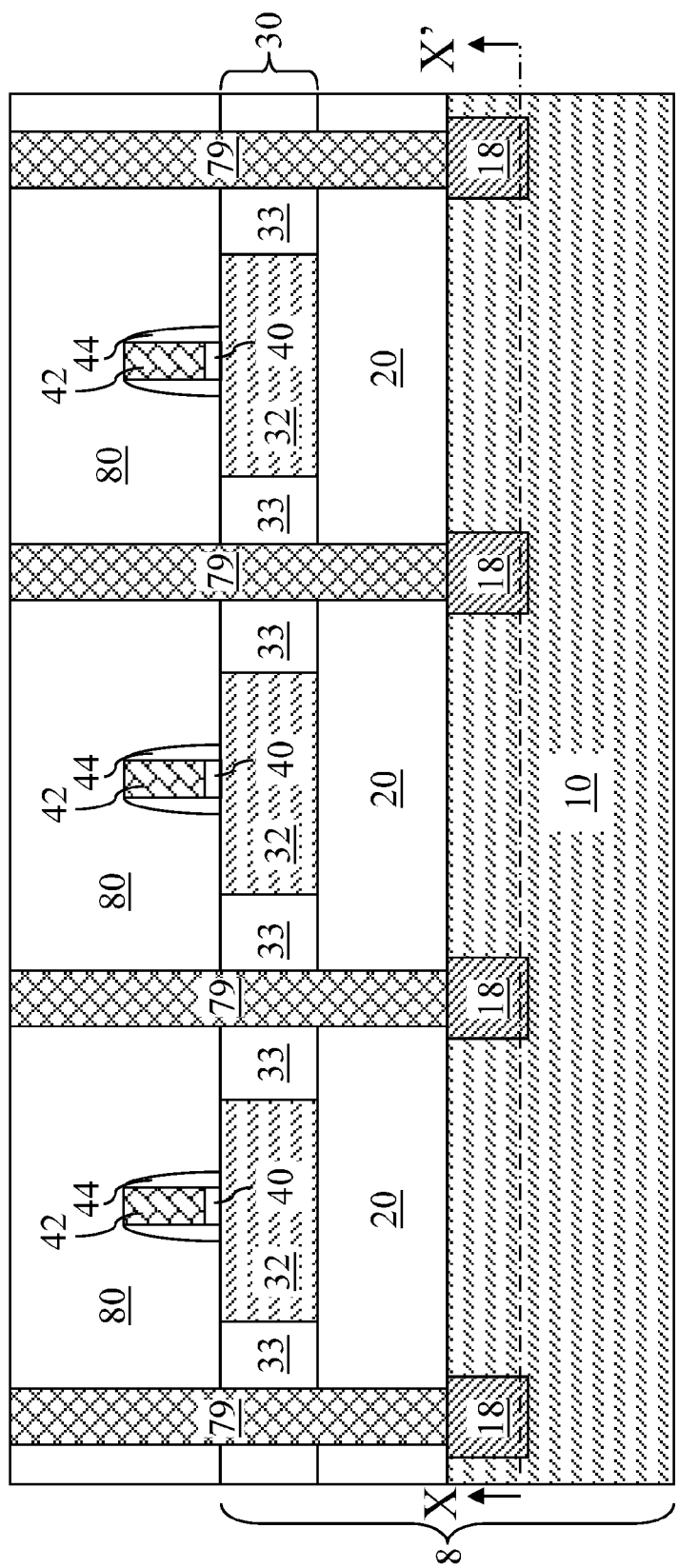
Figure 30A:
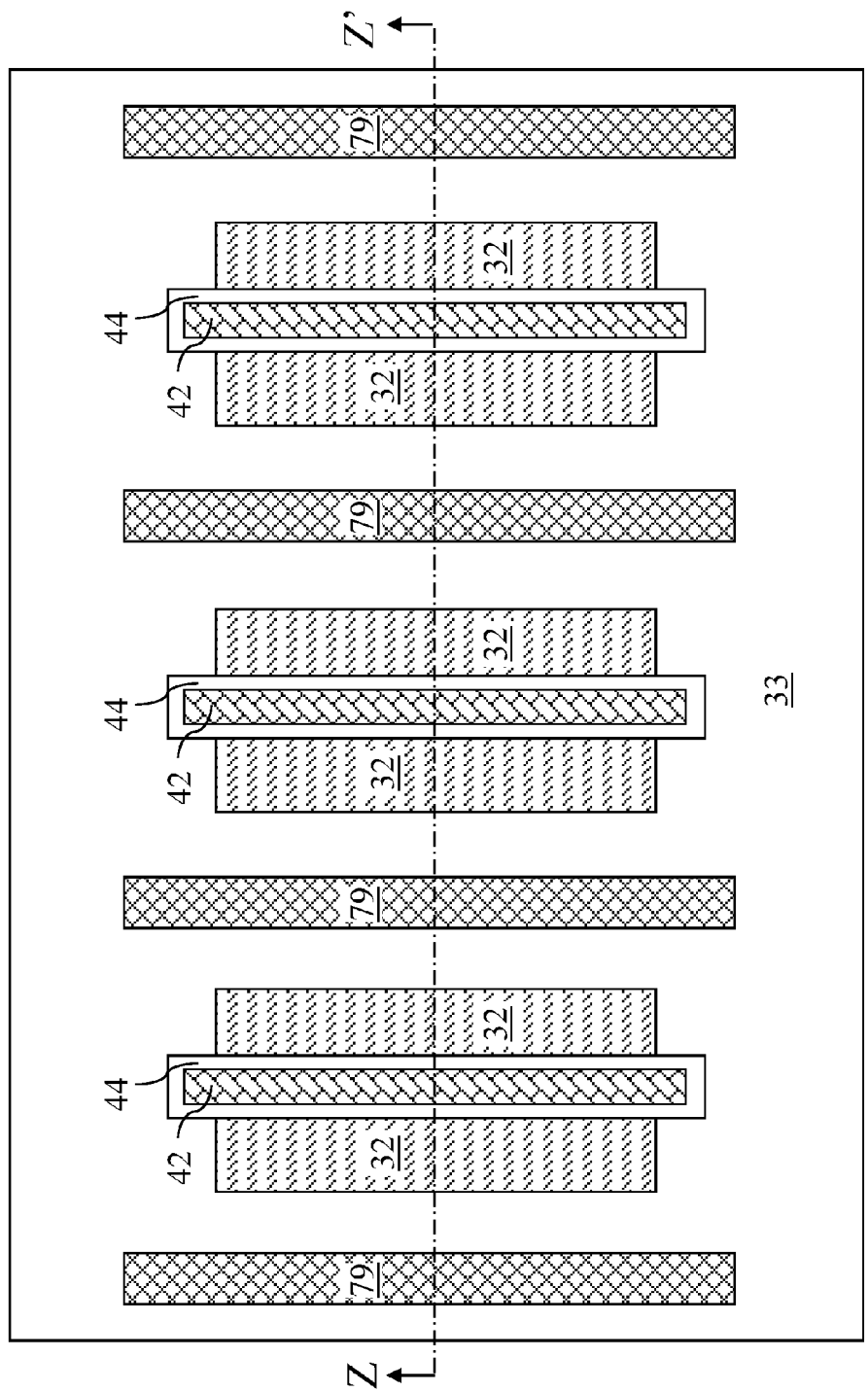
Figure 30B:
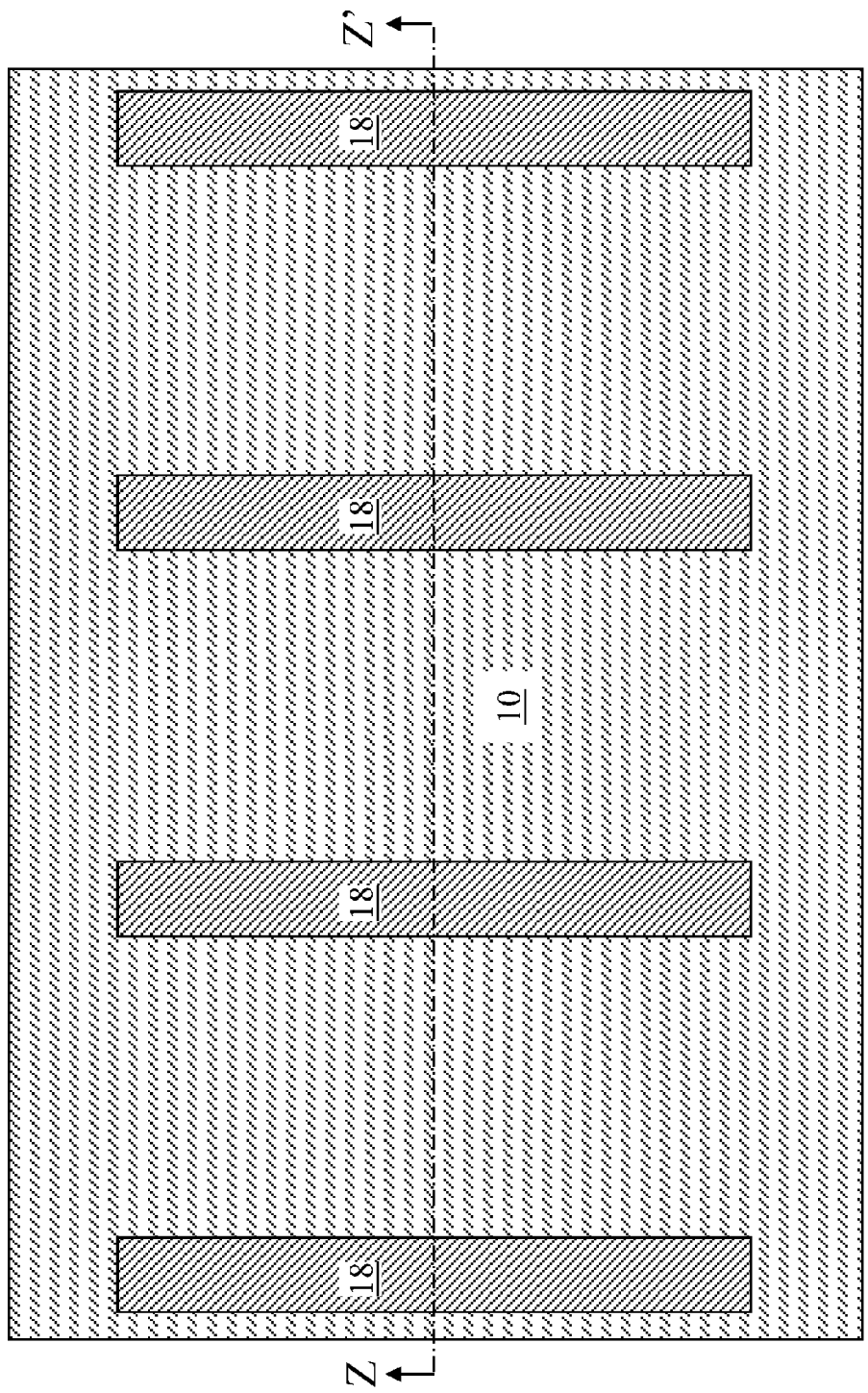
Figure 31A:
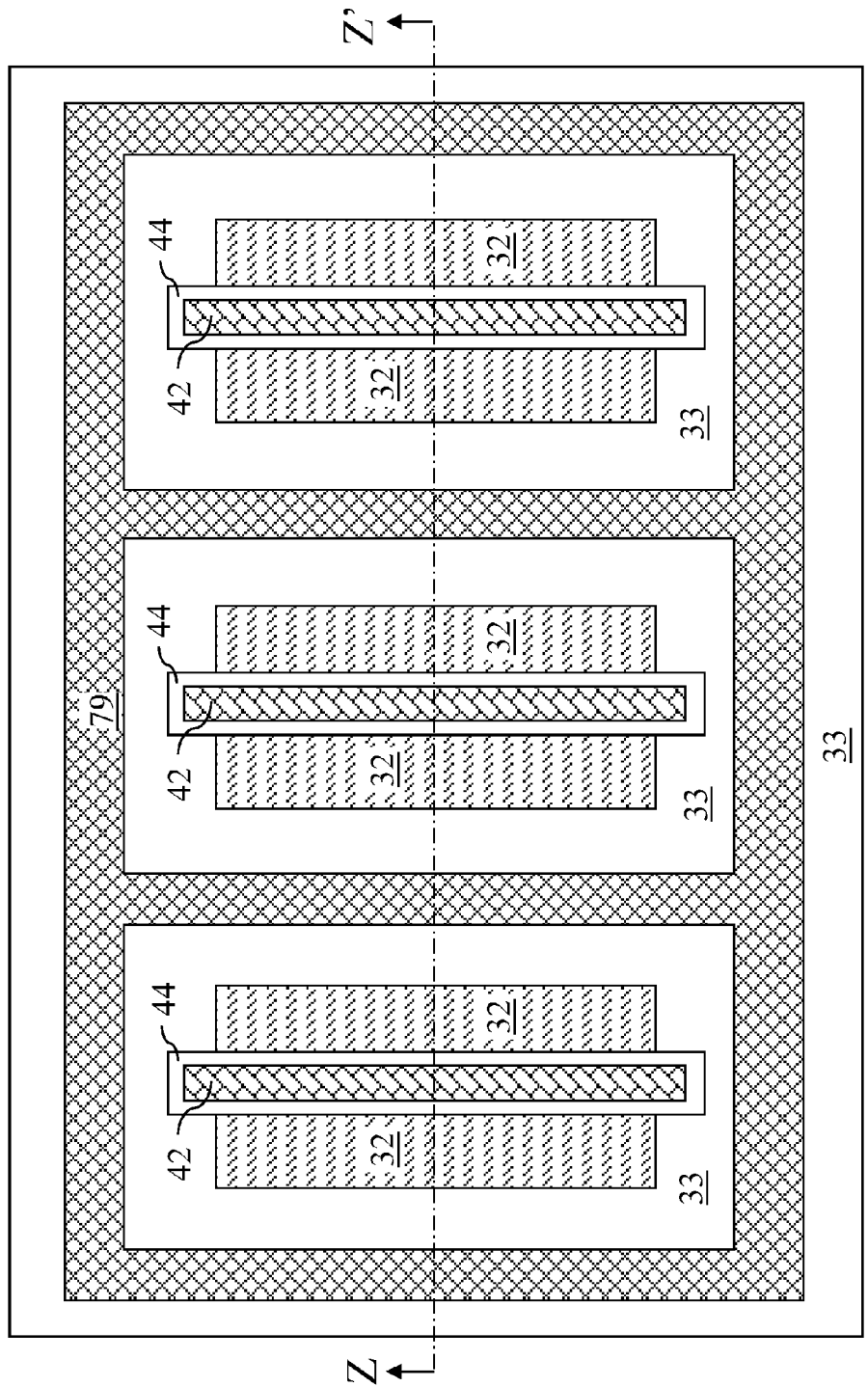
Figure 31B:
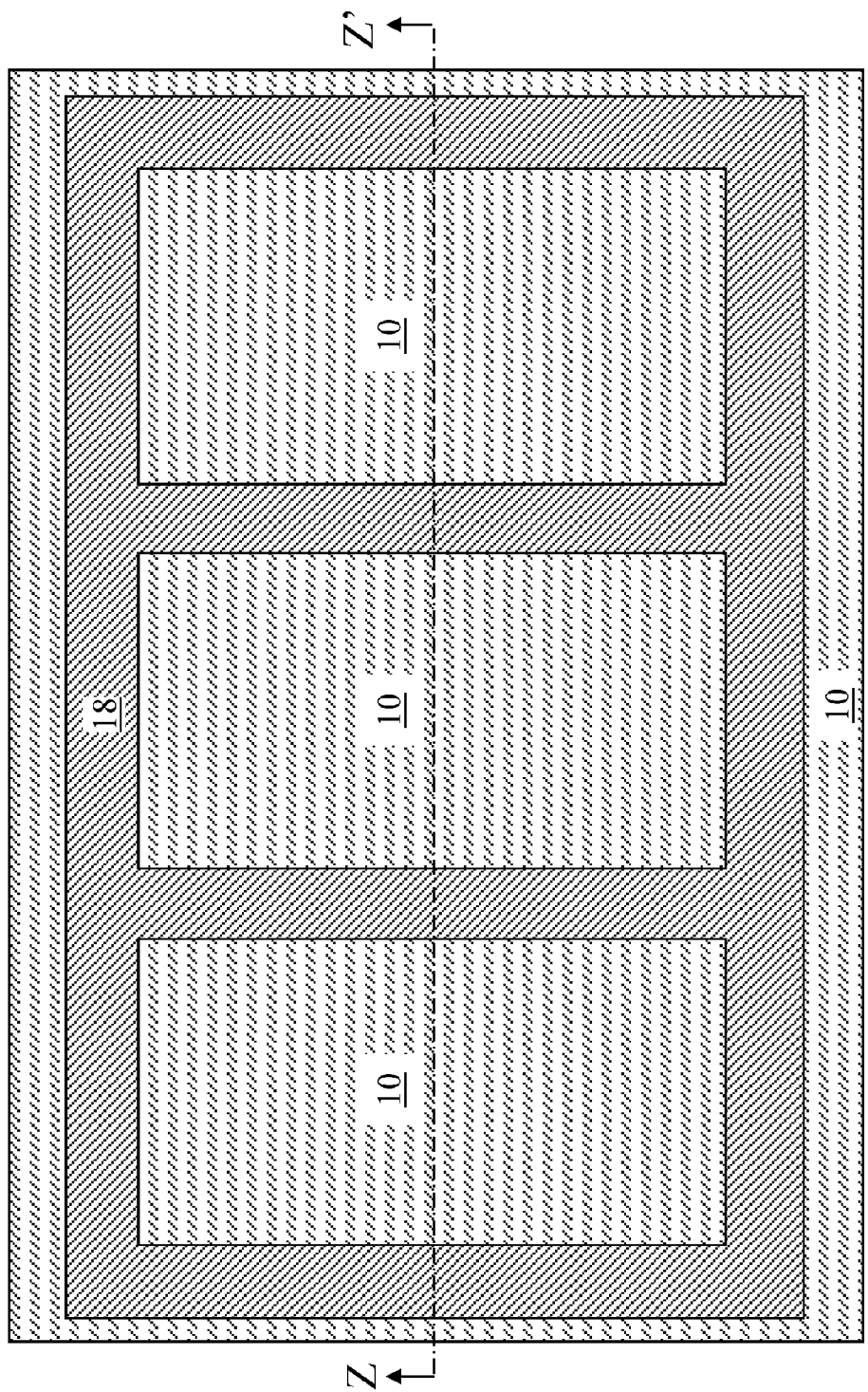

Referring to FIGS. 29, 30A, 30B, 31A, and 31B, at least one first conductive via 79 is formed in the MOL dielectric layer 80. FIG. 29 is a common vertical cross-sectional view of a first configuration of the third exemplary semiconductor structure shown in FIGS. 30A and 30B and a second configuration of the third exemplary semiconductor structure shown in FIGS. 31A and 31B. FIG. 30A is a modified top-down view of the first configuration of the third exemplary semiconductor structure in which the MOL dielectric layer 80 is omitted for clarity. FIG. 30B is a horizontal cross-sectional view of the first configuration of the third exemplary semiconductor structure along the plane X-X' in FIG. 29. FIG. 31A is a modified top-down view of the second configuration of the third exemplary semiconductor structure in which the MOL dielectric layer 80 is omitted for clarity. FIG. 31B is a horizontal cross-sectional view of the second configuration of the third exemplary semiconductor structure along the plane X-X' in FIG. 29. The plane Z-Z' in FIGS. 30A, 30B, 31A, and 31B corresponds to the plane of the vertical cross-section for the common vertical cross-sectional view of the third exemplary semiconductor structure shown in FIG. 29.

Specifically, a conductive material is deposited into the at least one via cavity 59. The conductive material may be a doped semiconductor material or a metallic material. For example, the conductive material may be doped polysilicon, a doped silicon-containing semiconductor material, a doped compound semiconductor material, an elemental metal, an alloy of at least two elemental metals, a conductive metal nitride, etc. The excess conductive material above the top surface of the MOL dielectric layer 80 is removed, for example, by chemical mechanical planarization (CMP), recess etch, or a combination thereof. The remaining portions of the conductive material in the at least one via cavity 59 constitute at least one first conductive via 79. Each of the at least one first conductive via 79 extends from a top surface of the MOL dielectric layer 80 to the top surface of the at least one first doped semiconductor region 18.

In the first configuration of the third exemplary semiconductor structure shown in FIGS. 30A and 30B, the at least one first conductive via 79 is an array of conductive vias. Each conductive via in the array of the conductive vias is disjoined from other conductive vias, i.e., does not abut another conductive via.

In the second configuration of the third exemplary semiconductor structure shown in FIGS. 31A and 31B, the at least one first conductive via 79 is a single conductive via having a plurality of conducive via portions that are interconnected among one another. In other words, the at least one first conductive via 79 includes a plurality of conductive via portions that are laterally connected between the top surface of the MOL dielectric layer 80 and the top surface of the bottom semiconductor layer 10. In the second configuration, the at least one first conductive via 79 is a single contact via of unitary construction, i.e., in one contiguous piece, and laterally surrounds the entirety of the at least one field effect transistor. In case the at least one field effect transistor is a plurality of field effect transistors, all of the plurality of field effect transistors may be laterally enclosed by the single contact via.

Figure 32:
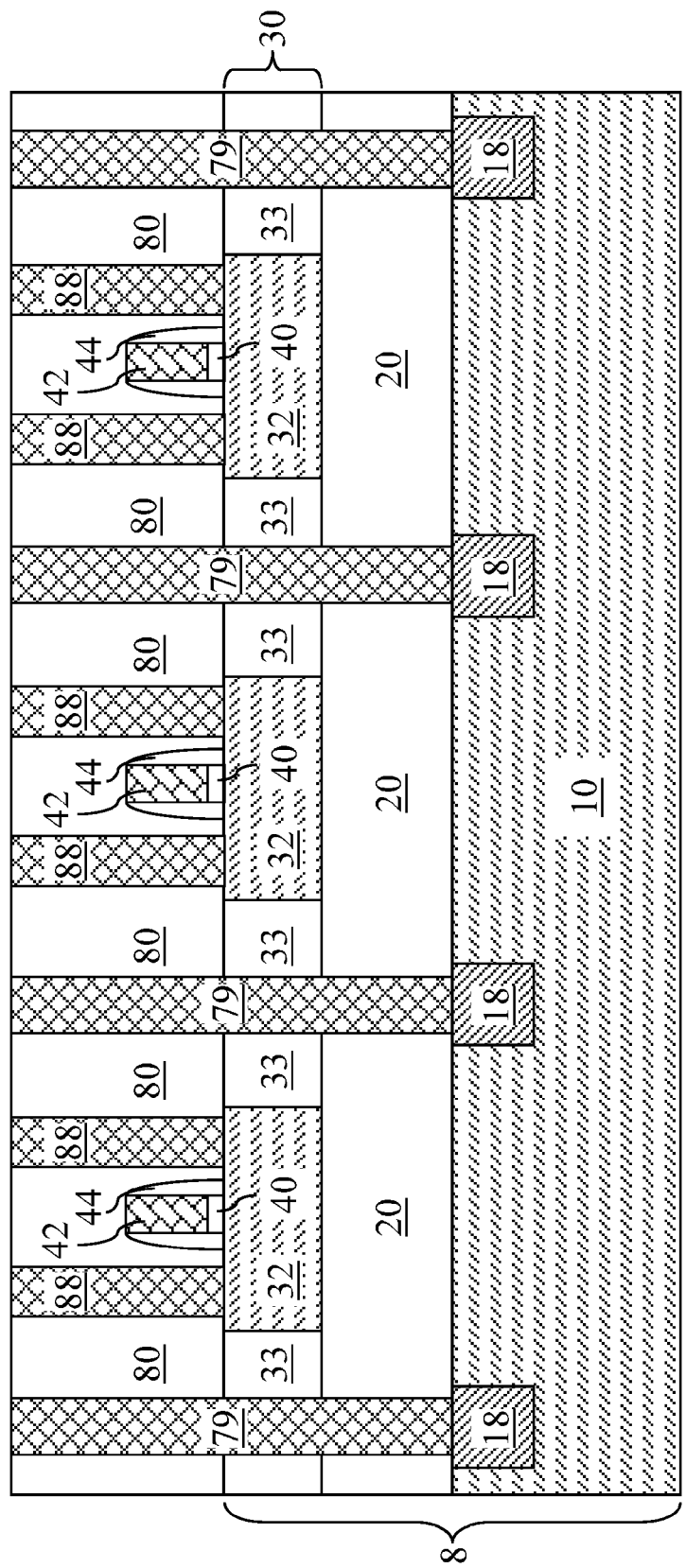
Figure 33:
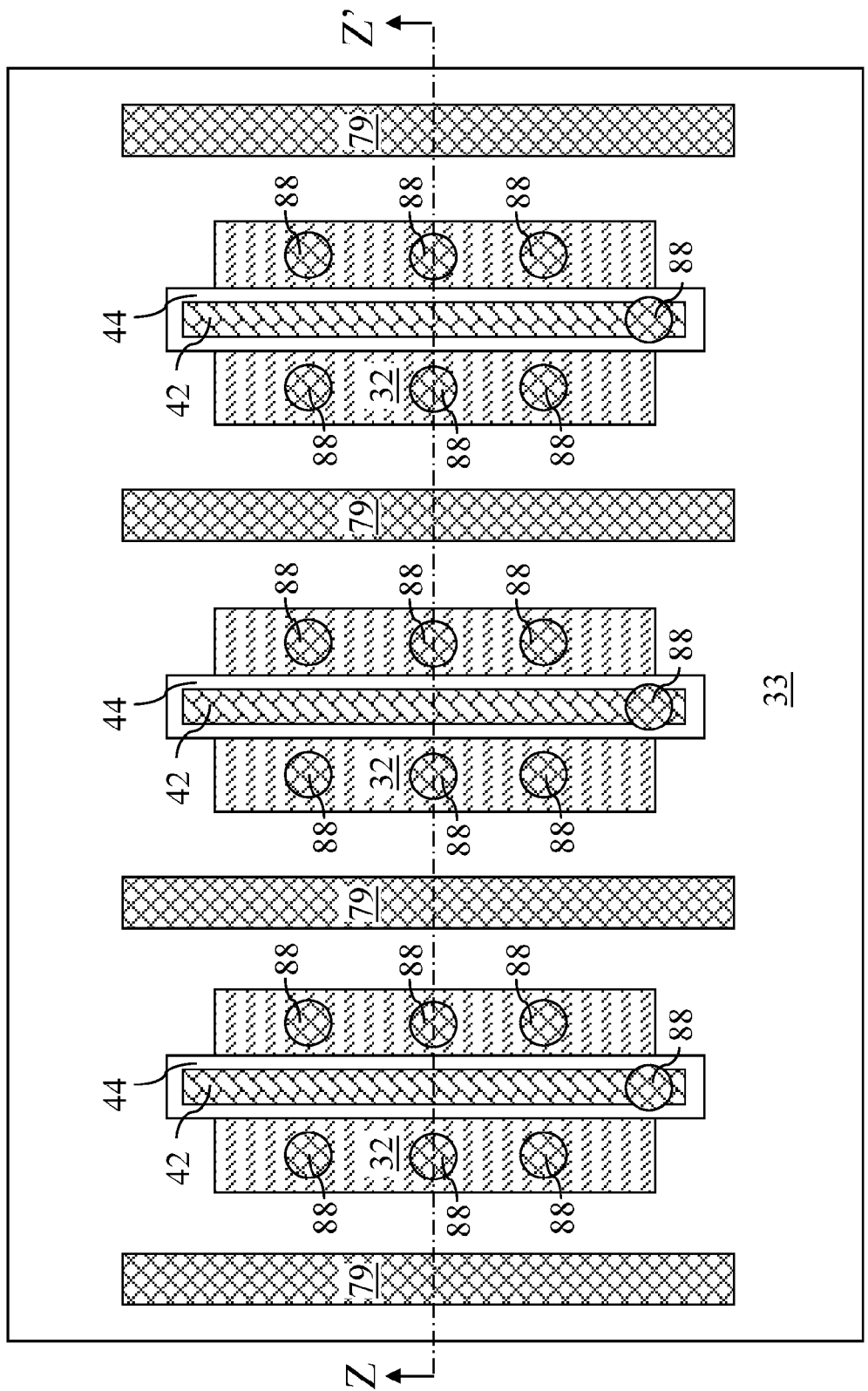
Figure 34:
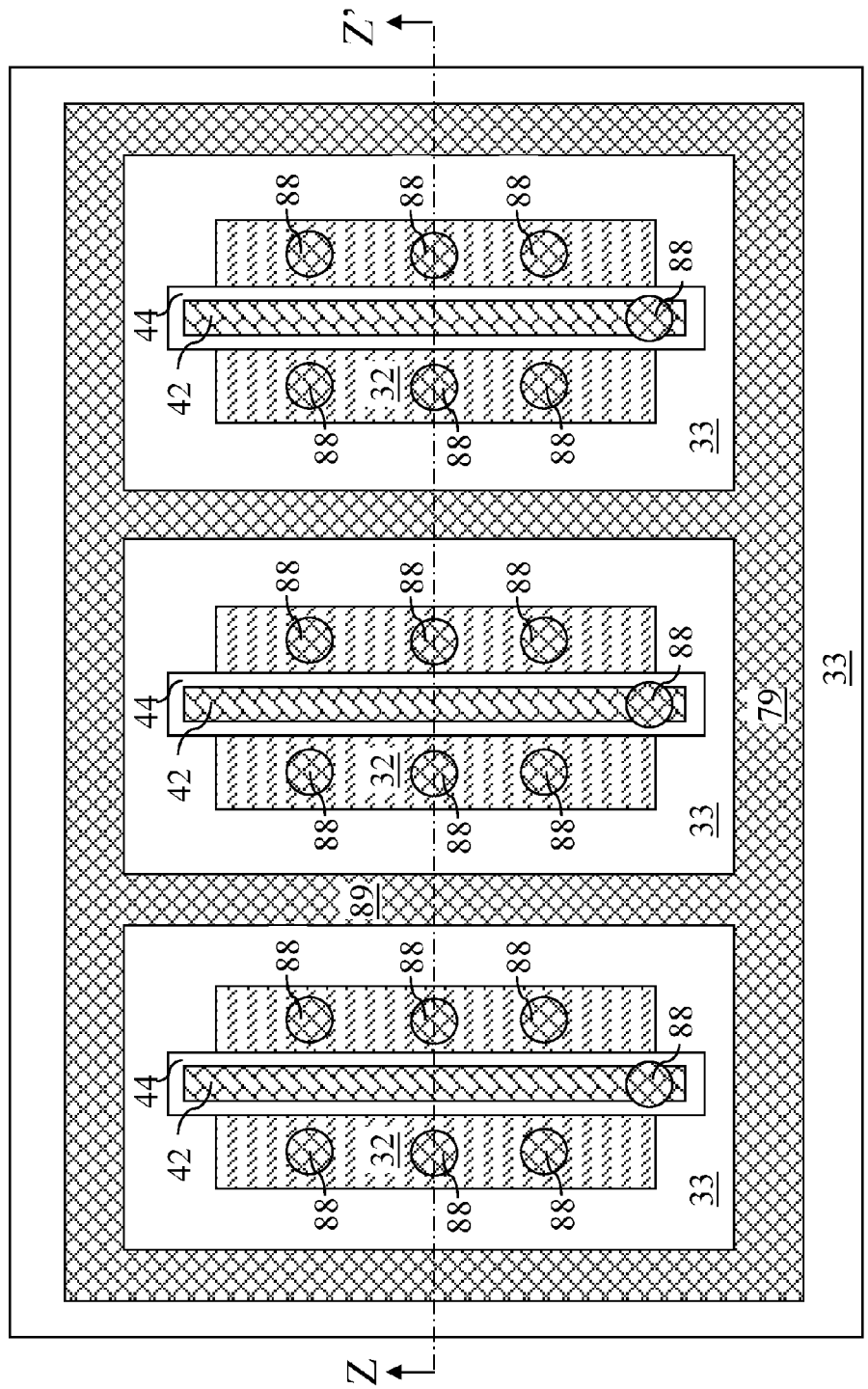

Referring to FIGS. 32, 33, and 34, third upper conductive vias 88 are formed in the MOL dielectric layer 80. FIG. 32 is a common vertical cross-sectional view of the first configuration of the third exemplary semiconductor structure shown in FIG. 33 and a second configuration of the third exemplary semiconductor structure shown in FIG. 34. FIG. 33 is a modified top-down view of the first configuration of the third exemplary semiconductor structure in which the MOL dielectric layer 80 is omitted for clarity. FIG. 34 is a modified top-down view of the second configuration of the third exemplary semiconductor structure in which the MOL dielectric layer 80 is omitted for clarity. The plane Z-Z' in FIGS. 33 and 34 corresponds to the plane of the vertical cross-section for the common vertical cross-sectional view of the third exemplary semiconductor structure shown in FIG. 32.

The third upper conductive vias 88 contact semiconductor devices including the at least one field effect transistor located on and in the top semiconductor layer 30. The third upper conductive vias 88 do not extend below the bottom surface of the top semiconductor layer 30. The third upper conductive vias 88 are formed by lithographic methods and an anisotropic etch, followed by a fill with a conductive material such as a doped semiconductor material or a metallic material and planarization. The third upper conductive vias 88 may be formed directly on the source regions (not shown separately), the drain regions (not shown separately) and the gate electrodes 42 of the at least one field effect transistor. The source regions and the drain regions are located in the at least one top semiconductor portion 32.

Figure 35:
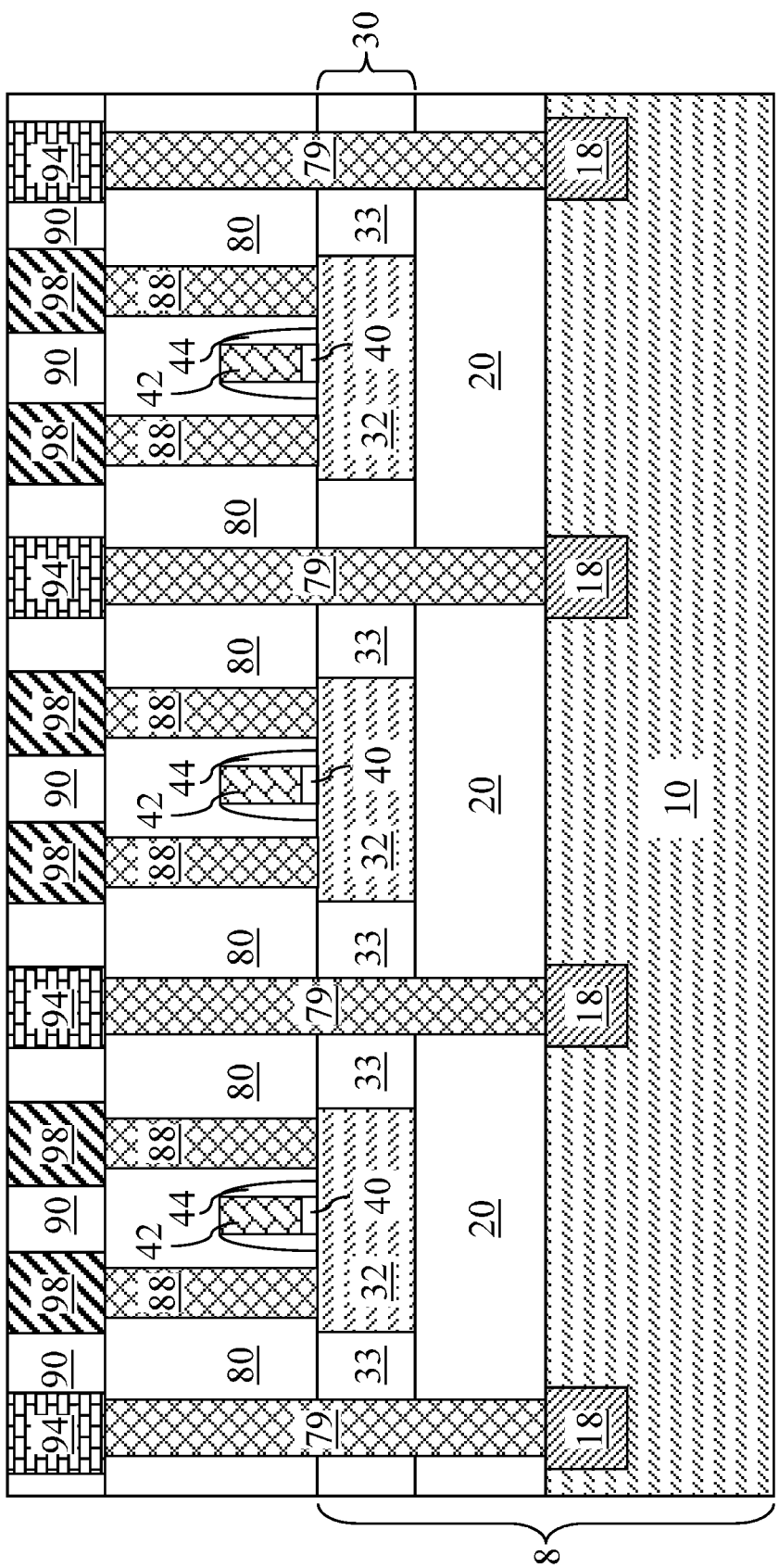

Referring to FIG. 35, an interconnect-level dielectric layer 90, at least one first interconnect-level metal line 94 and third interconnect-level metal line 98 are formed in the same manner as in the embodiment of the present invention. The third exemplary semiconductor structure operates in the same manner as the second exemplary semiconductor structure described above, e.g., as the second exemplary semiconductor structure of FIGS. 24 and 25.

FIG. 36 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 2-18, 19A, 19B, 20A, 20B, 21-29, 30A, 30B, 31A, 31B, and 32-35. The design structures processes and/or generated by design flow 900 may be encoded on machine-readable transmission or storage media to include data and/or instructions that, when executed or otherwise processes on a data processing system, generate a logically, structurally, mechanically, or otherwise functionally equivalent representation of hardware components, circuits, devices, or systems. Design flow 900 may vary depending on the type of representation being designed. For example, a design flow for building an application specific integrated circuit (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 36 illustrates multiple such design structures including an input design structure 920 that is preferably processed by design process 910. Design structure 920 may be a logical simulation design structure generated and processed by design process 910 to produce a logically equivalent functional representation of a hardware device. Design structure 920 may also, or alternately, comprise data and/or program instructions that, when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2-18, 19A, 19B, 20A, 20B, 21-29, 30A, 30B, 31A, 31B, and 32-35. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2-18, 19A, 19B, 20A, 20B, 21-29, 30A, 30B, 31A, 31B, and 32-35 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-18, 19A, 19B, 20A, 20B, 21-29, 30A, 30B, 31A, 31B, and 32-35. In one embodiment, design structure 990 may comprise a compiled, executable HDL simulation model that functionally simulates the devices shown in FIGS. 2-18, 19A, 19B, 20A, 20B, 21-29, 30A, 30B, 31A, 31B, and 32-35.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2-18, 19A, 19B, 20A, 20B, 21-29, 30A, 30B, 31A, 31B, and 32-35. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:

forming a shallow trench isolation structure in a top semiconductor layer of a semiconductor-on-insulator (SOI) substrate including a bottom semiconductor layer having a doping of a first conductivity type;

forming a via cavity through said shallow trench isolation structure and a buried insulator layer, wherein sidewalls of said via cavity includes sidewalls of said shallow trench isolation structure and sidewalls of said buried insulator layer, and a top surface of said bottom semiconductor layer is physically exposed at a bottom of said via cavity;

forming, after formation of said via cavity, a doped semiconductor region in a bottom semiconductor layer, wherein said doped semiconductor region abuts said buried insulator layer and has a doping of a second conductivity type, wherein said second conductivity type is the opposite of said first conductivity type, and wherein at least a portion of said doped semiconductor region underlies said top semiconductor layer, wherein a bottom surface of said doped semiconductor region and sidewalls of said doped semiconductor region form a set of contiguous interfaces between a semiconductor material of said first conductivity type and a semiconductor material of said second conductivity type;

depositing a conductive material directly on said sidewalls of said shallow trench isolation structure and said sidewalls of said buried insulator layer and said doped semiconductor region having said doping conductivity type and over said top semiconductor layer;

removing all portions of said conductive material above a top surface of said top semiconductor layer by a planarization process, wherein a remaining portion of said conductive material below a horizontal plane including said top surface of said top semiconductor layer constitutes a conductive via in contact with said doped semiconductor region having said doping of said second conductivity type;

forming, after formation of said conductive via, at least one field effect transistor on a semiconductor material portion in said top semiconductor layer;

forming a middle-of-line (MOL) dielectric layer over said at least one field effect transistor and said shallow trench isolation structure and said contact via.

2. The method of claim 1, further comprising forming additional contact vias contacting said at least one field effect transistor through said MOL dielectric layer.

3. The method of claim 1, wherein said conductive via is of unitary construction and laterally surrounding an entirety of said at least one field effect transistor.

4. The method of claim 1, further comprising:
forming another via cavity through said shallow trench isolation structure and said buried insulator layer, wherein sidewalls of said another via cavity includes additional sidewalls of said shallow trench isolation structure and additional sidewalls of said buried insulator layer, and another top surface of said bottom semiconductor layer is physically exposed at a bottom of said another via cavity;

forming a second doped semiconductor region underneath said another via cavity and in said bottom semiconductor layer, wherein said second doped semiconductor region abuts said buried insulator layer and has a doping of said first conductivity type; and forming another conductive via in said another via cavity concurrent with formation of said conductive via.

5. The method of claim 4, wherein each of said conductive via and said another conductive via is of unitary construction and has a top surface that is coplanar with a top surface of said top semiconductor layer.

6. The method of claim 1, wherein said conductive via laterally surrounds an entirety of said at least one field effect transistor.

7. The method of claim 6, wherein said conductive via is a single conductive via of unitary construction.

8. The method of claim 1, further comprising forming additional conductive vias contacting a source region and a drain region of said at least one field effect transistor through said MOL dielectric layer.

9. The method of claim 4, wherein said second doped semiconductor region physically contacts surfaces of a portion of said bottom semiconductor layer having a doping of said first conductivity type throughout formation of said another conductive via.

10. The method of claim 2, wherein said contact via and one of said additional contact vias collectively constitute a vertically abutting stack of a lower contact via and an upper contact via, wherein a top surface of said upper conductive via extends to said top surface of said MOL dielectric layer, and a bottom surface of said lower conductive via extends to said top surface of said bottom semiconductor layer.

11. The method of claim 2, further comprising forming interconnect-level metal lines over said MOL dielectric layer, wherein any interconnect-level metal line in contact with said at least one conductive via is electrically isolated from any other interconnect-level metal line in contact with said additional contact vias and from any node within said at least one field effect transistor.

12. The method of claim 10, wherein said contact via is of unitary construction and laterally surrounds said at least one field effect transistor.

13. The method of claim 12, wherein said one of said additional contact vias is of unitary construction and laterally surrounds said at least one field effect transistor.

* * * * *